United States Patent
Yang et al.

(10) Patent No.: US 12,160,235 B2
(45) Date of Patent: Dec. 3, 2024

(54) OPTICAL KEYSWITCH WITH SLIDING END

(71) Applicant: Darfon Electronics Corp., Taoyuan (TW)

(72) Inventors: Chen Yang, Taoyuan (TW); Yu-Chun Hsieh, Taoyuan (TW); Li-Te Chang, Taoyuan (TW); Po-Yueh Chou, Taoyuan (TW)

(73) Assignee: DARFON ELECTRONICS CORP., Taoyuan (TW)

( * ) Notice: Subject to any disclaimer, the term of this patent is extended or adjusted under 35 U.S.C. 154(b) by 0 days.

(21) Appl. No.: 18/350,787

(22) Filed: Jul. 12, 2023

(65) Prior Publication Data

US 2023/0353149 A1    Nov. 2, 2023

Related U.S. Application Data

(63) Continuation of application No. 17/383,678, filed on Jul. 23, 2021, now Pat. No. 11,770,123, which is a
(Continued)

(30) Foreign Application Priority Data

Feb. 14, 2018    (TW) .................. 107105665

(51) Int. Cl.
*H03K 17/968* (2006.01)
*H01H 13/14* (2006.01)
*H01H 13/705* (2006.01)

(52) U.S. Cl.
CPC ........... *H03K 17/968* (2013.01); *H01H 13/14* (2013.01); *H01H 13/705* (2013.01); *H03K 2217/9653* (2013.01)

(58) Field of Classification Search
CPC ......... H03K 17/968; H03K 2217/9653; H03K 17/943; H03K 17/969; H03K 2217/9651; H01H 13/14; H01H 13/705; H01H 3/125
(Continued)

(56) References Cited

U.S. PATENT DOCUMENTS

| 4,479,111 A | 10/1984 | Madsen et al. |
| 4,836,636 A | 6/1989 | Obara et al. |

(Continued)

FOREIGN PATENT DOCUMENTS

| CN | 203521244 U | 4/2014 |
| CN | 203812764 U | 9/2014 |

(Continued)

OTHER PUBLICATIONS

Non-Final Office Action dated Feb. 16, 2023, issued in U.S. Appl. No. 17/715,120.
(Continued)

*Primary Examiner* — Thanh Luu
*Assistant Examiner* — Mai Thi Ngoc Tran
(74) *Attorney, Agent, or Firm* — McClure, Qualey & Rodack, LLP

(57) ABSTRACT

An optical keyswitch includes a keycap, a support mechanism, and a switch module. The support mechanism is disposed below the keycap and configured to support the keycap moving upward and downward, the support mechanism comprising a first frame and a second frame, the first frame having a sliding end. The switch module includes a circuit board, an emitter, and a receiver, the emitter and the receiver are electrically connected to the circuit board, and the emitter emitting an optical signal to the receiver. When the keycap is pressed, the first frame is driven by the keycap to slide substantially parallel to the circuit board and block
(Continued)

the optical signal with the sliding end, so the switch module is triggered to generate a triggering signal.

12 Claims, 67 Drawing Sheets

Related U.S. Application Data continuation-in-part of application No. 16/240,096, filed on Jan. 4, 2019, now Pat. No. 11,108,393.

(60) Provisional application No. 63/171,633, filed on Apr. 7, 2021, provisional application No. 62/613,806, filed on Jan. 5, 2018.

(58) Field of Classification Search
USPC .................. 345/168, 170; 250/345, 341
See application file for complete search history.

(56) References Cited

U.S. PATENT DOCUMENTS

| | | | |
|---|---|---|---|
| 5,266,949 | A | 11/1993 | Rossi |
| 9,634,661 | B1 | 4/2017 | Chen |
| 9,838,006 | B2 | 12/2017 | Chen |
| 10,637,470 | B2 | 4/2020 | Wang et al. |
| 11,108,393 | B2 | 8/2021 | Yang et al. |
| 11,223,357 | B2 | 1/2022 | Hsieh et al. |
| 11,257,635 | B2 | 2/2022 | Ruff |
| 2016/0179212 | A1 | 6/2016 | Toraille et al. |
| 2017/0019102 | A1 | 1/2017 | Chen |
| 2017/0090104 | A1 | 3/2017 | Cao et al. |
| 2017/0115747 | A1 | 4/2017 | Chen et al. |
| 2017/0178830 | A1 | 6/2017 | Feng |
| 2017/0264294 | A1 | 9/2017 | Li |
| 2018/0008619 | A1 | 1/2018 | Baheti et al. |
| 2019/0228931 | A1* | 7/2019 | Wang .................. H03K 17/968 |
| 2020/0294733 | A1* | 9/2020 | Ruff .................. H01H 13/7006 |
| 2022/0044886 | A1 | 2/2022 | Han |
| 2022/0328265 | A1 | 10/2022 | Chang et al. |

FOREIGN PATENT DOCUMENTS

| | | |
|---|---|---|
| CN | 204130394 U | 1/2015 |
| CN | 204407228 U | 6/2015 |
| CN | 204441139 U | 7/2015 |
| CN | 104991319 A | 10/2015 |
| CN | 104992867 A | 10/2015 |
| CN | 105006396 A | 10/2015 |
| CN | 105097342 A | 11/2015 |
| CN | 205004229 U | 1/2016 |
| CN | 205004233 U | 1/2016 |
| CN | 105429620 A | 3/2016 |
| CN | 205092842 U | 3/2016 |
| CN | 104299818 B | 9/2016 |
| CN | 105931907 A | 9/2016 |
| CN | 206180999 U | 5/2017 |
| CN | 107017870 A | 8/2017 |
| CN | 206758332 U | 12/2017 |
| CN | 112133583 A | 12/2020 |
| TW | 201931405 A | 8/2019 |
| TW | 201931408 A | 8/2019 |

OTHER PUBLICATIONS

Non-Final Office Action dated Mar. 30, 2023, issued in U.S. Appl. No. 17/715,143.

TW Office Action dated Sep. 7, 2022 in Taiwan application No. 110138214.

\* cited by examiner

OPTICAL KEYSWITCH WITH SLIDING END

CROSS REFERENCE TO RELATED APPLICATIONS

This application is a continuation application of and claims the priority benefit of U.S. patent application Ser. No. 17/383,678, which was filed on Jul. 23, 2021 (now patented as U.S. Pat. No. 11,770,112, issued Sep. 26, 2023), and was a continuation-in-part application of and claimed the priority benefit of U.S. patent application Ser. No. 16/240,096, which was filed on Jan. 4, 2019 (now patented as U.S. Pat. No. 11,108,393, issued Aug. 31, 2021) and claimed the priority benefits of U.S. provisional patent application Ser. No. 62/613,806 filed on Jan. 5, 2018 and Taiwan patent application Ser. No. 107105665 filed on Feb. 14, 2018, and also claimed the priority benefit of U.S. provisional patent application Ser. No. 63/171,633, which was filed on Apr. 7, 2021. The entirety of the above-mentioned patent application is hereby incorporated by reference herein and made a part of this specification.

BACKGROUND OF THE INVENTION

1. Field of the Invention

The invention generally relates to an optical keyswitch. Particularly, the invention relates to an optical keyswitch which is triggered according to the receiving status of the optical signal by pressing the keycap.

2. Description of the Prior Art

Membrane keyswitches and mechanical keyswitches are common types of keyswitch for keyboards. The major difference between the membrane keyswitch and the mechanical keyswitch is the circuit structure for generating the triggering signal. In general, the membrane keyswitch utilizes the membrane circuit as a switch for generating the triggering signal. When the keycap is pressed to trigger the membrane circuit, the upper circuit layer is deformed to enable the upper switch contact of the upper circuit layer to contact the corresponding lower switch contact of the lower circuit layer, so the membrane circuit is conducted to generate the signal. However, the membrane circuit is easily damaged and difficult to repair when it is frequently used or operated by improper forces. Moreover, when the user presses the keycap to trigger the membrane circuit, the tactile feedback is less significant, which causes the pressing feeling to be poor and cannot satisfy the user's expectation.

The mechanical keyswitch is triggered based on whether the metal piece and the metal contact are conducted. However, the metal piece and the metal contact are easily worn out due to operation impact, which reduces the life of the keyswitch. The metal piece and the metal contact are also prone to rusty, resulting in poor conduction, which affects the operation stability of the keyswitch. Moreover, conventional mechanical keyswitches are more complicate in structure and bigger in volume and not suitable for portable electronic devices having higher thinning requirements, such as laptop computer.

SUMMARY OF THE INVENTION

It is an object of the invention to provide an optical keyswitch, which utilizes a switch module constructed by the emitter and the receiver, and provides fast and accurate triggering function based on the receiving status of the optical signal changed by components of the keyswitch, which are movable during the stroke.

It is another object of the invention to provide an optical keyswitch, which integrates the optical switch to the limited space of the keyswitch and is suitable for use in portable electronic devices.

It is yet another object of the invention to provide an optical keyswitch, which includes the optical switch and the mechanical restoring mechanism, not only providing mechanical pressing feeling but also enhancing the repairability.

In at least one embodiment, the invention provides an optical keyswitch including a keycap, a support mechanism, and a switch module. The support mechanism is disposed below the keycap and configured to support the keycap moving upward and downward, the support mechanism includes a first frame and a second frame, and the first frame has a sliding end. The switch module includes a circuit board, an emitter, and a receiver, the emitter and the receiver are electrically connected to the circuit board, and the emitter emits an optical signal to the receiver. When the keycap is pressed, the first frame is driven by the keycap to slide substantially parallel to the circuit board and block the optical signal with the sliding end, so the switch module is triggered to generate a triggering signal.

In at least one embodiment, the optical keyswitch further includes a resilient member connecting the first frame and the second frame, wherein the emitter and the receiver are disposed on two opposite sides with respect to a connecting direction of the resilient member connecting the first frame and the second frame.

In at least one embodiment, the emitter emits the optical signal along a straight optical path, and the straight optical path intersects a moving path of the first frame, so that when the first frame slides substantially parallel to the circuit board, a portion of the sliding end of the first frame is interposed into the straight optical path.

In at least one embodiment, when the keycap is not pressed, and maintained at a non-pressed position, the resilient member enables baseplate ends of the first frame and the second frame to be close to each other.

In an embodiment, the baseplate end of the first frame serves as the sliding end.

In an embodiment, when the keycap is not pressed and maintained at a non-pressed position, the resilient member enables keycap ends of the first frame and the second frame to be close to each other.

In at least one embodiment, the invention provides an optical keyswitch including a switch module, a keycap, a support mechanism, a resilient member, a protrusion, and a backlight source. The switch module includes a circuit board, an emitter, and a receiver, wherein the circuit board includes a first surface and a second surface, the emitter and the receiver are electrically connected to the circuit board, and the emitter is configured to emit an optical signal to the receiver. The keycap is disposed above the first surface, wherein the keycap includes a light transmission area, and a keycap projection area of the keycap is projected on the circuit board. The support mechanism is disposed below the keycap and configured to support the keycap moving upward and downward with respect to the circuit board. The resilient member is transversely connecting the support mechanism, and dividing the keycap projection area into a first region and a second region. The protrusion is driven by the keycap or the support mechanism to move and downward. The backlight source is electrically connected to the circuit board. The backlight source is disposed at the first region to produce light illuminating the light transmission area, the emitter and the receiver are disposed at the second region, and the protrusion is moved by the keycap or the support mechanism to trigger the switch module.

In at least one embodiment, the backlight source is disposed on the first surface, and the emitter and the receiver are disposed on the second surface.

In at least one embodiment, the circuit board includes a slit, and the slit is configured to allow the protrusion to pass therethrough to block an optical path between the emitter and the receiver.

In at least one embodiment, the protrusion is disposed on the keycap, and the protrusion is configured to pass through the circuit board to block the optical signal.

In at least one embodiment, the support mechanism includes a first frame and a second frame, the first frame and the second frame respectively includes a frame body and at least one arm portion, the at least one arm portion extends from the frame body, and the protrusion is disposed on the at least one arm portion or the frame body.

In at least one embodiment, the protrusion is arranged in parallel or perpendicular to the resilient member.

In at least one embodiment, the invention provides an optical keyswitch including a switch module, a keycap, a support mechanism, a resilient member, a backlight source, and a protrusion. The switch module includes a circuit board and an optical switch, wherein the circuit board includes a first surface and a second surface, the optical switch is electrically connected to the circuit board, the optical switch includes an emitter and a receiver, and the emitter is configured to emit an optical signal to the receiver. The keycap is disposed above the first surface, and a keycap projection area of the keycap is projected on the circuit board. The support mechanism is configured to support the keycap moving upward and downward with respect to the circuit board. The resilient member is transversely connecting the support mechanism, and dividing the keycap projection area into a first region and a second region. The backlight source is electrically connected to the circuit board. The protrusion is driven by the keycap or the support mechanism to move and downward, for triggering the optical switch when the keycap is pressed. The optical switch and the backlight source are respectively disposed on different surfaces of the first surface and the second surface, and the optical switch and the backlight source are respectively disposed at different regions of the keycap projection area.

In at least one embodiment, the support mechanism includes a first frame and a second frame, and the first frame and the second frame are movably connected to the circuit board and the keycap.

In at least one embodiment, the first frame and the second frame respectively includes a frame body and at least one arm portion, the at least one arm portion extends from the frame body, and the protrusion is disposed on the at least one arm portion or the frame body.

In at least one embodiment, the protrusion is disposed on one of a first frame and a second frame of the support mechanism, the circuit board includes a slit, the optical switch is disposed at the second surface, and the slit allows the protrusion to pass therethrough to block the optical signal.

In at least one embodiment, the optical signal is emitted along an optical path, and the optical path is in parallel or perpendicular to the resilient member.

In at least one embodiment, the protrusion is arranged in parallel or perpendicular to the resilient member.

In at least one embodiment, the support mechanism further includes a baseplate combined with the first surface of the circuit board, the baseplate includes a light hole area corresponding to the first region and a broken hole area corresponding to second region, the backlight source is disposed corresponding to the light hole area, and the optical path of the optical switch is at least partially exposed within the broken hole area.

In at least one embodiment, the protrusion is disposed on the keycap, the circuit board includes a slit, and the protrusion is configured to pass through the circuit board to block the optical signal.

In at least one embodiment, the backlight source is configured to emit light downward, and the circuit board is provided with at least one opening allowing the light to pass therethrough to illuminate the keycap.

In at least one embodiment, the optical keyswitch further includes a reflector disposed corresponding to the backlight source, and configured to reflect the light to the at least one opening.

In another embodiment, an optical keyswitch structure includes a keycap; a switch module disposed under the keycap, the switch module including a circuit board, an emitter, and a receiver, the emitter and the receiver electrically connected to the circuit board, and the emitter emitting an optical signal to the receiver; and a support mechanism disposed below the keycap and configured to lift the keycap upward and downward, the support mechanism including a first frame and a second frame, the first frame having a sliding end and at least one side arm, the at least one side arm connecting with the sliding end; wherein the emitter emits the optical signal along a straight optical path configured in perpendicular to a moving path of the side arm, the first frame is driven by the keycap when pressed to slide along the moving path, and at least a portion of the sliding end intersects with or disintersects from the straight optical path, so the switch module is triggered to generate a triggering signal.

In yet another embodiment, an optical keyswitch includes a keycap; a baseplate disposed under the keycap; a support mechanism disposed between the keycap and baseplate to support the keycap moving upward and downward, the support mechanism including a first frame and a second frame, the first frame having a lower end movably engaging with the baseplate; at least one linear resilient member configured to provide a pulling force pulling the first frame and the second frame toward each other to lift the keycap; and a switch module including a circuit board, an emitter and a receiver, the emitter and the receiver electrically connected to the circuit board, and the emitter emitting an optical signal along a straight optical path to the receiver, wherein the straight optical path is configured in parallel to the lower end, the first frame slides with at least a portion of the lower end blocking or unblocking the optical signal when the keycap is pressed, so the switch module is triggered to generate a triggering signal.

In an embodiment, the optical keyswitch further includes a resilient member connecting the first frame and the second frame, wherein the emitter and the receiver are so disposed that the straight optical path is defined in perpendicular to a connecting direction of the resilient member connecting the first frame and the second frame.

In an embodiment, the optical keyswitch further includes at least one linear resilient member for pulling the first frame and the second frame to a standing position, wherein the side arm of the first frame is configured in parallel to the resilient member when the keycap is pressed.

In an embodiment, the optical keyswitch further includes at least one linear resilient member configured to provide a pulling force pulling the first frame and the second frame toward each other.

In an embodiment, the emitter and the receiver are disposed on two opposite sides with respect to a pulling direction of the pulling force.

Compared to the prior art, the optical keyswitch of the invention utilizes the emitter and the receiver as the switch unit. The optical keyswitch can be fast and accurately triggered by changing the receiving status of the optical signal and is applicable to various kinds of keyswitch structures for portable electronic devices. Moreover, the optical keyswitch of the invention optionally has the grating portion to reduce the interference of external light, so that the triggering accuracy can be enhanced and the triggering position can be suitably controlled to reduce the triggering error. Furthermore, the optical keyswitch of the invention has the restoring mechanism leaning (or lying) on the circuit board (or baseplate), so that the replacement of the restoring mechanism can be readily achieved to promote the repairability.

DETAILED DESCRIPTION OF THE PREFERRED EMBODIMENT

The invention provides an optical keyswitch, which can be applied to any pressing-type input device, such as keyboard, or integrated to any suitable electronic devices, such as keybuttons or keyboard equipped in portable devices or lap top computers, so as to provide fast and accurate triggering function, to be applicable to various keyswitch designs, and to promote repairability. Hereinafter, the optical keyswitch of the invention will be described in detail with reference to the drawings.

Figure 1A:
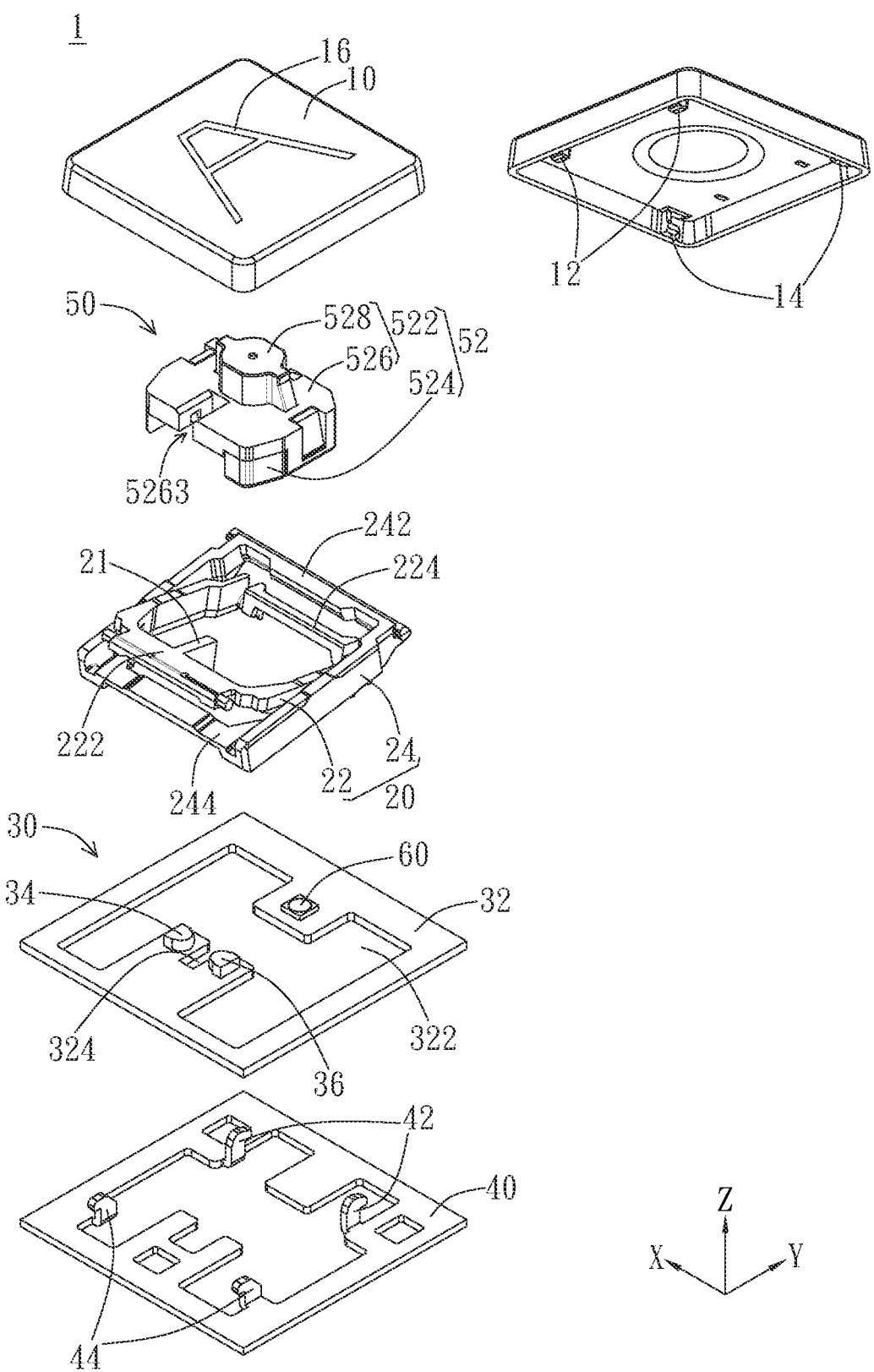
FIG. 1A is an exploded view of a first embodiment of the optical keyswitch of the invention.
Figure 1B:
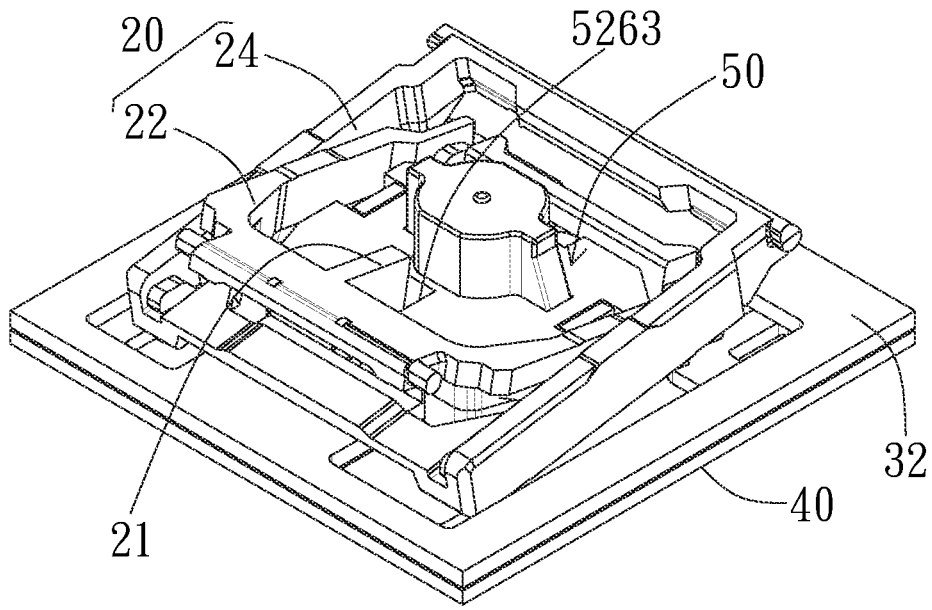
FIG. 1B is a schematic view of the optical keyswitch of FIG. 1A without the keycap.
Figure 1C:
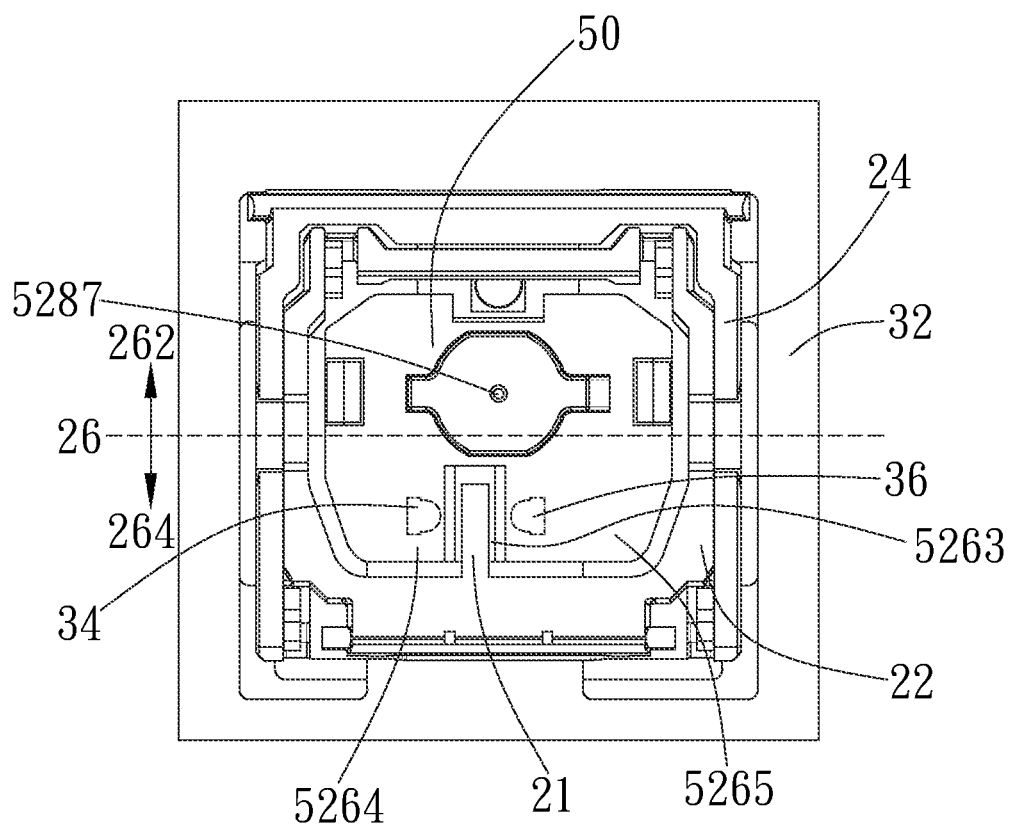
FIG. 1C is a top view of FIG. 1B.
Figure 1D:
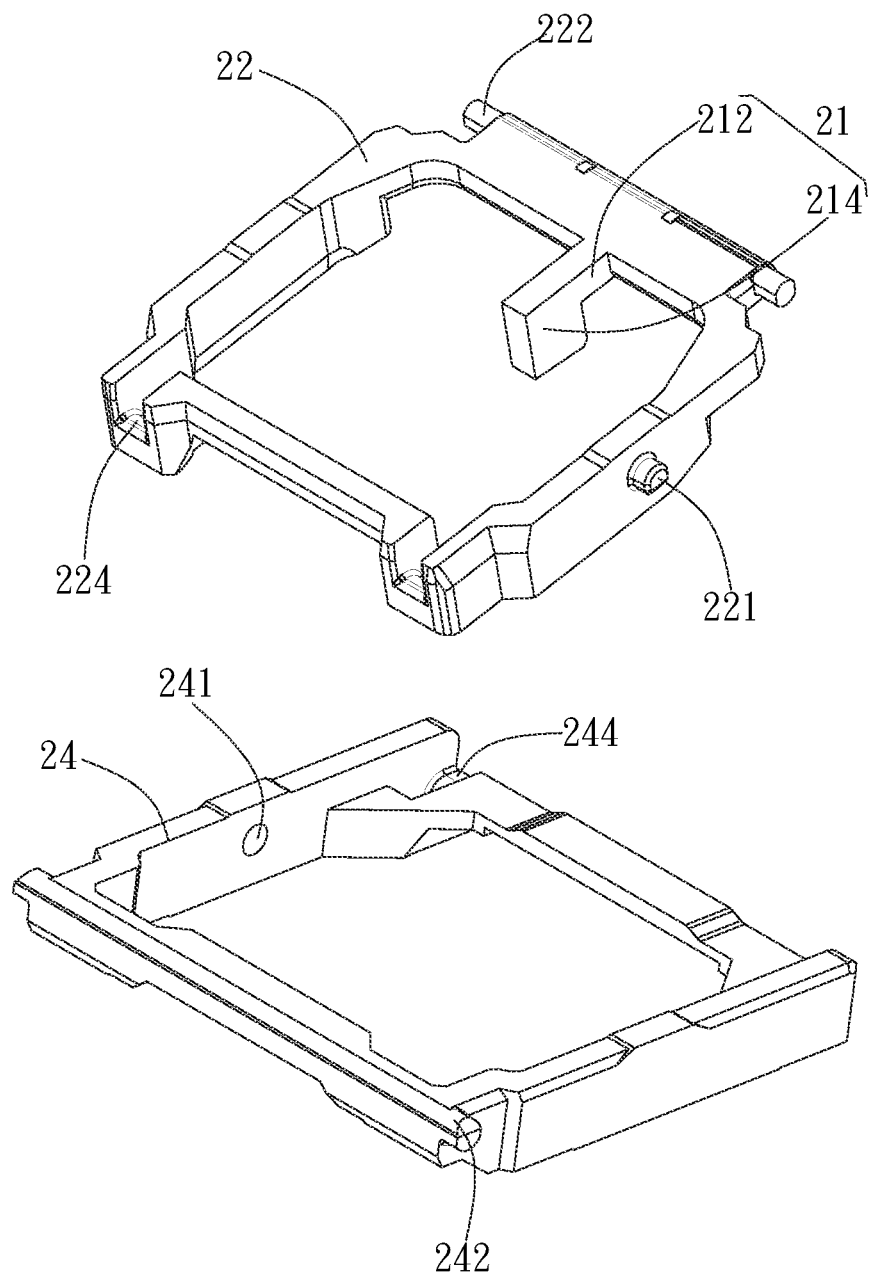
FIG. 1D is an exploded view of the support mechanism of FIG. 1A from a different viewing angle.
Figure 1E:
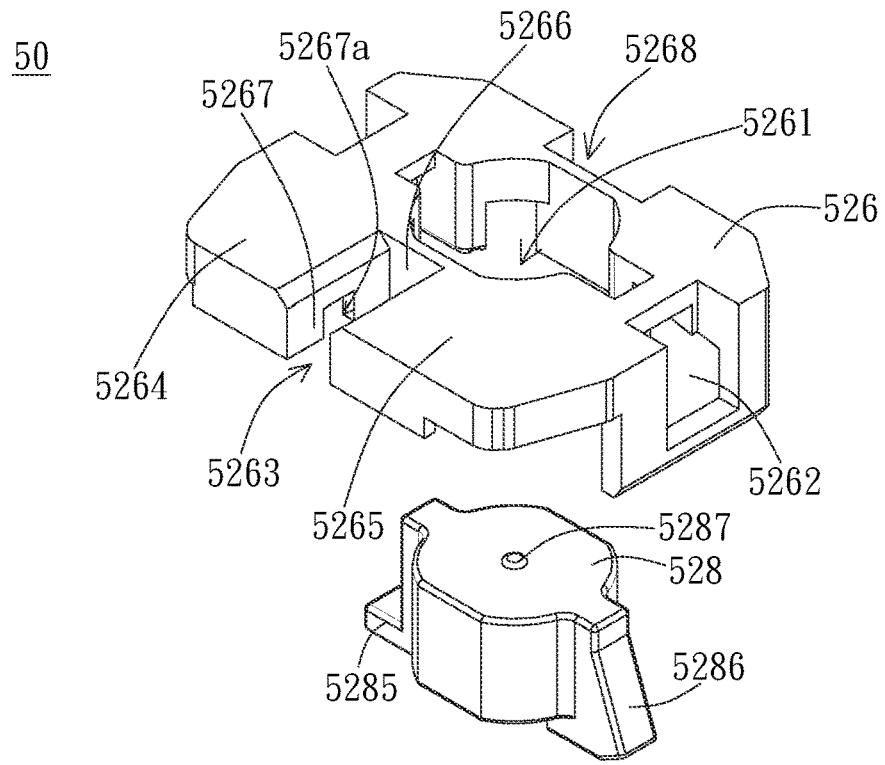
FIG. 1E is an exploded view of the restoring mechanism of FIG. 1A.
Figure 1E:
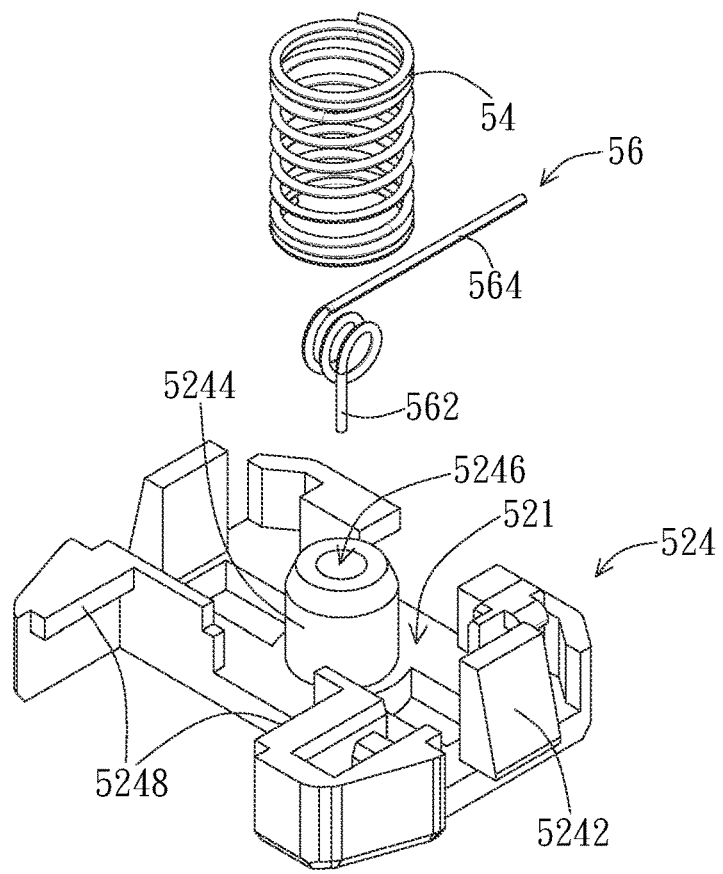
Figure 1F:
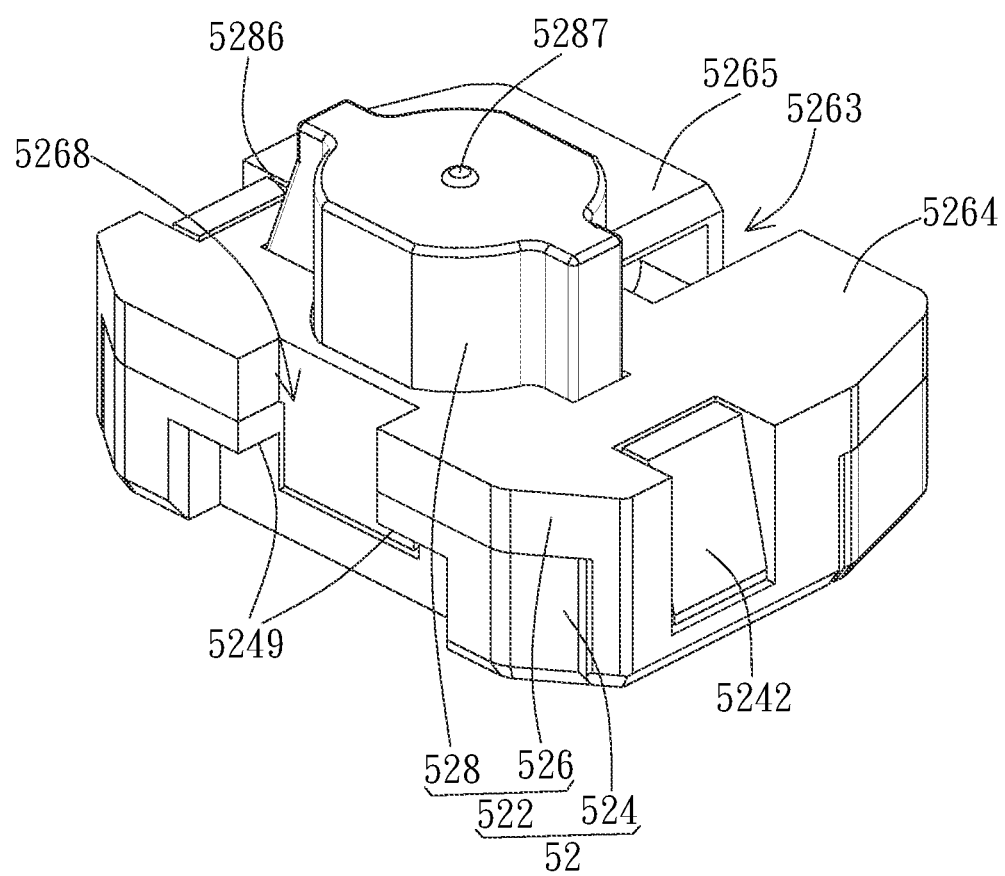
FIG. 1F is a schematic view of the restoring mechanism of FIG. 1A from a different viewing angle.
Figure 1G:
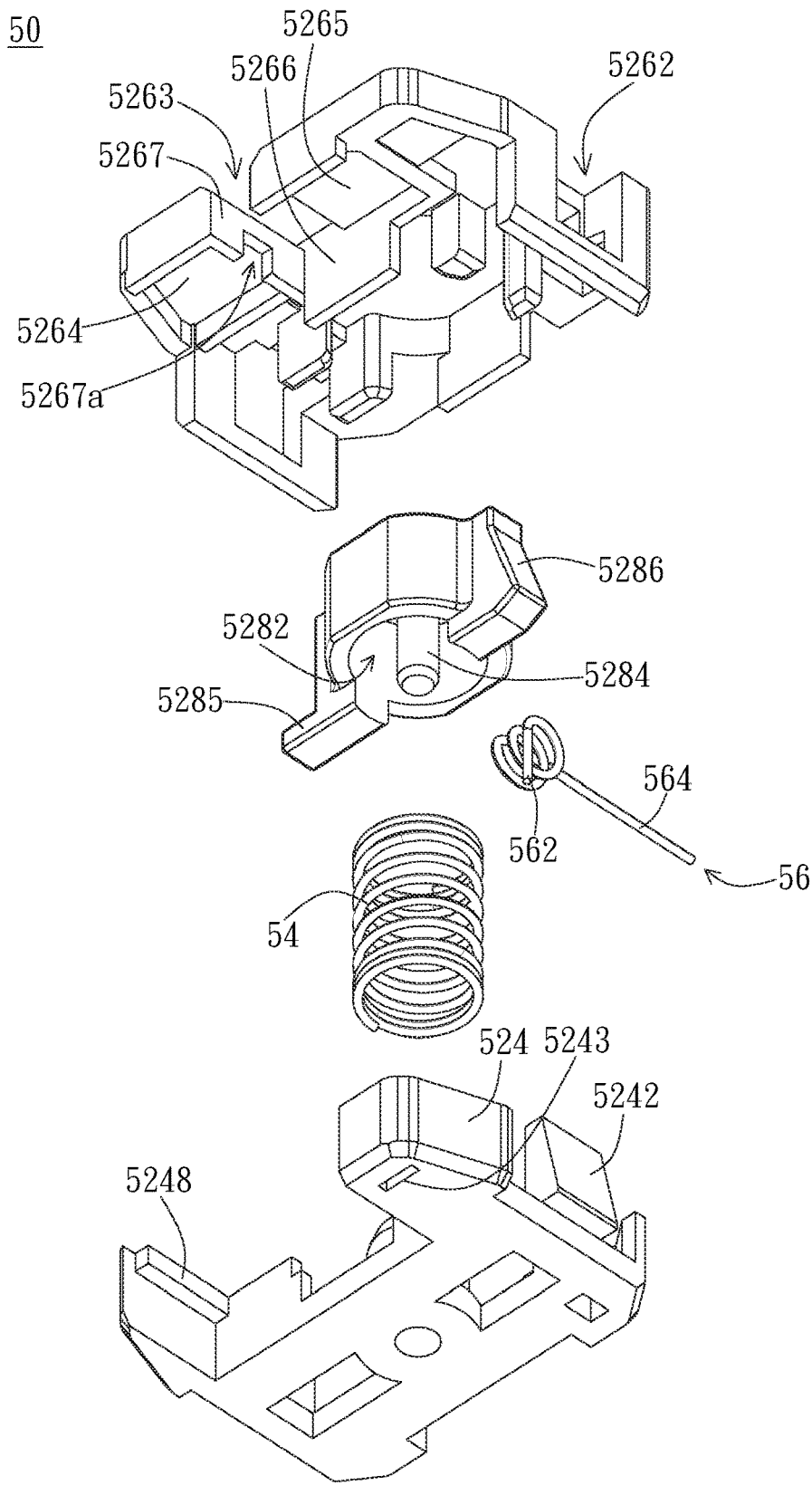
FIGS. 1G and 1H are an exploded bottom view and a schematic bottom view of the restoring mechanism of FIG. 1A, respectively.

FIG. 1A to FIG. 4B are schematic views of a first embodiment of the invention, wherein FIG. 1A is an exploded view of the first embodiment of the optical keyswitch of the invention, FIG. 1B is a schematic view of the optical keyswitch of FIG. 1A without the keycap, and FIG. 1C is a top view of FIG. 1B. As shown in FIGS. 1A to 1C, an optical keyswitch 1 in the first embodiment includes a keycap 10, a support mechanism 20, and a switch module 30. The support mechanism 20 is disposed below the keycap 10 and configured to support the keycap 20 moving upward and downward. The support mechanism 20 has a protrusion 21. The switch module 30 includes a circuit board 32, an emitter 34, and a receiver 36. The emitter 34 and the receiver 36 are electrically connected to the circuit board 32, and the emitter 34 emits an optical signal to the receiver 36. When the keycap 10 is not pressed, the receiver 36 receives the optical signal of a first intensity. When the keycap 10 is pressed, the protrusion 21 is driven by the keycap 10 to move along with the keycap 10, and the protrusion 21 changes the optical signal received by the receiver 36 to have a second intensity different from the first intensity, so that the switch module 30 is triggered to generate a triggering signal. In addition, the optical keyswitch 1 may further includes a baseplate 40, a restoring mechanism 50, and a backlight source 60 (described later).

Particularly, the keycap 10 can be, for example, an injection-molded rectangular keycap. The keycap 10 has coupling members 12 and 14 formed on its bottom surface to couple the support mechanism 20. In an embodiment, the coupling member 12 can be a coupling structure with a pivotal hole, and the coupling member 14 can be a coupling structure with a groove. Moreover, according to practical applications, the keycap 10 may be a keycap with a light-transparent portion 16 to be implemented to a luminous keyboard. For example, the light-transparent portion 16 can be in a form of pattern, such as alphabets, numbers, or any suitable characters, to indicate the instruction inputted through the keyswitch.

The baseplate 40 is disposed below the keycap 10 and extends horizontally beyond the keycap 10. For example, the baseplate 40 can be a support plate to enhance the structural strength of the optical keyswitch 1. The baseplate 40 has connection members 42 and 44 for coupling the support mechanism 20. In an embodiment, the baseplate 40 is a metal plate formed by stamping. The connection members 42 and 44 are hook-like portions protrudingly bent from the baseplate 40 toward the keycap 10. It is noted that when the circuit board 32 has sufficient structural strength, the connection members 42 and 44 can be alternatively disposed on the circuit board 32 to omit the baseplate 40.

Referring to FIG. 1A to FIG. 1D, FIG. 1D is an exploded view of the support mechanism of FIG. 1A from a different viewing angle. As shown in the figures, the support mechanism 20 preferably includes an inner frame 22 and an outer frame 24. The inner frame 22 is pivotally connected to an inner side of the outer frame 24 to form a scissor-like support mechanism. For example, the inner frame 22 and the outer frame 24 are injection-molded rectangular frames, and the inner frame 22 and the outer frame 24 are rotatably connected to each other by a combination of pivotal rod and pivotal hole. For example, the inner frame 22 has pivotal rods 221, which are located at two opposite outer sides of its middle section and protrude outward. The outer frame 24 has pivotal holes 241, which are located at two opposite inner sides and correspond to the pivotal rods 221, respectively. Therefore, the inner frame 22 and the outer frame 24 couple with each other and rotate about a scissor axis 26 (i.e. a connection line of the two pivotal rods 221). Moreover, two ends of the inner frame 22 and the outer frame 24 are movably connected to the keycap 10 and the baseplate 40, respectively. For example, the keycap end 222 of the inner frame 22 is rotatably connected to the coupling member 12 of the keycap 10, and the baseplate end 224 of the inner frame 22 is movably connected to the connection member 42 of the baseplate 40. Similarly, the keycap end 242 of the outer frame 24 is movably connected to the coupling member 14 of the keycap 10, and the baseplate end 244 of the outer frame 24 is movably connected to the connection member 44 of the baseplate 40. As such, the support mechanism 20 is connected to the keycap 10 and the baseplate 40 and supports the keycap 10 stably moving upward and downward relative to the baseplate 40.

The protrusion 21 is disposed on the inner frame 22 and extends from an inner side of the inner frame 22 toward an inner direction of the inner frame 22. For example, the protrusion 21 is preferably disposed on the inner side of the keycap end 222 of the inner frame 22. The protrusion 21 is preferably an L-shaped protrusion rod, which includes a horizontal portion 212 extending from the inner frame 22 toward the frame center horizontally and a vertical portion 214 extending downward from an end portion of the horizontal portion 212.

The circuit board 32 is preferably disposed on the baseplate 40. The circuit board 32 has openings 322 allowing the connection members 42, 44 of the baseplate 40 passing therethrough to couple with the support mechanism 20. The emitter 34 and the receiver 36 are disposed on the circuit board 32, and electrically connected to the circuit board 32. Particularly, the circuit board 32 has a switch circuit, and the emitter 34 and the receiver 36 are electrically connected to the switch circuit, so that the emitter 34 can emit the optical signal toward the receiver 36. When the intensity of the optical signal received by the receiver 36 changes, the switch module 30 is triggered to generate the triggering signal. For example, the emitter 34 can be any suitable emitters, which can emit optical signal of suitable wavelength, and the optical signal emitted by the emitter 34 can include electromagnetic waves, infrared rays, or visible lights. The receiver 36 can be any suitable receivers, which can correspondingly receive the optical signal. The circuit board 32 preferably has a receiving space 324 for allowing the protrusion 21 to pass therethrough. For example, the receiving space 324 can be a receiving groove opened on the circuit board 32, and the emitter 34 and the receiver 36 are disposed on two opposite sides of the receiving groove, so that an intensity adjustment space 52$b$ (shown in FIG. 2A) is formed between the emitter 34 and the receiver 36.

Moreover, in response to the disposition of the backlight source 60, the circuit board 32 preferably has a light source circuit for driving the backlight source 60. The backlight source 60 can be disposed on the circuit board 32 and electrically connected to the light source circuit of the circuit board 32 to emit light out of the light-transparent portion 16 of the keycap 10. In an embodiment, the backlight source 60 is preferably a light-emitting diode, and the wavelength of the light emitted from the backlight source 60 is preferably different from the wavelength of the optical signal emitted from the emitter 34, so as to reduce interference, but not limited thereto. The backlight source 60 is preferably disposed on the opposite side of the emitter 34 and the receiver 36. The backlight source 60, the emitter 34, and the receiver 36 are preferably all within a vertical projection area of the inner frame 22 on the baseplate 40. For example, the emitter 34 and the receiver 36 are disposed corresponding to the protrusion 21 and neighboring the keycap end 222 of the inner frame 22, and the backlight source 60 is correspondingly disposed neighboring the baseplate end 224 of the inner frame 22.

Referring to FIGS. 1A to 1C and FIGS. 1E to 1H, in an embodiment, the restoring mechanism 50 is disposed below the keycap 10 and configured to provide a restoring force to enable the keycap 10 to return to a non-pressed position after the keycap 10 is released from the pressing force. Specifically, the restoring mechanism 50 is disposed between the keycap 10 and the baseplate 40 (or the circuit board 32), and the restoring mechanism 50 includes a casing 52 and a resilient member 54. The casing 52 has an accommodation space 521, and the resilient member 54 is disposed in the accommodation space 521. In this embodiment, the resilient member 54 is a spring to provide a mechanical tactile feedback. The casing 52 includes an upper casing 522 and a lower casing 524, which are combined to enclose the accommodation space 521. The upper casing 521 includes an upper casing body 526 and a movable part 528. The movable part 528 is movably coupled to the upper casing body 526. Specifically, the upper casing body 526 has a through hole 5261 and an upper engaging portion 5262. The movable part 528 is movably inserted into the through hole 5261 to position the resilient member 54 and functions as an actuator when the keycap 10 is pressed. The lower casing 524 has a lower engaging portion 5242 for engaging the upper engaging portion 5262 to combine the upper casing 522 and the lower casing 524. In an embodiment, the upper engaging portion 5262 can be slots formed on two opposite sides of the upper casing body 526, and the lower engaging portion 5242 can be corresponding protrudent portions, but not limited thereto. According to practical applications, the upper engaging portion 5262 can be protrudent portions formed on the upper casing body 526, and the lower engaging portion 5242 can be corresponding slots.

Figure 1H:
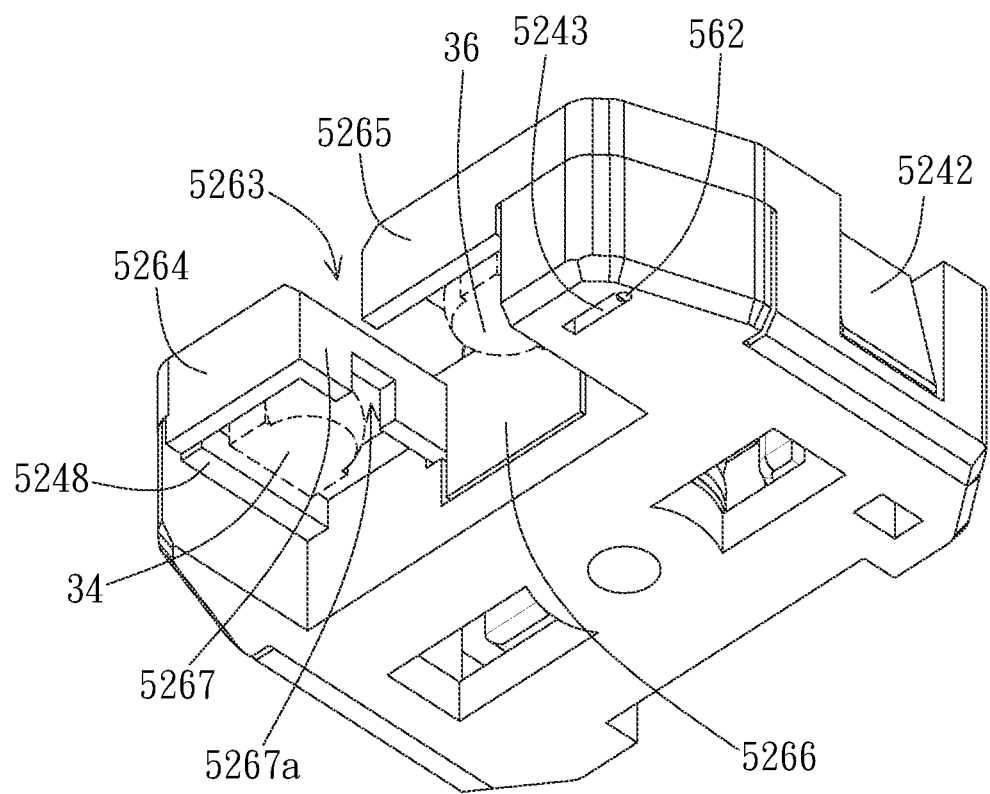

Specifically, the upper casing body 526 is preferably a rectangular cover with an open region 5263. The upper engaging portions 5262 are preferably disposed on two sides with respect to the open region 5263, so that a left arm portion 5264 is formed between the left upper engaging portion 5262 and the open region 5263, and a right arm portion 5265 is formed between the right upper engaging portion 5262 and the open region 5263. When the restoring mechanism 50 is disposed on the circuit board 32, the emitter 34 and the receiver 36 are preferably covered by the casing 52 for dust-protection and interference reduction. For example, the emitter 34 and the receiver 36 are respectively located on two opposite sides with respect to the open region 5263 and covered by the upper casing body 526. In an embodiment, the lower casing 524 has a substantially U-shaped horizontal cross section. The left arm portion 5264 and the right arm portion 5265 of the upper casing body 526 protrude toward each other, from two sides of the substantially U-shaped horizontal cross section, beyond the lower casing 524. In other words, the vertical projections of the left arm portion 5264 and the right arm portion 5265 of the upper casing body 526 at least partially exceed the vertical projection of the lower casing 524, so as to form the open region 5263 between the left arm portion 5264 and the right arm portion 5265. As shown in FIG. 1H, the emitter 34 and the receiver 36 are respectively positioned beneath the left arm portion 5264 and the right arm portion 5265 for dust-protection, but not limited thereto. In other embodiments, by modifying design of the lower casing 524, the emitter 34 and the receiver 36 can be positioned beneath lateral portions of the U-shaped horizontal cross section of the lower casing 524, so as to be covered by the lower casing 524. Moreover, the upper casing body 526 has a sidewall 5266 adjacent to the open region 5263. The accommodation space 521 is separated from the open region 5263 by the sidewall 5266, so that when the keycap 10 is pressed, the protrusion 21 moves outside the casing 52. That is, when the keycap 10 is pressed, the protrusion 21 preferably moves outside the accommodation space 521, which is enclosed by the upper casing 522 and the lower casing 524.

In an embodiment, the movable part 528 is preferably a barrel-like object to define a positioning space 5282 on the bottom of the movable part 528 and has a positioning post 5284 extending axially along the barrel-like object. The movable part 528 has a restricting portion 5285 and an acting portion 5286 on two opposite sides of the barrel-like object. The restricting portion 5285 is configured to restrict the movement of the movable part 528 relative to the upper casing body 526. The acting portion 5286 is configured to work with the tactile resilient member 56 to provide tactile feedback (described later). In an embodiment, the restricting portion 5285 can be a hook-like portion extending radially outward from the movable part 528, and the acting portion 5286 can be an inclined face inclining outward from up to down. The movable part 528 further has a protrudent bump 5287 on top center of the barrel-like object to serve as a contact point with the keycap 10.

The lower casing 524 further has a coupling portion 5244 configured to position the resilient member 54. In an embodiment, the coupling portion 5244 protrudes correspondingly to the movable part 528 from the surface of the lower casing 524 toward the upper casing 522. A guiding groove 5246 is formed at the inner side of the coupling portion 5244 along the extending direction of the coupling portion 5244. When assembling the restoring mechanism 50, the spring-type resilient member 54 is sleeved on the outer side of the coupling portion 5244, and the positioning post 5284 of the movable part 528 extends into the guiding groove 5246 of the lower casing 524, so that the top end of the resilient member 54 is received in the positioning space 5282, and the lower end of the resilient member 54 is positioned between the movable part 528 and the coupling portion 5244. Then, the upper engaging portion 5262 of the upper casing body 526 engages with the lower engaging portion 5242 of the lower casing 524, so that the top end of the movable part 528 extends out of the through hole 5261 of the upper casing body 526, and the resilient member 54 is positioned between the movable part 528 and the lower casing 524 by the coupling portion 5244 and the positioning post 5284. When the keycap 10 is pressed, the movable part 528 moves downward along the guiding groove 5246 relative to the upper casing body 526, so as to compress the resilient member 54. When the keycap 10 is released, the resilient member 54 provides the resilient force, so that the movable part 528 as well as the keycap 10 are driven by the resilient force to move upward relative to the upper casing body 526 and positioned at the non-pressed position by the restricting portion 5285.

In an embodiment, the lower casing 524 further has wing portions 5248 and 5249. The restoring mechanism 50 is positioned on the circuit board 32 by the wing portions 5248 and 5249. Specifically, the wing portions 5248 and 5249 are preferably disposed on two opposite sides of the lower casing 524. For example, the wing portion 5248 is leaned on the circuit board 32 neighboring the emitter 34 and the receiver 36, and the wing portion 5249 is leaned on the circuit board 32 neighboring the backlight source 60. In an embodiment, the wing portion 5248 can be a pair of supporting arms of the lower casing 524, which protrude toward each other and are respectively located corresponding to the emitter 34 and the receiver 36 below the left arm portion 5264 and the right arm portion 5265. The wing portion 5249 can be a pair of protruding blocks with concaves of the lower casing 524. For example, the protruding blocks protrude horizontally form the lower casing 524 toward each other and recess from the bottom surface of the lower casing 524 to form the concaves. The upper casing body 526 has an opening 5268 corresponding to the wing portion 5249, and the backlight source 60 is disposed corresponding to the opening 5268. As such, the light emitted from the backlight source 60 can be blocked by the restoring mechanism 50 and less likely to influence the intensity of the optical signal received by the receiver 36, so as to reduce the possibility that the switch module 30 is triggered to generate a false triggering signal.

In an embodiment, the restoring mechanism 50 further includes a tactile resilient member 56 for providing a tactile feedback when the keycap 10 is pressed. For example, the tactile resilient member 56 can be implemented as a torsion spring, wherein one end of the torsion spring acts as a positioning end 562, and the other end of the torsion spring acts as an acting end 564. The lower casing 524 correspondingly has a positioning hole 5243. When the tactile resilient member 56 is disposed on the lower casing 524, the positioning end 562 couples to the positioning hole 5243, and the acting end 564 is disposed corresponding to the acting portion 5286 of the movable part 528. In this embodiment, the acting end 564 preferably extends vertical to the scissor axis 26 (i.e., the rotation axis of the scissor-like support mechanism where the two frames are pivotally connected). When the keycap 10 is pressed, the acting portion 5286 moves downward along with the keycap 10 and generates relative displacement with respect to the acting end 564 of the torsion spring. Therefore, the acting end 564 (1) firstly slides on the bottom inclined surface of the acting portion 5286, allowing the user to feel a larger resistance, (2) then, the acting end 564 escapes from the acting portion 5286 (i.e. moves across the bottom inclined surface of the acting portion 5286), allowing the user to feel the resistance being greatly decreased. As such, a clear tactile feedback of pressing feeling can be provided to the user, and sound is generated by the acting end 564 hitting the upper casing body 526. When the keycap 10 is released, the resilient member 54 provides the restoring force to enable the keycap 10 and the movable part 528 including the acting portion 5286 to move upward, so the acting end 564 slides downward along the smoother top inclined surface (i.e. moves across the top inclined surface of the acting portion 5286) back to its original position.

Moreover, referring to FIG. 1C, the restoring mechanism 50 and the emitter 34 and the receiver 36 of the switch module 30 are all preferably located within the vertical projection of the inner frame 522 on the baseplate 40. Specifically, the restoring mechanism 50 is substantially located at a first side 262 with respect to the scissor axis 26. The emitter 34 and the receiver 36 are located at a second side 264 with respect to the scissor axis 26 opposite to first side 262. The first side 262 and the second side 264 are two opposite sides with respect to the scissor axis 26. It is noted that in this embodiment, "the restoring mechanism 50 is substantially located at the first side 262" refers that the center of the movable part 528 or the central axis of the resilient member 54, e.g. the location of the protrudent bump 5287, is located at the first side 262 and preferably neighboring the scissor axis 26, but not limited thereto.

Moreover, the casing 52 preferably has a grating portion 5267, which is disposed corresponding to the emitter 34 or the receiver 36 to define a stroke distance of generating the triggering signal when the keycap 10 is pressed. For example, the grating portion 5267 can have a gate-like structure with a slit 5267a and is preferably located between the emitter 34 and the receiver 36 adjacent to the emitting end of the emitter 34 or the receiving end of the receiver 36. The grating portion 5267 can control the triggering position by the size and position of the slit 5267a, so as to reduce the false triggering. For example, the possible triggering error is about the thickness of the emitter 34 and the receiver 36, and by controlling the size of the slit 5267a to correspond to (e.g. smaller than) the thickness of the emitter 34 or the receiver 36, the triggering error can be reduced. In an embodiment, the grating portion 5267 of the casing 52 is disposed on the left arm portion 5264 of the upper casing body 526 and neighbors the emitter 34, but not limited thereto. According to practical applications, in corporation with the design of the circuit board 32, the locations of the emitter 34 and the receiver 36 can be exchanged, so the emitter 34 and the receiver 36 can be located respectively beneath the right arm portion 5265 and the left arm portion 5264, and the grating portion 5267 is accordingly adjacent to the receiver 36. As such, the optical signal at the receiver 36 is less interfered by external light, and the possibility of generating a false triggering signal is effectively reduced.

Figure 2A:
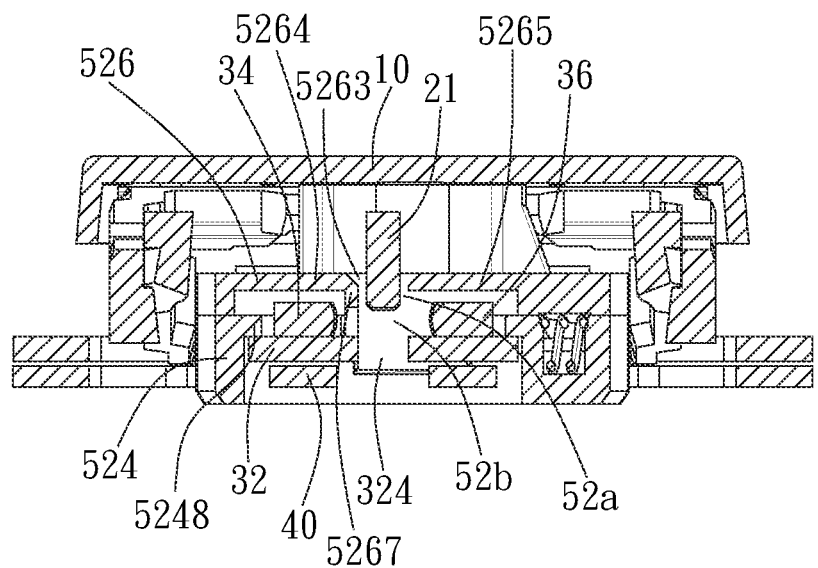
FIGS. 2A, 3A, and 4A are cross-sectional views of the optical keyswitch of the first embodiment of the invention along the X axis at the non-pressed position, the triggering position, and the lowest position, respectively.
Figure 2B:
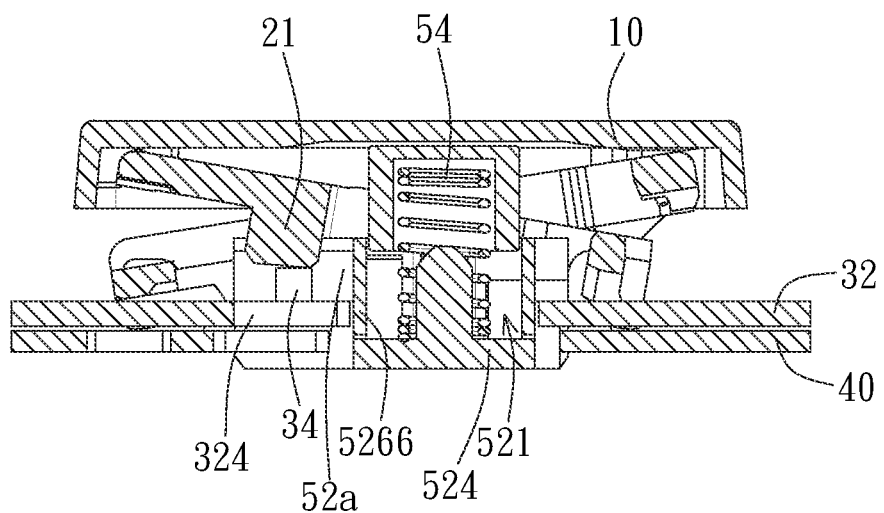
FIGS. 2B, 3B, and 4B are cross-sectional views of the optical keyswitch of the first embodiment of the invention along the Y axis at the non-pressed position, the triggering position, and the lowest position, respectively.
Figure 3A:
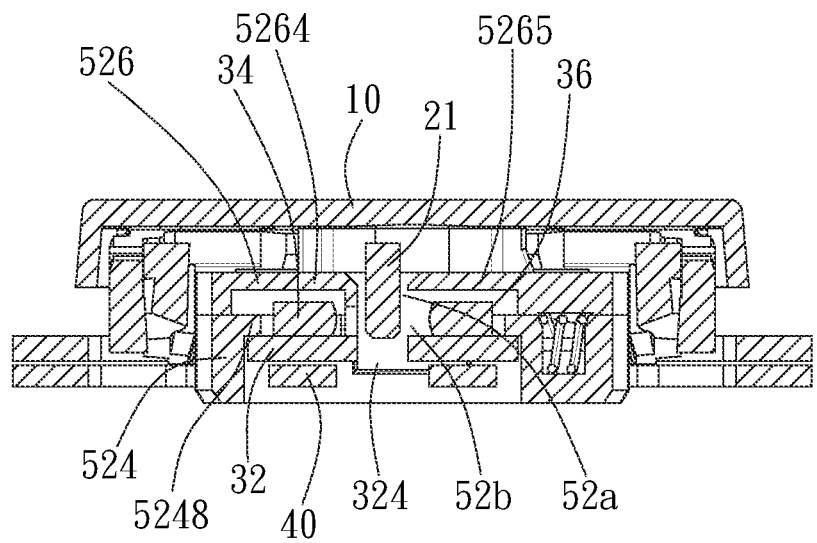
Figure 3B:
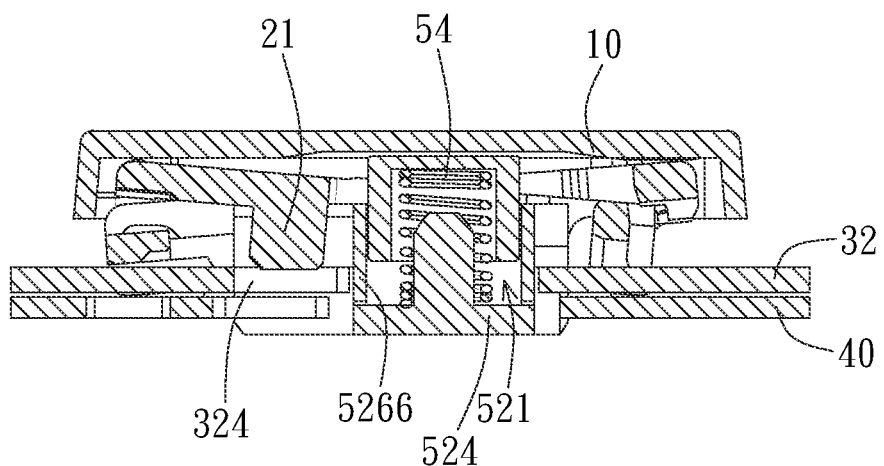
Figure 4A:
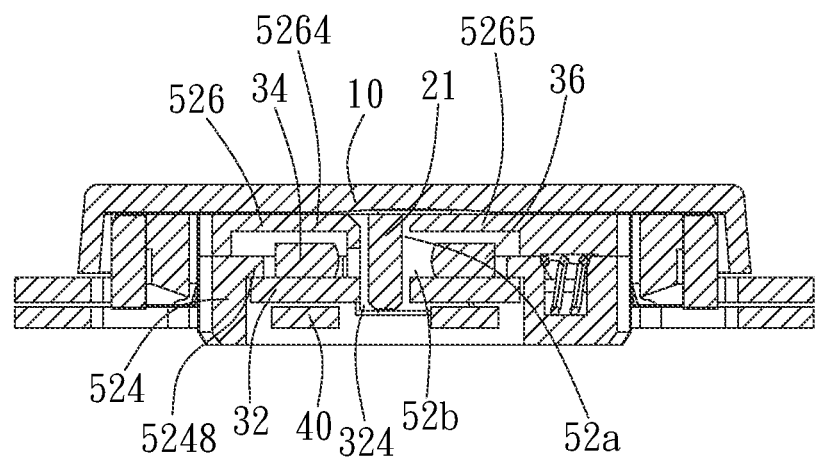
Figure 4B:
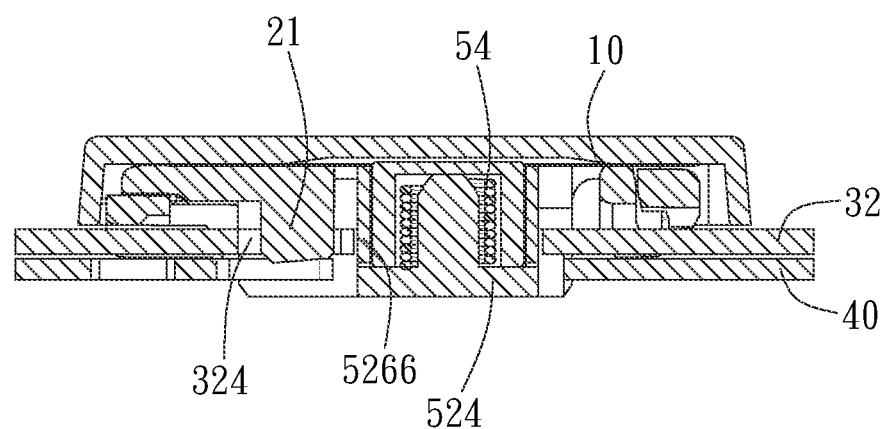

Referring to FIGS. 2A to 4B, the operation of the optical keyswitch of the first embodiment will be illustrated. FIGS. 2A, 3A, and 4A are cross-sectional views of the optical keyswitch along the X axis at the non-pressed position, the triggering position, and the lowest position, respectively. FIGS. 2B, 3B, and 4B are cross-sectional views of the optical keyswitch along the Y axis at the non-pressed position, the triggering position, and the lowest position, respectively. As shown in FIGS. 2A and 2B, the casing 52 has an up-down path 52a, and the sidewall 5266 is located between the up-down path 52a and the accommodation space 521 to separate the up-down path 52a from the accommodation space 521. In other words, the up-down path 52a is located within the open region 5263. In this embodiment, the emitter 34, the intensity adjustment space 52b, and the receiver 36 are preferably arranged sequentially along a straight optical path (e.g. arranged straightly along the X axis), and the straight optical path is substantially parallel to the scissor axis 26. When the keycap 10 is not pressed, the protrusion 21 is at a first position relative to the intensity adjustment space 52b, and the receiver 36 receives the optical signal of the first intensity, such as an intensity that the optical signal is not blocked or attenuated.

As shown in FIGS. 3A and 3B, when the keycap 10 is pressed, the protrusion 21 moves along with the keycap 10 outside the casing 52 to a second position relative to the intensity adjustment space 52b. The second position is different from the first position, and the protrusion 21 changes the optical signal received by the receiver 36 to have a second intensity different from the first intensity, so that the switch module 30 is triggered to generate the triggering signal. For example, when the keycap 10 is pressed, the inner frame 22 of the support mechanism 20 is driven by the keycap 10 to horizontally slide on the baseplate 40, so that the protrusion 21 moves downward in the up-down path 52a.

In this embodiment, the first position refers that the protrusion 21 is away from the intensity adjustment space 52b, and the protrusion 21 does not substantially change the intensity of the optical signal received by the receiver 36. The second position refers that the protrusion 21 is located in the intensity adjustment space 52b, and the protrusion 21 reduces the intensity of the optical signal received by the receiver 36, so that the second intensity is smaller than the first intensity to trigger the switch module 30 to generate the triggering signal. For example, when the protrusion 21 is driven by the keycap 10, the protrusion 21 moves to at least partially block the optical signal, so the second intensity is smaller than the first intensity, and the switch module 30 is triggered to generate the triggering signal. In an embodiment, when the protrusion 21 is driven by the keycap 10, the protrusion 21 moves to substantially completely block the optical signal, so the optical signal cannot be received by the receiver 36, i.e. the second intensity is zero. For example, the horizontal portion 212 of the protrusion 21 preferably has a length long enough to extend to the open region 5263, and the vertical portion 214 has a size large enough to substantially block the optical signal, but not limited thereto. It is noted that by modifying the circuit design of the circuit board 32, the switch module 30 can generate the triggering signal based on the variation in intensity of the optical signal received by the receiver 36, or based on whether the receiver 36 receives the optical signal.

As shown in FIGS. 4A and 4B, the up-down path 52a, the intensity adjustment space 52b, and the receiving space 324 are aligned and communicated. Therefore, when the keycap 10 is pressed, the protrusion 21 is driven by the keycap 10 to move downward in the up-down path 52a to the triggering position and further into the receiving space 324 through the intensity adjustment space 52b. As such, not only a faster triggering effect can be achieved, but also the stroke distance can be increased to enhance the tactile feedback. It is noted that according to practical applications, the baseplate 40 can also have a similar design corresponding to the receiving space 324. For example, the baseplate 40 can be recessed to have a concave portion or formed with an opening at the position corresponding to the receiving space 324. Therefore, when the keycap 10 is pressed, the protrusion 21 is driven by the keycap 10 to move downward in the up-down path 52a to the triggering position, further into the receiving space 324 through the intensity adjustment 52b, and then into the concave portion or the opening of the baseplate 40.

Figure 5A:
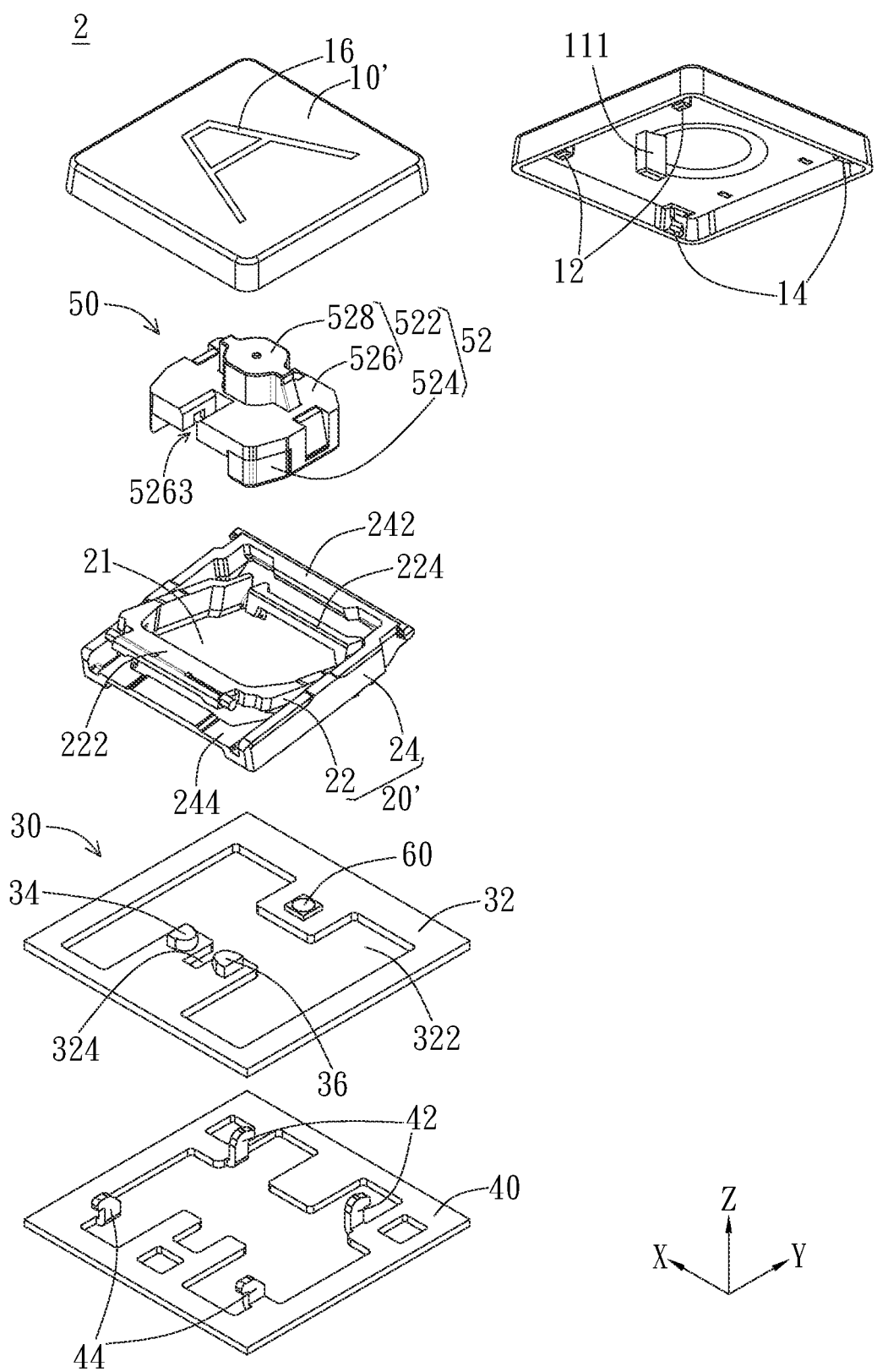
FIG. 5A is an exploded view of a second embodiment of the optical keyswitch of the invention.
Figure 5B:
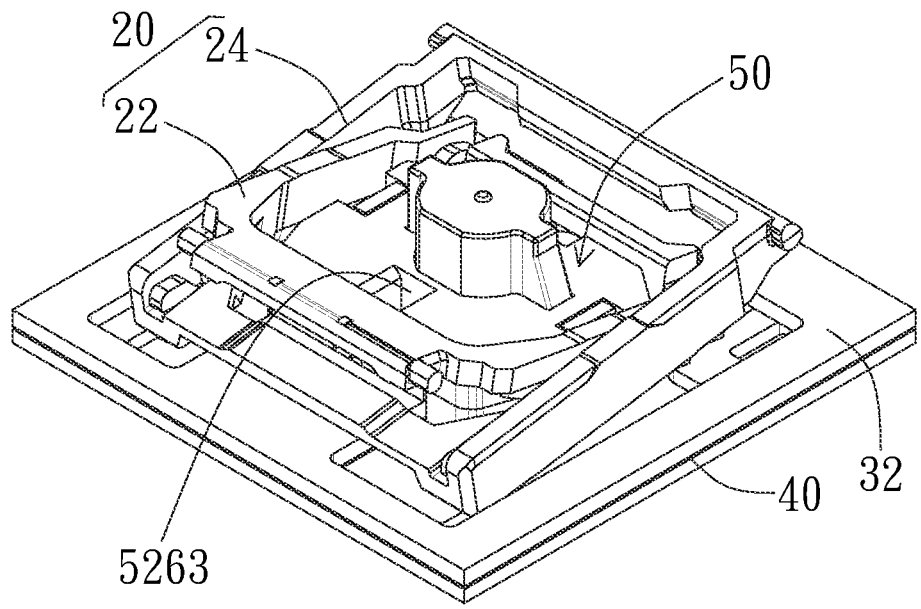
FIG. 5B is a schematic view of the optical keyswitch of FIG. 5A without the keycap.
Figure 5C:
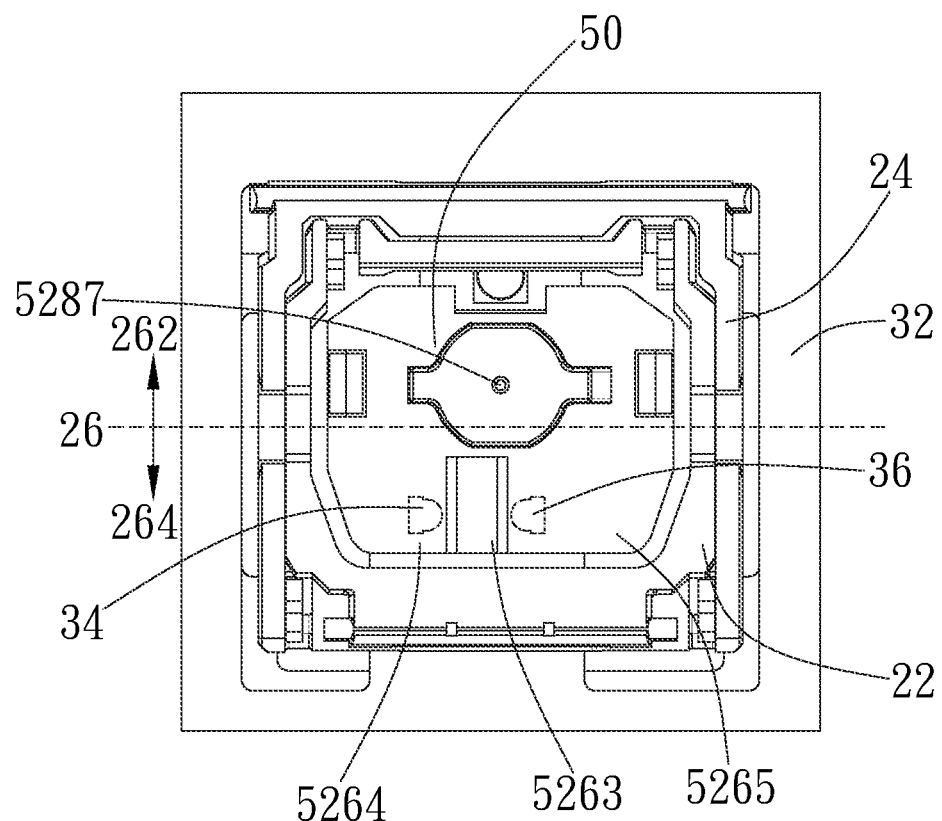
FIG. 5C is a top view of FIG. 5B.

FIG. 5A to FIG. 8B are schematic views of a second embodiment of the invention, wherein FIG. 5A is an exploded view of the second embodiment of the optical keyswitch of the invention, FIG. 5B is a schematic view of the optical keyswitch of FIG. 5A without the keycap, and FIG. 5C is a top view of FIG. 5B. As shown in the figures, in the second embodiment, the optical keyswitch 2 includes a keycap 10', a support mechanism 20', the switch module 30, and the restoring mechanism 50. The keycap 10' has a protrusion 111. The support mechanism 20' is disposed below the keycap 10' and configured to support the keycap 10' moving upward and downward. The restoring mechanism 50 is disposed below the keycap 10' and configured to provide a restoring force to enable the keycap 10' to return to a non-pressed position. The restoring mechanism 50 includes the casing 52 having the accommodation space 521 and the resilient member 54 disposed in the accommodation space 521. The switch module 30 includes the circuit board 32, the emitter 34, and the receiver 36. The emitter 34 and the receiver 36 are electrically connected to the circuit board 32, and the emitter 34 emits an optical signal to the receiver 36. The emitter 34 and the receiver 36 are spaced apart by the intensity adjustment space 52b. When the keycap 10' is not pressed, the protrusion 111 is at a first position relative to the intensity adjustment space 52b, and the receiver 36 receives the optical signal of a first intensity. When the keycap 10' is pressed, the protrusion 111 moves along with the keycap 10' outside the casing 52 to a second position relative to the intensity adjustment space 52b. The second position is different from the first position, and the protrusion 111 changes the optical signal received by the receiver 36 to have a second intensity different from the first intensity, so that the switch module 30 is triggered to generate a triggering signal.

The optical keyswitch 2 of FIG. 5A is different from the optical keyswitch 1 of FIG. 1A in that the support mechanism 20' does not have the protrusion 21, and the protrusion 111 is disposed on the lower surface of the keycap 10'. In this embodiment, the protrusion 111 is preferably a baffle extending from the lower surface of the keycap 10' and correspondingly located above the open region 5263 of the restoring mechanism 50. Other components of the optical keyswitch 2 (e.g. the switch module 30, the restoring mechanism 50, the baseplate 40, the backlight source 60) as well as other portions of the keycap 10' and the support mechanism 20' can refer to related descriptions of the optical keyswitch 1 of the first embodiment for details of structures and connections, which will not be elaborated again.

Figure 6A:
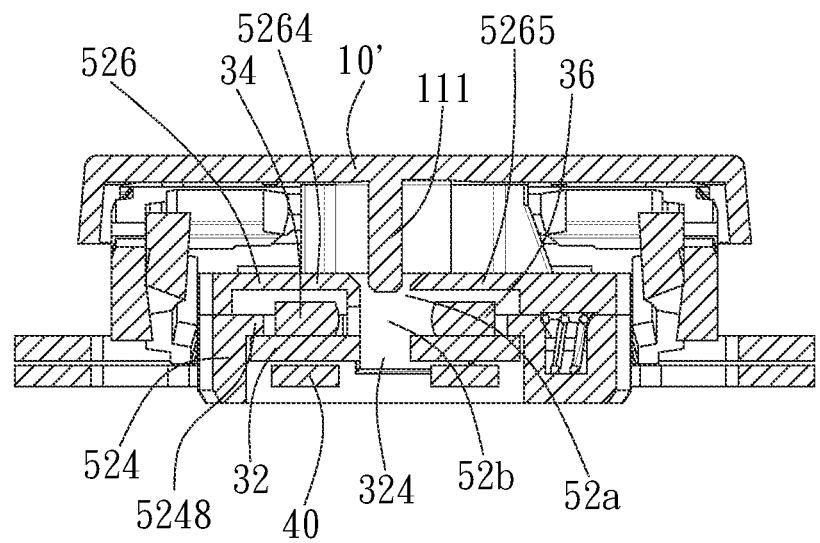
FIGS. 6A, 7A, and 8A are cross-sectional views of the optical keyswitch of the second embodiment of the invention along the X axis at the non-pressed position, the triggering position, and the lowest position, respectively.
Figure 6B:
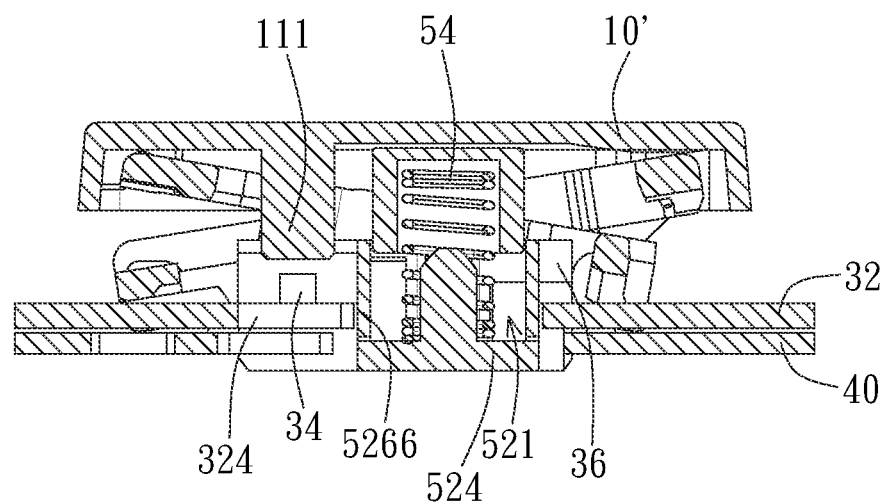
FIGS. 6B, 7B, and 8B are cross-sectional views of the optical keyswitch of the second embodiment of the invention along the Y axis at the non-pressed position, the triggering position, and the lowest position, respectively.

Referring to FIGS. 6A to 8B, the operation of the optical keyswitch of the second embodiment will be illustrated. FIGS. 6A, 7A, and 8A are cross-sectional views of the optical keyswitch along the X axis at the non-pressed position, the triggering position, and the lowest position, respectively. FIGS. 6B, 6B, and 6B are cross-sectional views of the optical keyswitch along the Y axis at the non-pressed position, the triggering position, and the lowest position, respectively. As shown in FIGS. 6A and 6B, the casing 52 has the up-down path 52a, and the sidewall 5266 is located between the up-down path 52a and the accommodation space 521 to separate the up-down path 52a from the accommodation space 521. In other words, the up-down path 52a is located within the open region 5263. In this embodiment, the emitter 34, the intensity adjustment space 52b, and the receiver 36 are preferably arranged sequentially along a straight optical path (e.g. arranged straightly along the X axis), and the straight optical path is substantially parallel to the scissor axis 26. When the keycap 10' is not pressed, the protrusion 111 is away from the intensity adjustment space 52b, and the protrusion 111 does not change the intensity of the optical signal received by the receiver 36.

Figure 7A:
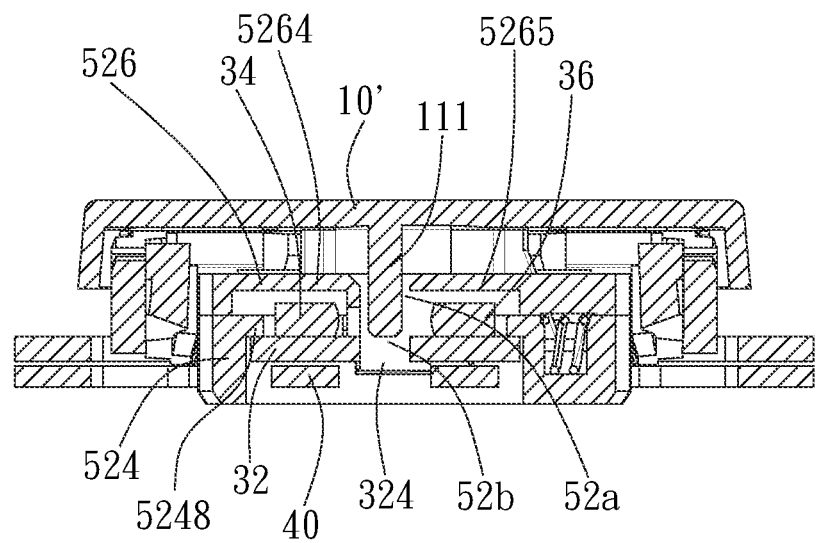
Figure 7B:
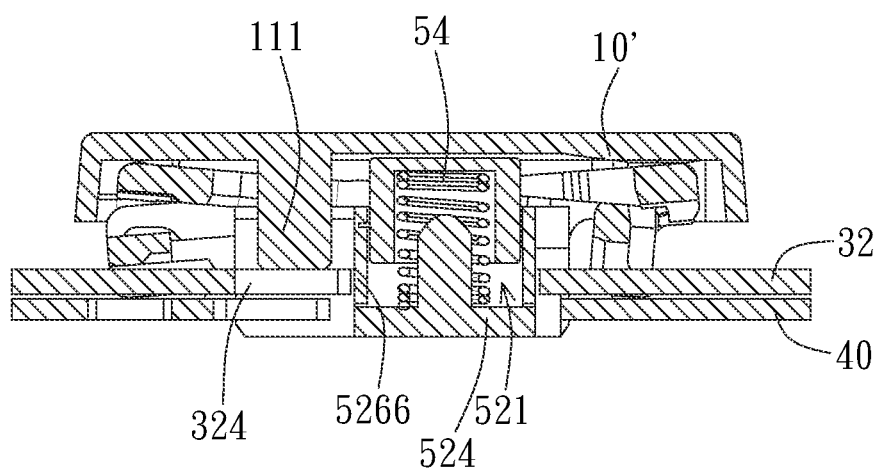

As shown in FIGS. 7A and 7B, when the keycap 10' is pressed, the protrusion 111 moves downward along with the keycap 10' in the up-down path 52a into the intensity adjustment space 52b to at least partially block the optical signal, so that the second intensity is smaller than the first intensity, and the switch module 30 is triggered to generate the triggering signal. By modifying the size (e.g. length and width) of the protrusion 111, the protrusion 111 can be designed to substantially completely or partially block the optical signal, so that the switch module 30 can generate the triggering signal based on the variation in intensity of the optical signal received by the receiver 36, or based on whether the receiver 36 receives the optical signal.

Figure 8A:
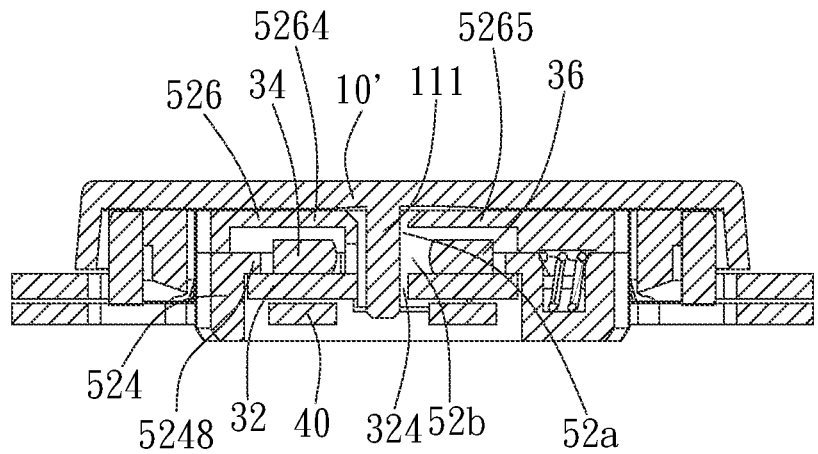
Figure 8B:
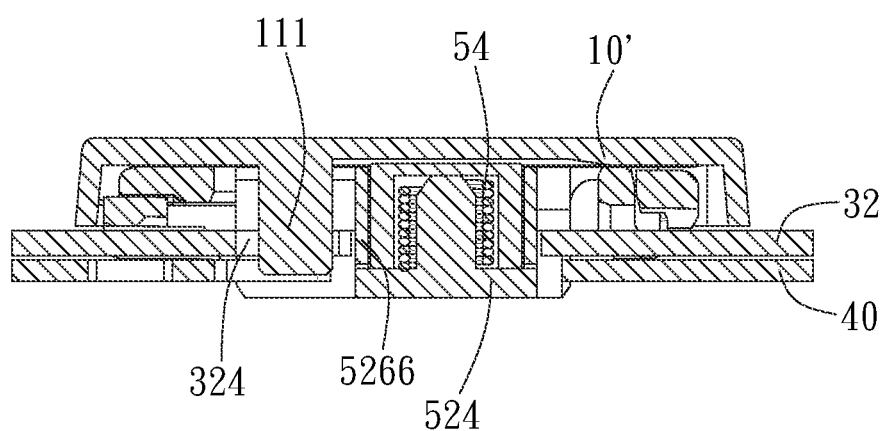

As shown in FIGS. 8A and 8B, the up-down path 52a, the intensity adjustment space 52b, and the receiving space 324 are aligned and communicated. Therefore, when the keycap 10' is pressed, the protrusion 111 moves downward along with the keycap 10' in the up-down path 52a to the triggering position and further into the receiving space 324 through the intensity adjustment space 52b. As such, not only a faster triggering effect can be achieved, but also the stroke distance can be increased to enhance the tactile feedback.

In the first and second embodiments, the optical keyswitch 1 or 2 generates the triggering signal by utilizing the protrusion 21 or 111 to directly change the receiving status of the optical signal received by the receiver 36, but not limited thereto. In other embodiments, the protrusion can work with other components to change the receiving status of the optical signal received by the receiver 36 so as to generate the triggering signal.

Figure 9A:
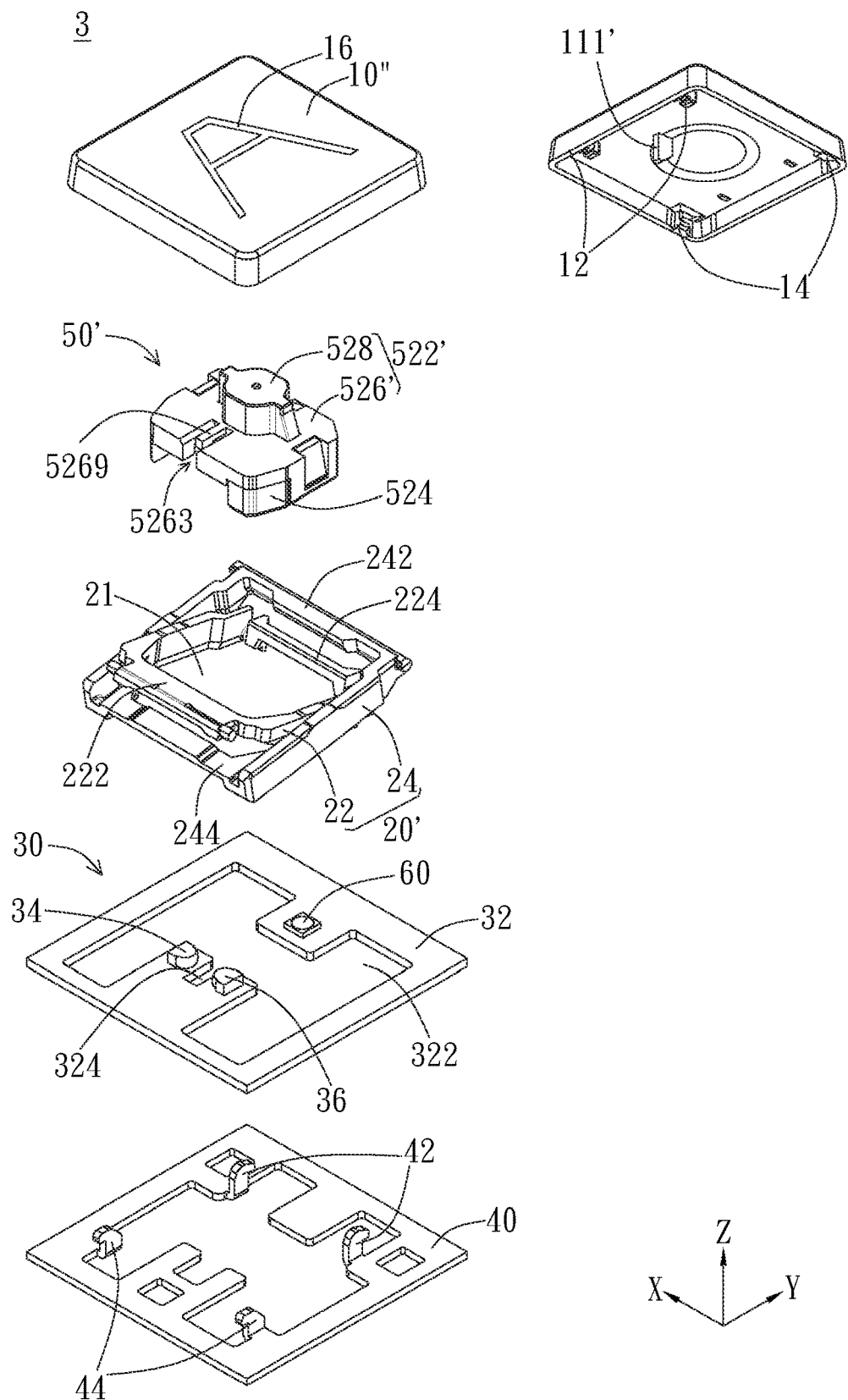
FIG. 9A is an exploded view of a third embodiment of the optical keyswitch of the invention.
Figure 9B:
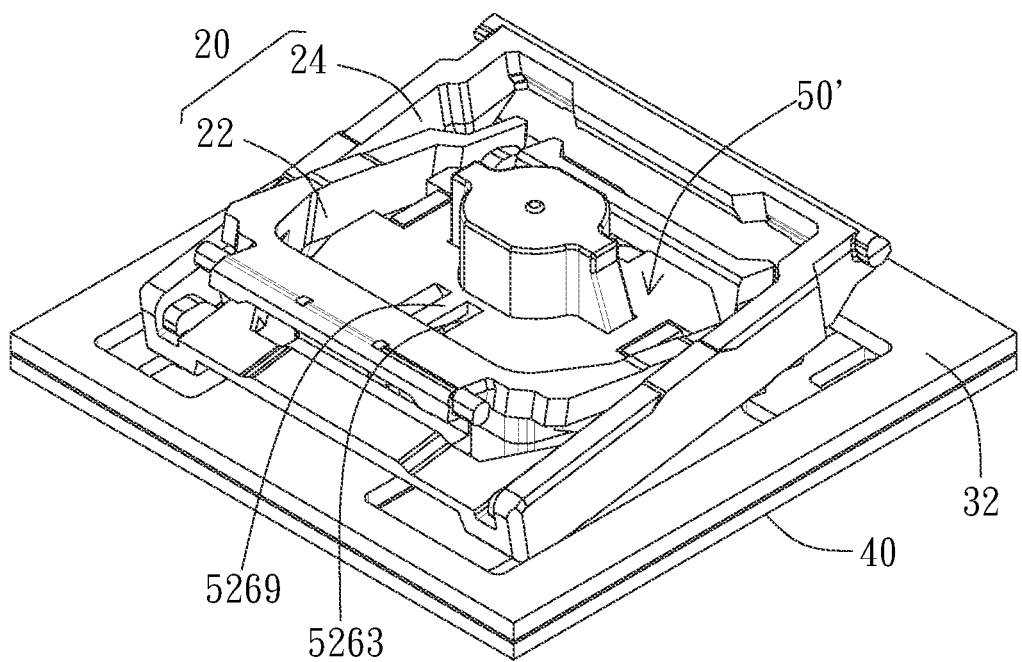
FIG. 9B is a schematic view of the optical keyswitch of FIG. 9A without the keycap.
Figure 9C:
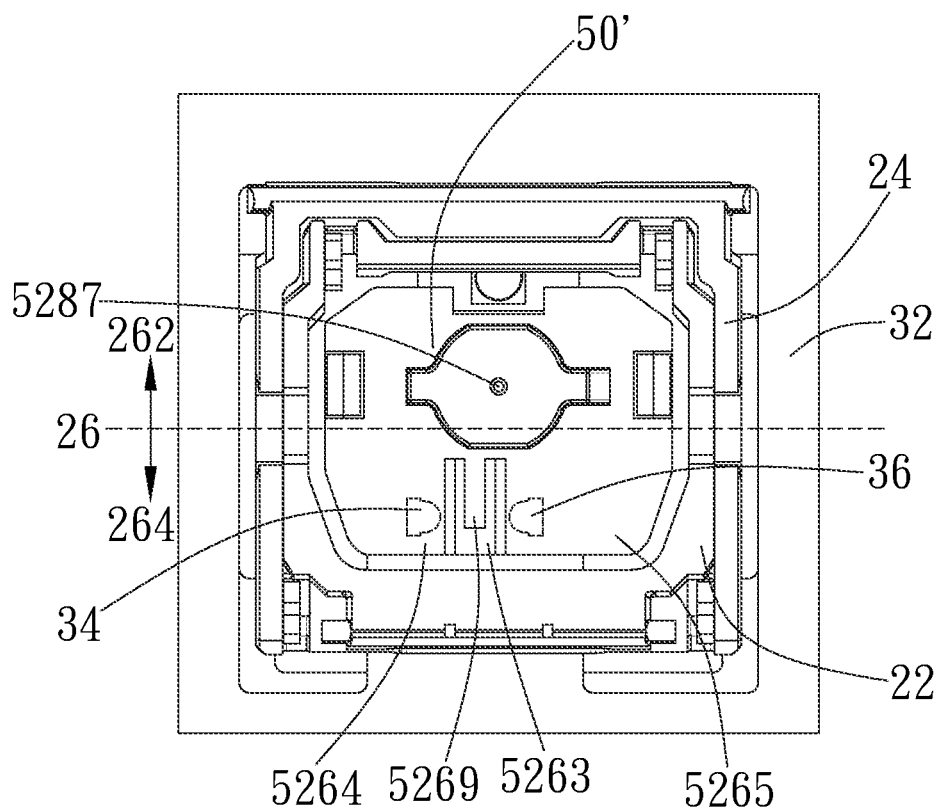
FIG. 9C is a top view of FIG. 9B.
Figure 9D:
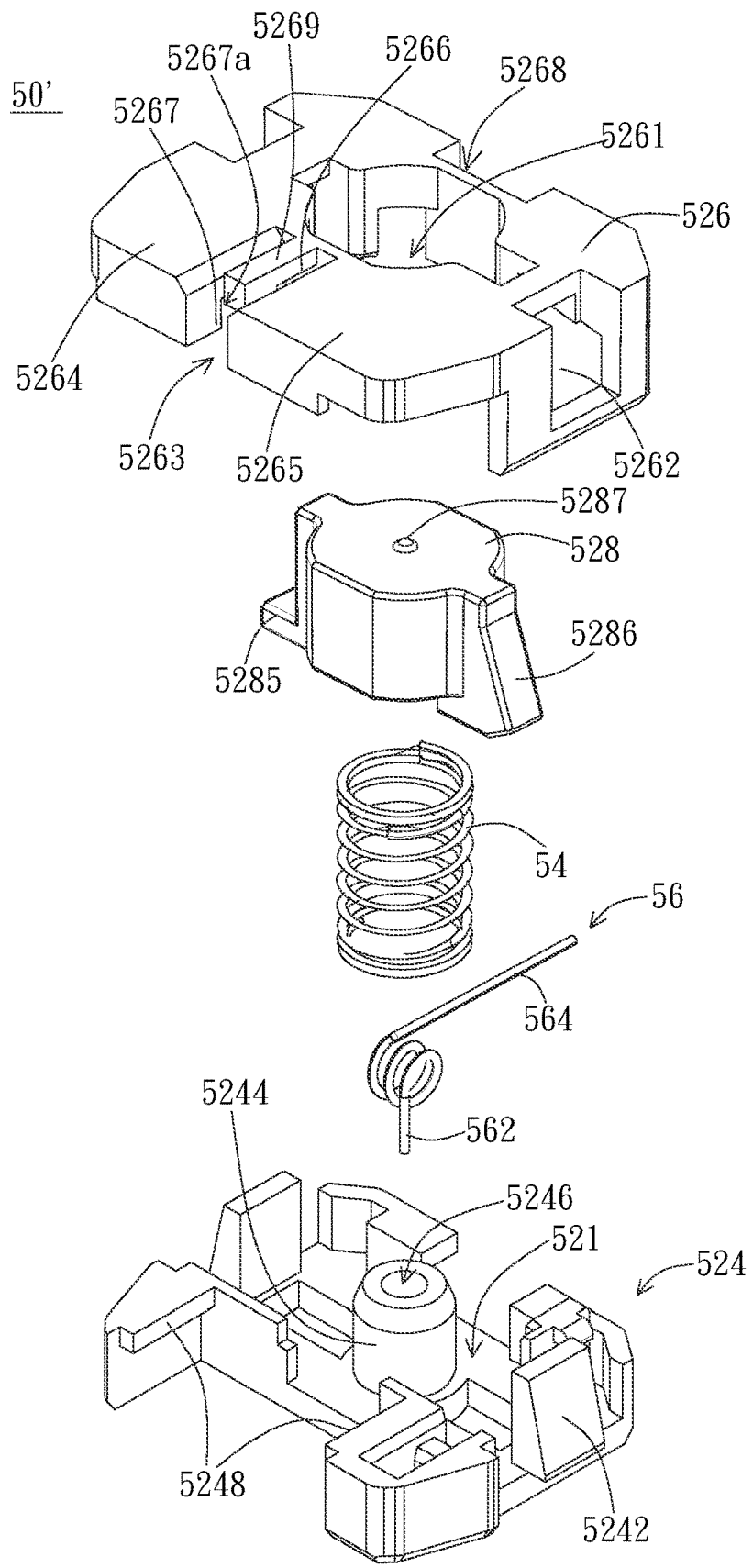
FIG. 9D is an exploded view of the restoring mechanism of FIG. 9A.

FIG. 9A is an exploded view of a third embodiment of the optical keyswitch of the invention. FIG. 9B is a schematic view of the optical keyswitch of FIG. 9A without the keycap. FIG. 9C is a top view of FIG. 9B. FIG. 9D is an exploded view of the restoring mechanism of FIG. 9A. As shown in the figures, in the third embodiment, the optical keyswitch 3 includes a keycap 10", the support 20', the switch module 30, the baseplate 40, and a restoring mechanism 50'. The details of the support mechanism 20', the switch module 30, and the baseplate 40 can refer to the related descriptions of the first and second embodiments. Hereinafter, the difference between the third embodiment and the foregoing embodiments will be explained.

Specifically, the keycap 10" has a protrusion 111' extending downward from the lower surface of the keycap 10". In an embodiment, the protrusion 111' preferably has a tapered end portion with a sloped surface 1111 and a horizontal surface 1112. The restoring mechanism 50' is different from the restoring mechanism 50 of the first embodiment in that the upper casing 522' has a deformable portion 5269. The deformable portion 5269 extends from the upper casing 522' and corresponds to the protrusion 111'. For example, the deformable portion 5269 is a flexible protrusion extending from the upper casing body 526' to above the open region 5263. In other words, the deformable portion 5269 can be an L-shaped flexible arm, which extends from the upper side of the sidewall 5266 to horizontally above the open region 5263, so that the deformable portion 5269 is located between the left arm portion 5264 and the right arm portion 5265 of the upper casing body 526'. It is noted that the details of other portions (parts) of the restoring mechanism 50' can refer to the related descriptions of the restoring mechanism 50 of the first embodiment, and will not elaborate again.

Figure 10A:
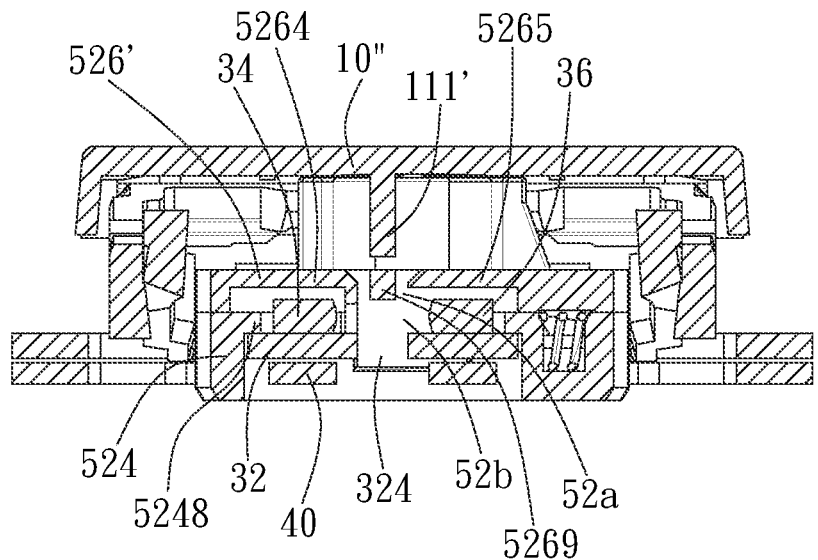
FIGS. 10A and 11A are cross-sectional views of the optical keyswitch of the third embodiment of the invention along the X axis at the non-pressed position and the triggering position, respectively.
Figure 10B:
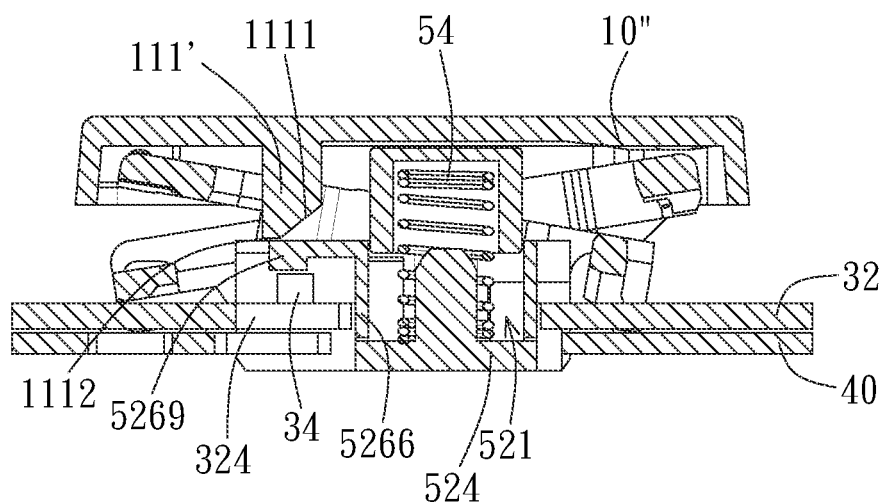
FIGS. 10B and 11B are cross-sectional views of the optical keyswitch of the third embodiment of the invention along the Y axis at the non-pressed position and the triggering position, respectively.
Figure 11A:
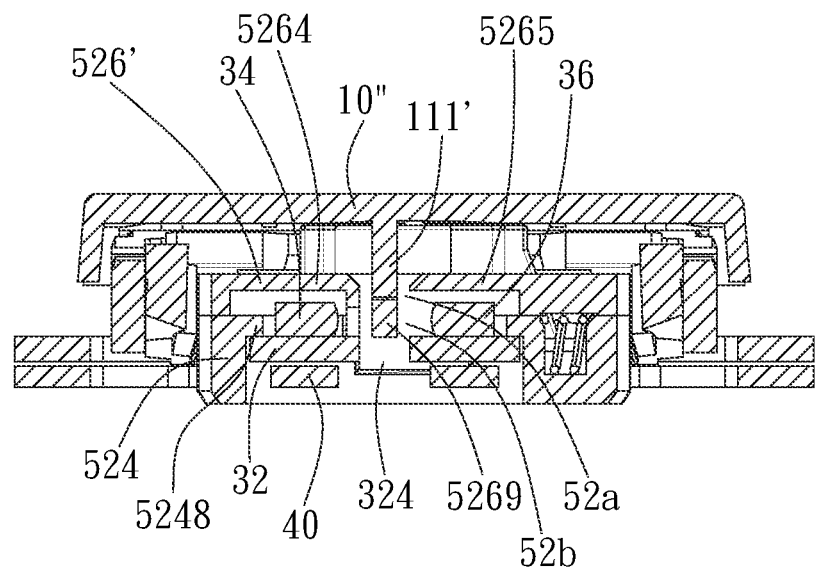
Figure 11B:
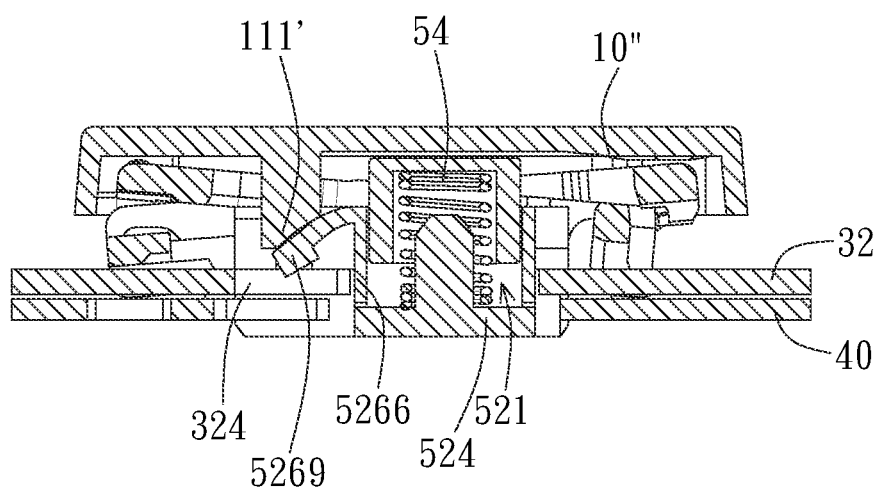

Referring to FIGS. 10A to 11B, the operation of the optical keyswitch of the third embodiment will be illustrated. FIGS. 10A and 11A are cross-sectional views of the optical keyswitch of the third embodiment of the invention along the X axis at the non-pressed position and the triggering position, respectively. FIGS. 10B and 11B are cross-sectional views of the optical keyswitch of the third embodiment of the invention along the Y axis at the non-pressed position and the triggering position, respectively. As shown in FIGS. 10A and 10B, when the keycap 10" is not pressed, the protrusion 111' of the keycap 10" is located correspondingly above the deformable portion 5269. The horizontal surface 1112 of the protrusion 111' is preferably parallel to the surface of the deformable portion 5269, and the sloped surface 1111 inclined upward from the horizontal surface 1112 toward the sidewall 5266, so that the vertical projection of the sloped surface 1111 on the deformable portion 5269 overlaps the deformable portion 5269. The protrusion 111' and the deformable portion 5269 are away from the intensity adjustment space 52b and do not influence the intensity of the optical signal received by the receiver 36.

As shown in FIGS. 11A and 11B, when the keycap 10" is pressed, the protrusion 111' moves downward along with the keycap 10", the protrusion 111' presses against the deformable portion 5269, and the deformable portion 5269 is bent to at least partially block the optical signal, so the second intensity is smaller than the first intensity. Specifically, when the keycap 10" is pressed, the protrusion 111' moves downward along with the keycap 10", and the horizontal surface 1112 presses against the deformable portion 5269, so that the deformable portion 5269 deforms downward along the sloped surface 1111, and the optical signal is at least partially blocked by the deformable portion 5269 and the protrusion 111' (or merely by the deformable portion 5269) to trigger the switch module 30 generating the triggering signal. It is noted that length of the protrusion 111' of this embodiment can be smaller than that of the protrusion 111 of the keycap 10, so that the outer appearance of the keycap can be improved by reducing the possibility of generating dimple at the corresponding upper surface of the protrusion when the keycap is injection molded.

Figure 12A:
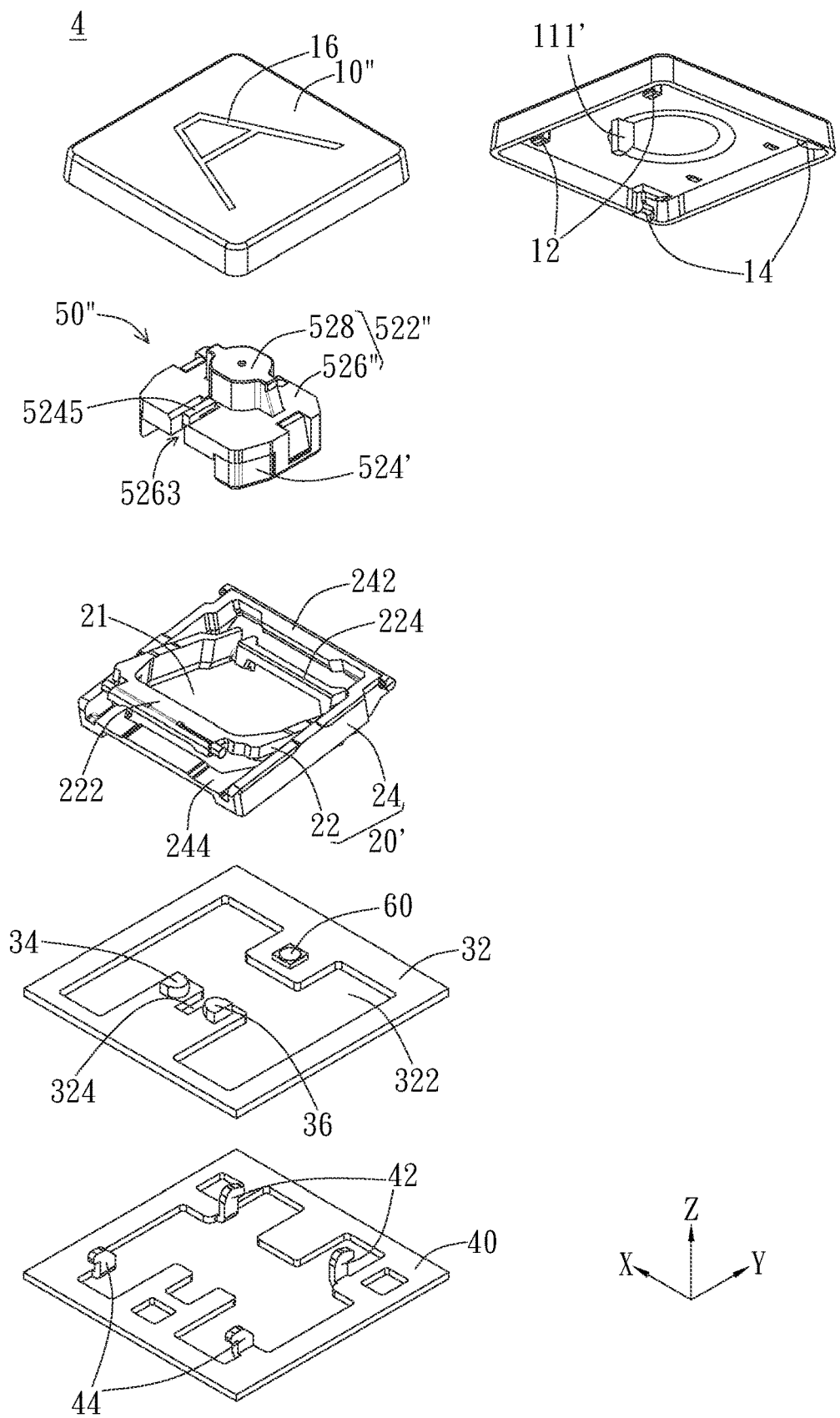
FIG. 12A is an exploded view of a fourth embodiment of the optical keyswitch of the invention.
Figure 12B:
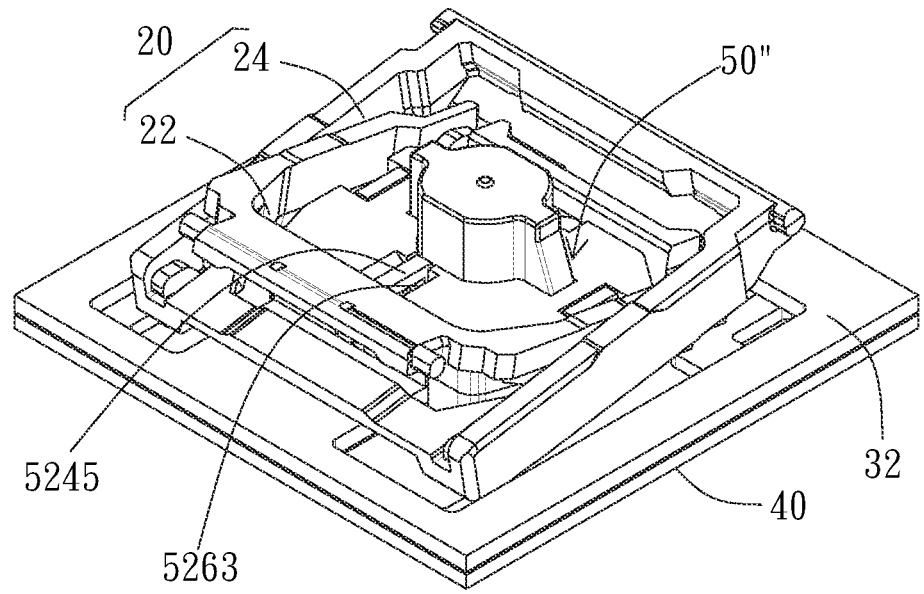
FIG. 12B is a schematic view of the optical keyswitch of FIG. 12A without the keycap.
Figure 12C:
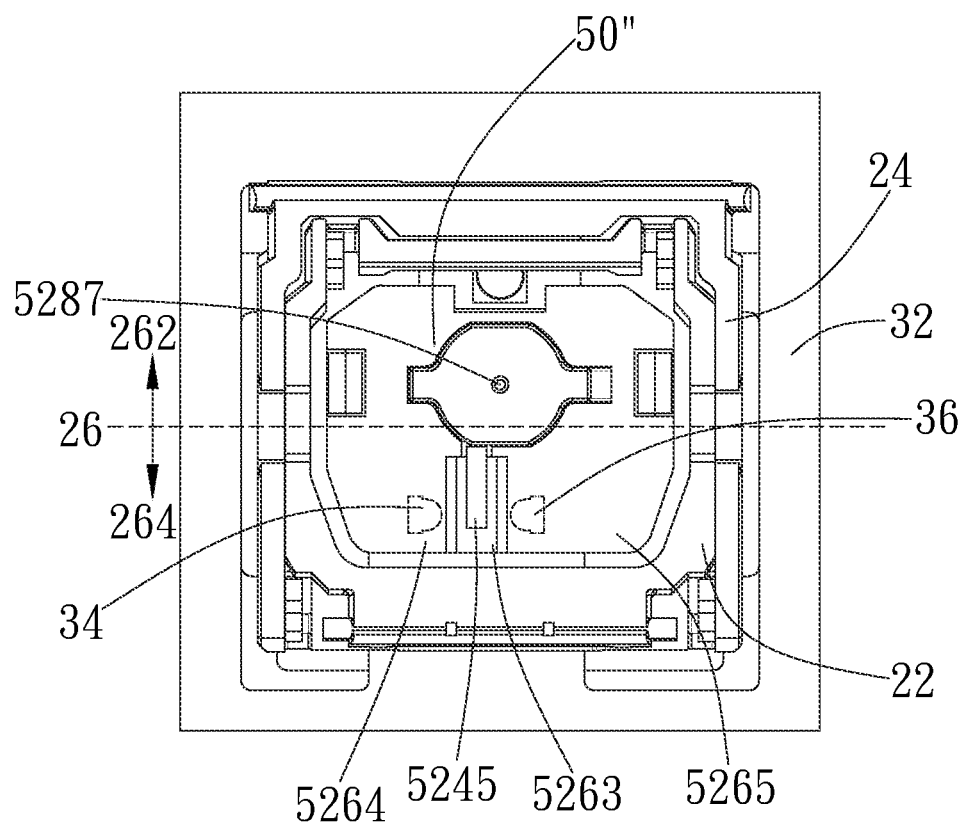
FIG. 12C is a top view of FIG. 12B.
Figure 12D:
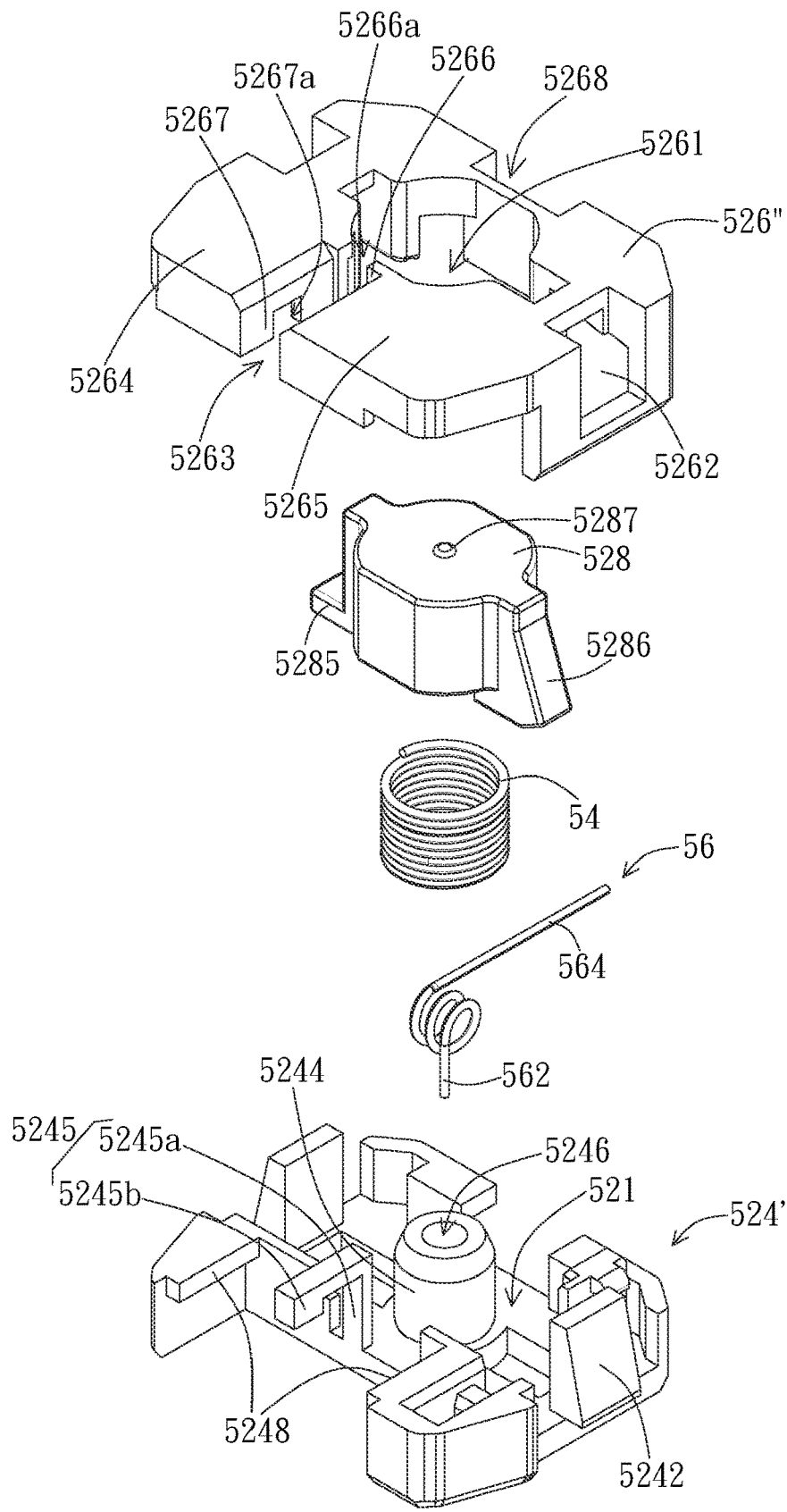
FIG. 12D is an exploded view of the restoring mechanism of FIG. 12A.

FIGS. 12A to 14B are schematic views of a fourth embodiment of the invention, wherein FIG. 12A is an exploded view of the optical keyswitch of the invention, FIG. 12B is a schematic view of the optical keyswitch of FIG. 12A without the keycap, FIG. 12C is a top view of FIG. 12B, and FIG. 12D is an exploded view of the restoring mechanism of FIG. 12A. As shown in the figures, in the fourth embodiment, the optical keyswitch 4 includes the keycap 10", the support mechanism 20', the switch module 30, the baseplate 40, and a restoring mechanism 50". The details of the keycap 10", the support mechanism 20', the switch module 30, and the baseplate 40 can refer to the related descriptions of the first to third embodiments. Hereinafter, the difference between the fourth embodiment and the foregoing embodiments will be explained.

Specifically, the restoring mechanism 50" is different from the restoring mechanism 50 in that the lower casing has a deformable portion 5245. The deformable portion 5245 extends from the lower casing 524' toward the upper casing 522" corresponding to the protrusion 111'. The deformable portion 5245 includes a vertical portion 5245a extending from the lower casing 524' toward the upper casing 522" and a horizontal portion 5245b extending horizontally from the vertical portion 5245a to above the open region 5263, so that the deformable portion 5245 has an "L" shape. In response to the deformable portion 5245, the upper casing body 526" preferably has a channel 5266a formed in the sidewall 5266. The channel 5266a corresponds to the vertical portion 5245a and allows the vertical portion 5245a to extend therethrough. As such, the deformable portion 5245 is located between the left arm portion 5264 and the right arm portion 5265 of the upper casing body 526". The vertical portion 5245a is located in the channel 5266a of the sidewall 5266 and forms an isolation wall together with the sidewall 5266 to separate the accommodation space 521 from the up-down path 52a (and the intensity adjustment space 52b). It is noted that the details of other portions (parts) of the restoring mechanism 50" can refer to the related descriptions of the restoring mechanism 50 of the first embodiment, and will not elaborate again.

Figure 13A:
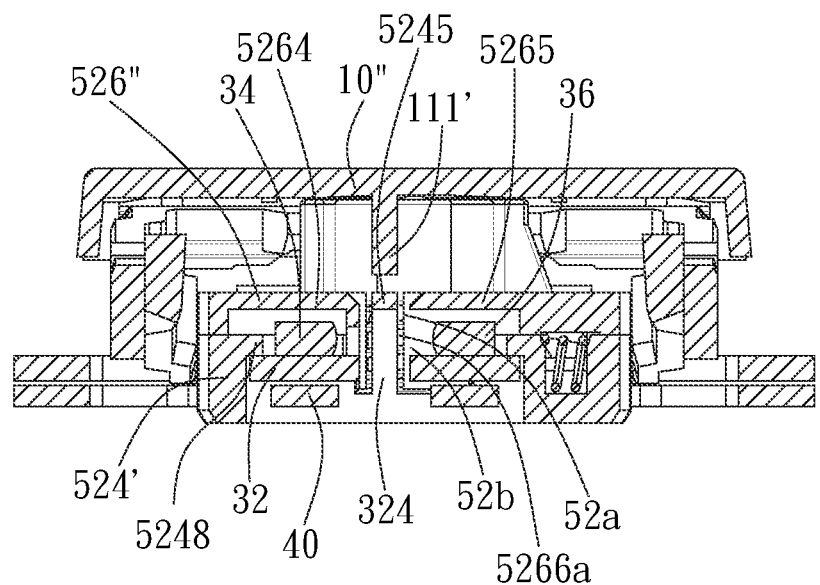
FIGS. 13A and 14A are cross-sectional views of the optical keyswitch of the fourth embodiment of the invention along the X axis at the non-pressed position and the triggering position, respectively.
Figure 13B:
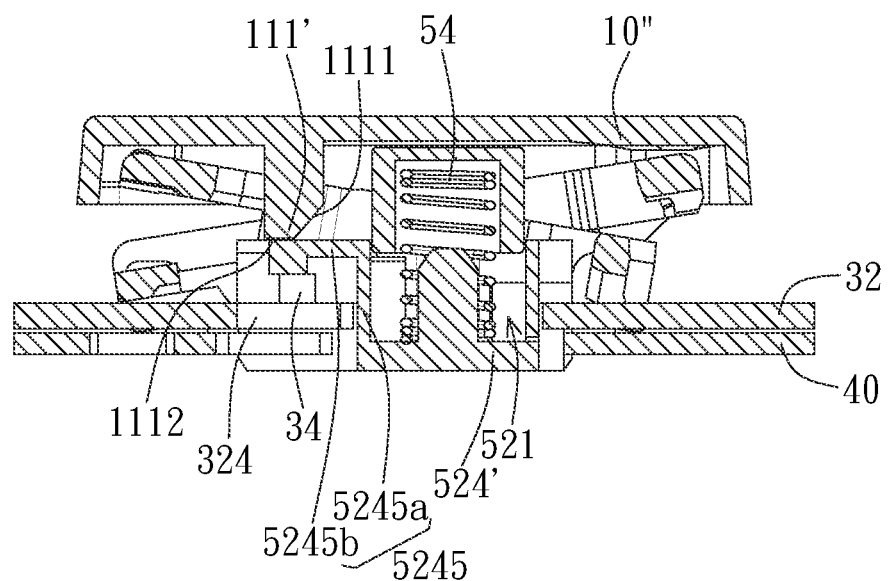
FIGS. 13B and 14B are cross-sectional views of the optical keyswitch of the fourth embodiment of the invention along the Y axis at the non-pressed position and the triggering position, respectively.

Referring to FIGS. 13A to 14B, the operation of the optical keyswitch 4 of the fourth embodiment will be illustrated. FIGS. 13A and 14A are cross-sectional views of the optical keyswitch along the X axis at the non-pressed position and the triggering position, respectively. FIGS. 13B and 13B are cross-sectional views of the optical keyswitch along the Y axis at the non-pressed position and the triggering position, respectively. As shown in FIGS. 13A and 13B, when the keycap 10" is not pressed, the protrusion 111' of the keycap 10" is located correspondingly above the deformable portion 5245. The horizontal surface 1112 of the protrusion 111' is preferably parallel to the horizontal portion 5245b of the deformable portion 5245, and the sloped surface 1111 inclines upward from the horizontal surface 1112 toward the sidewall 5266, so that the vertical projection of the sloped surface 1111 on the deformable portion 5245 overlaps the deformable portion 5245. The protrusion 111' and the deformable portion 5245 are away from the intensity adjustment space 52b and do not influence the intensity of the optical signal received by the receiver 36.

Figure 14A:
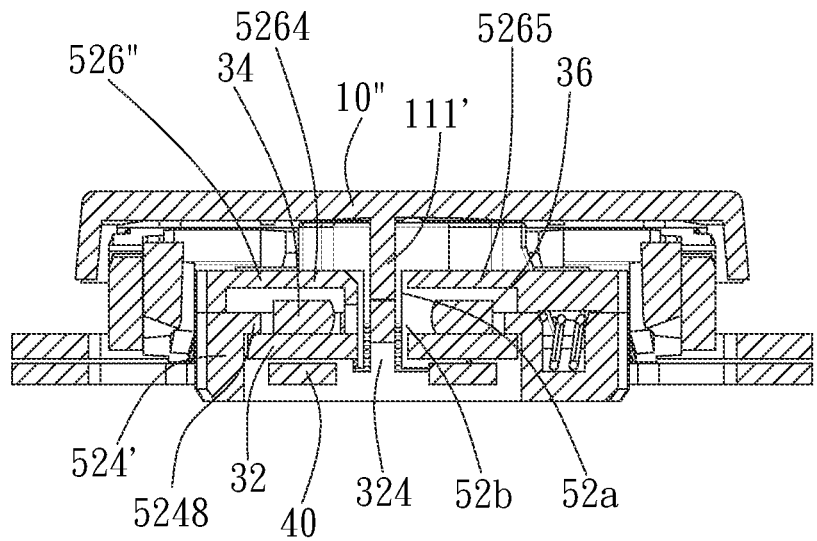
Figure 14B:
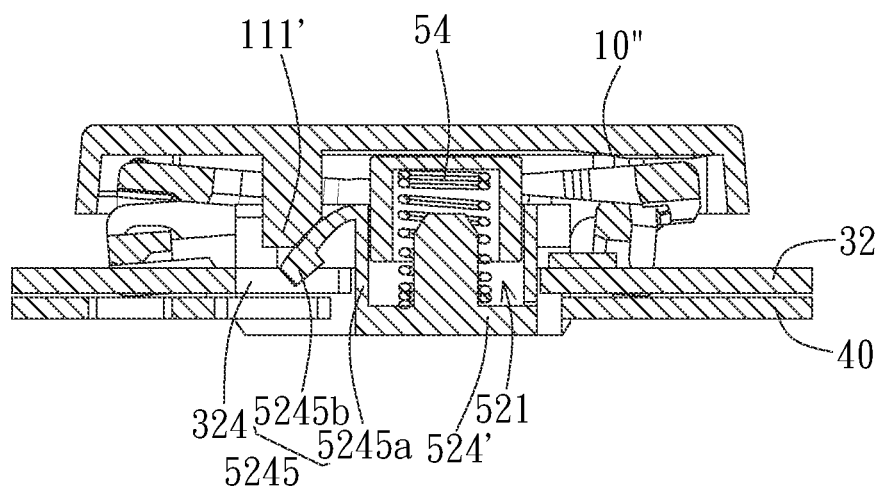

As shown in FIGS. 14A and 14B, when the keycap 10" is pressed, the protrusion 111' moves downward along with the keycap 10". The protrusion 111' presses against the deformable portion 5245, and the deformable portion 5245 is bent to at least partially block the optical signal, so the second intensity is smaller than the first intensity. Specifically, when the keycap 10" is pressed, the protrusion 111' moves downward along with the keycap 10" and the horizontal surface 1112 presses against the horizontal portion 5245b of the deformable portion 5245, so that the deformable portion 5245 deforms downward along the sloped surface 1111, and the optical signal is at least partially blocked by the deformable portion 5245 and the protrusion 111' (or merely by the deformable portion 5245) to trigger the switch module 30 to generate the triggering signal.

Figure 15A:
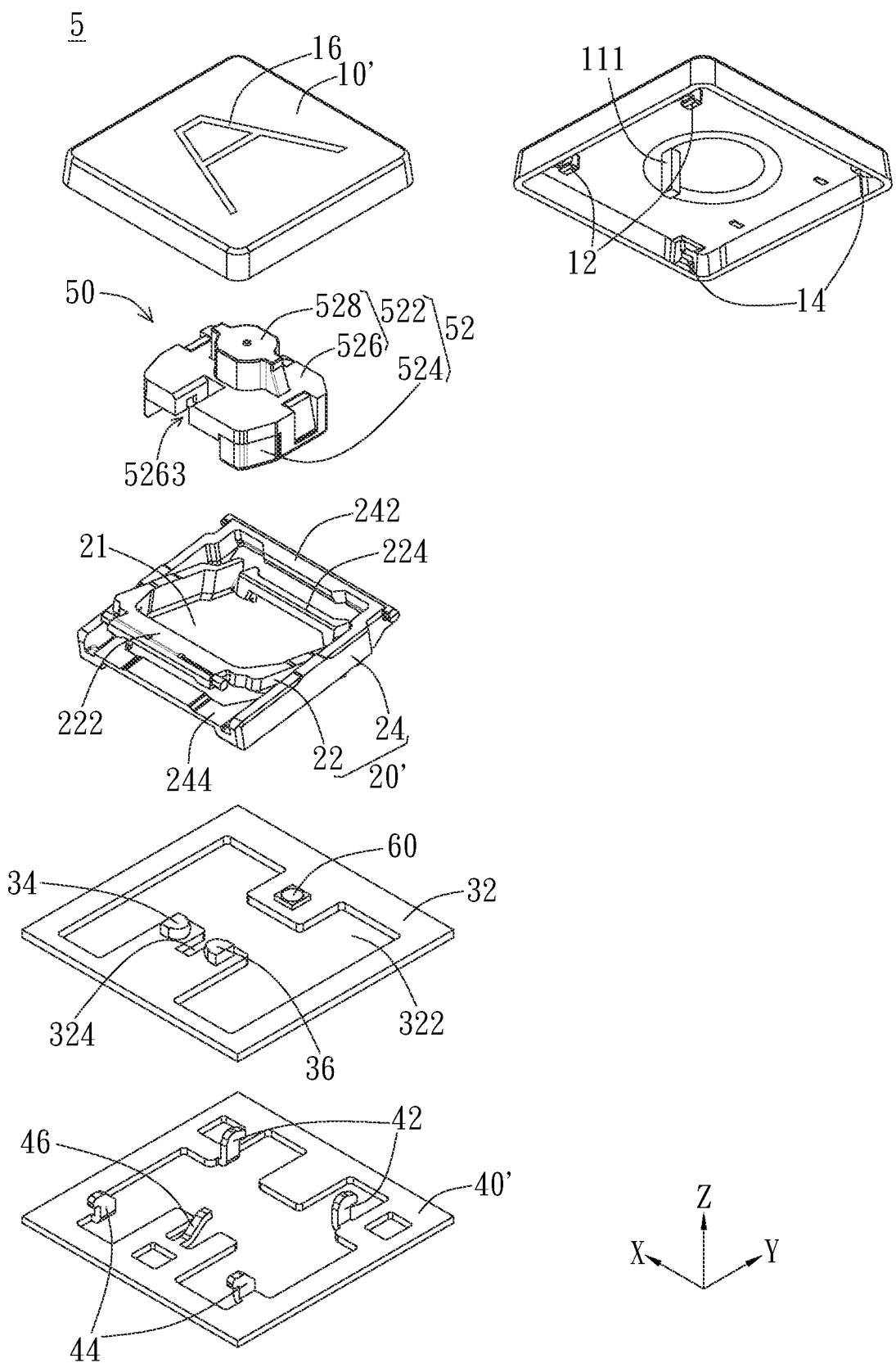
FIG. 15A is an exploded view of a fifth embodiment of the optical keyswitch of the invention.
Figure 15B:
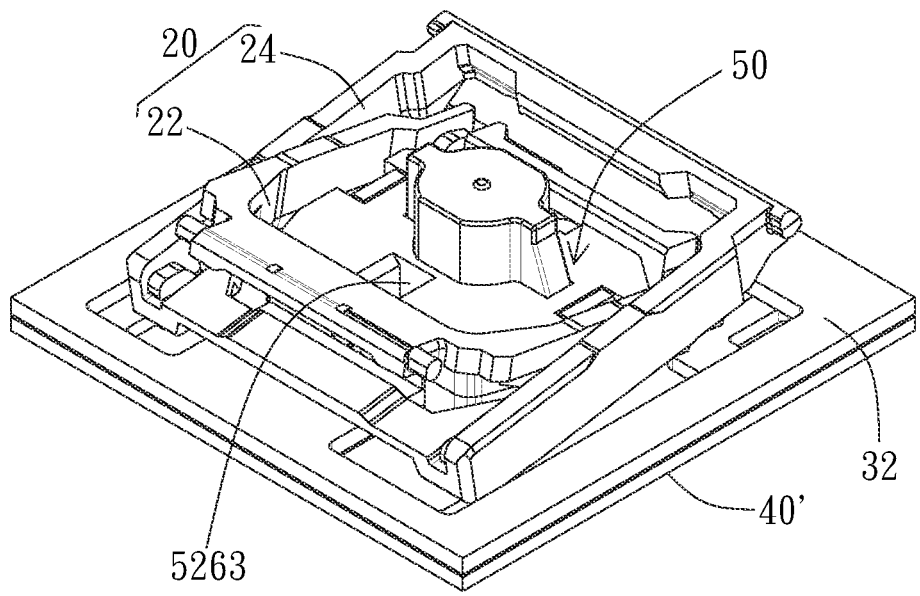
FIG. 15B is a schematic view of the optical keyswitch of FIG. 15A without the keycap.
Figure 15C:
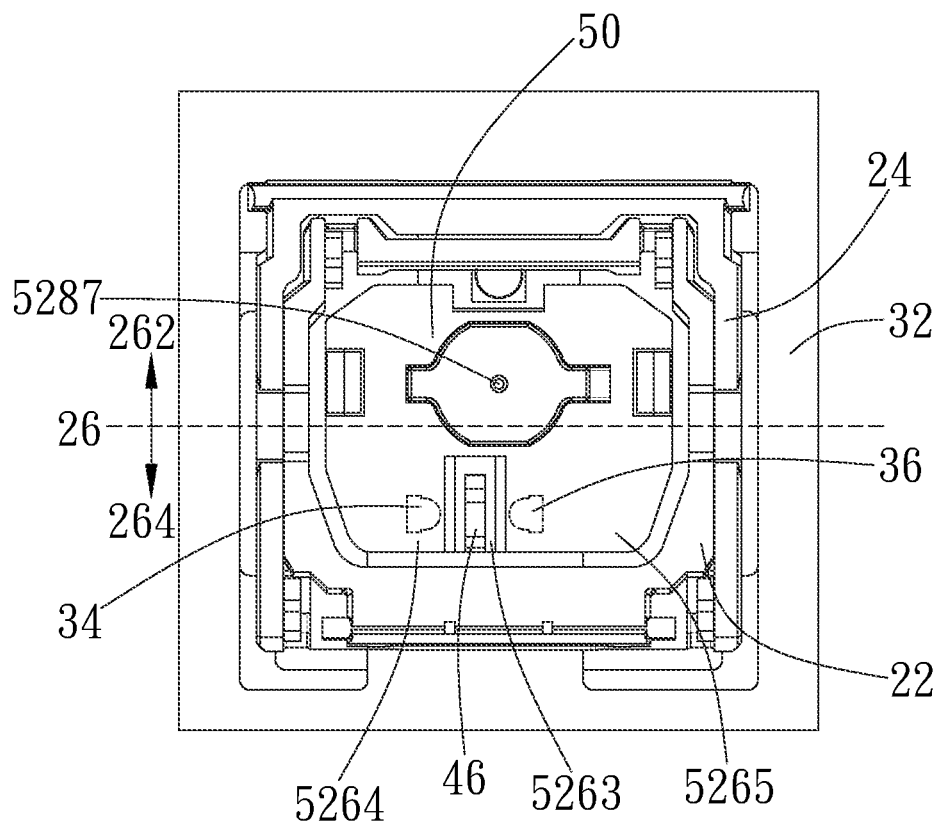
FIG. 15C is a top view of FIG. 15B.

FIGS. 15A to 17B illustrate schematic views of a fifth embodiment of the invention, wherein FIG. 15A is an exploded view of the fifth embodiment of the optical keyswitch of the invention, FIG. 15B is a schematic view of the optical keyswitch of FIG. 15A without the keycap, and FIG. 15C is a top view of FIG. 15B. As shown in the figures, in the fifth embodiment, the optical keyswitch 5 includes the keycap 10', the support mechanism 20', the switch module 30, a baseplate 40', and the restoring mechanism 50. The details of the keycap 10', the support mechanism 20', the switch module 30, and the restoring mechanism 50 can refer to the related descriptions of the first to fourth embodiments. Hereinafter, the difference between the fifth embodiment and the foregoing embodiments will be explained.

Specifically, the protrusion 111 extends from the lower surface of the keycap 10', and the baseplate 40' has an extension portion 46. The extension portion 46 extends toward the keycap 10' and corresponds to the protrusion 111 to at least partially block the optical signal. In this embodiment, the up-down path 52a is preferably shifted from the intensity adjustment space 52b with respect to the moving direction of the protrusion 111, so that when the protrusion 111 moves in the up-down path 52a, the protrusion 111 will not enter the intensity adjustment space 52b and the intensity of the optical signal received by the receiver 36 will not be directly influenced by the protrusion 111. For example, the extension portion 46 can be an L-shaped flexible arm bending upward from the baseplate 40'. The extension portion 46 is preferably located between the left arm portion 5264 and the right ram portion 5265 and extends along the Y axis from the intensity adjustment space 52b to the up-down path 52a.

Figure 16A:
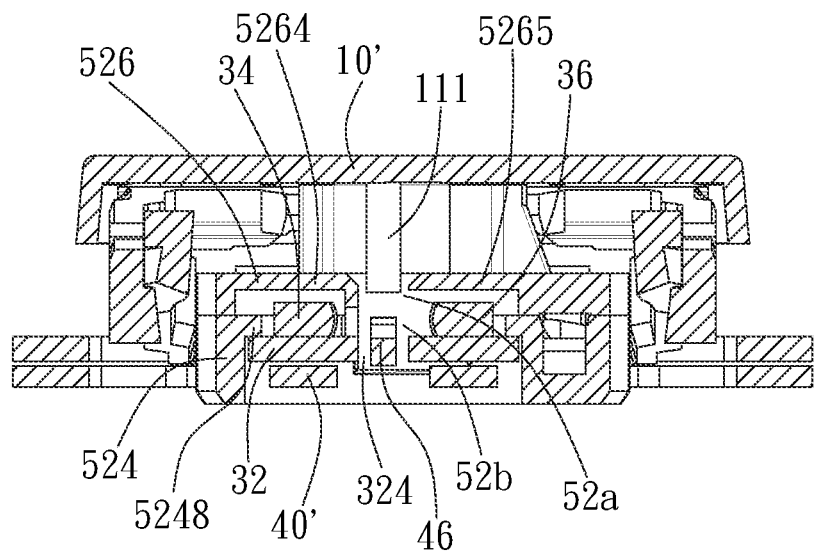
FIGS. 16A and 17A are cross-sectional views of the optical keyswitch of the fifth embodiment of the invention along the X axis at the non-pressed position and the triggering position, respectively.
Figure 16B:
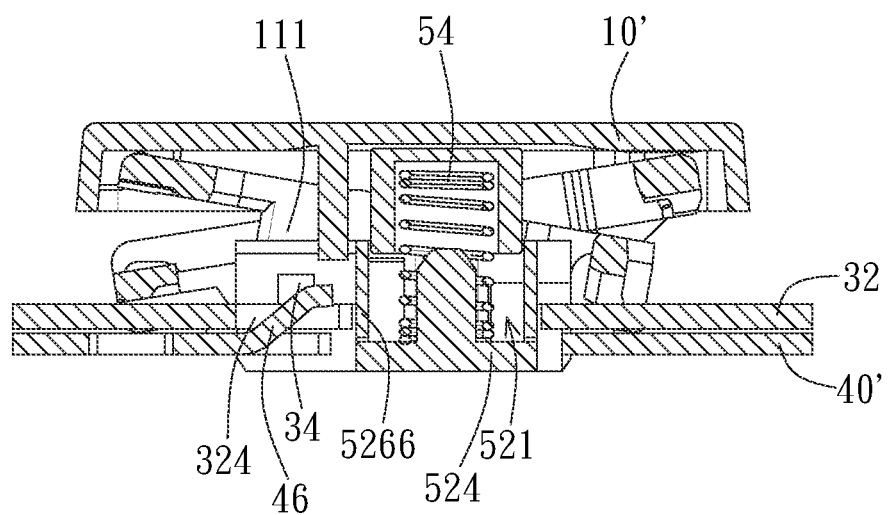
FIGS. 16B and 17B are cross-sectional views of the optical keyswitch of the fifth embodiment of the invention along the Y axis at the non-pressed position and the triggering position, respectively.
Figure 17A:
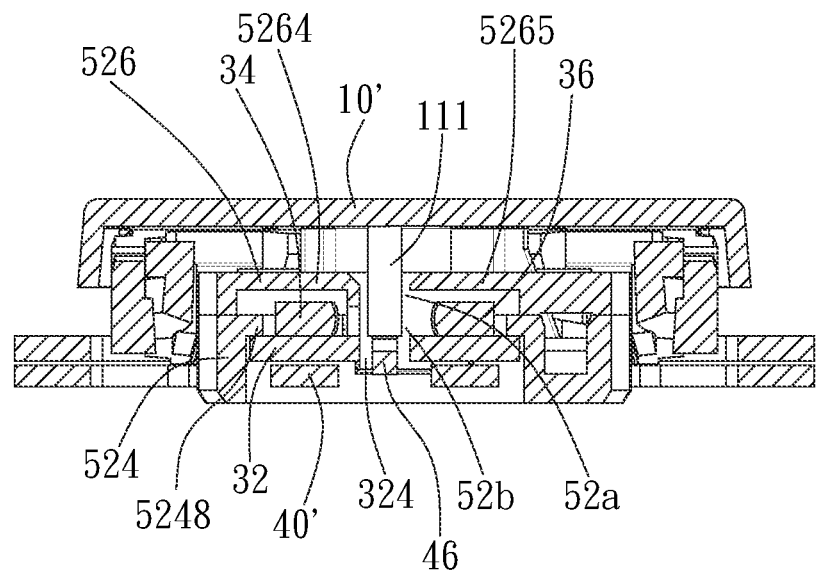
Figure 17B:
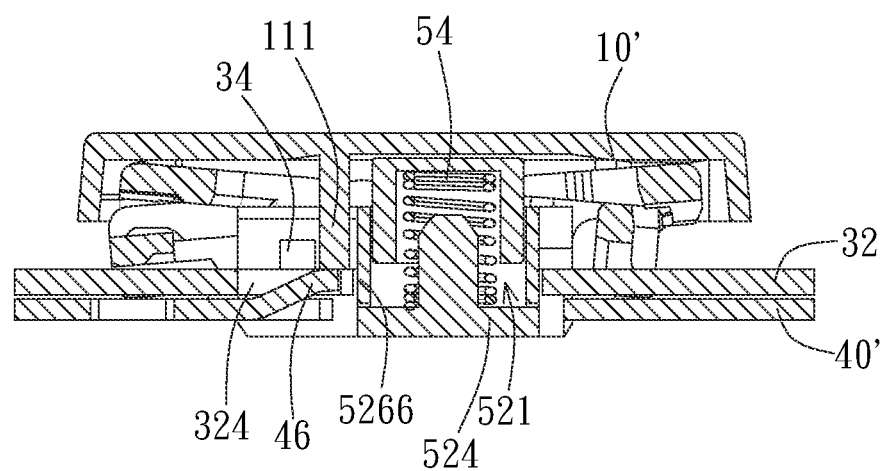

Referring to FIGS. 16A to 17B, the operation of the optical keyswitch 5 of the fifth embodiment will be illustrated. FIGS. 16A and 17A are cross-sectional views of the optical keyswitch along the X axis at the non-pressed position and the triggering position, respectively. FIGS. 16B and 17B are cross-sectional views of the optical keyswitch along the Y axis at the non-pressed position and the triggering position, respectively. As shown in FIGS. 16A and 16B, when the keycap 10' is not pressed, the extension portion 46 corresponding to the protrusion 111 extends toward the keycap 10' into the intensity adjustment space 52b to at least partially block the optical signal, and the distal end of the extension portion 46 extends into the up-down path 52a to correspond to the protrusion 111. The protrusion 111 of the keycap 10' is correspondingly located above the distal end of the extension portion 46, and the protrusion 111 is preferably disposed neighboring the sidewall 5266, so that the protrusion 111 will not influence the intensity of the optical signal received by the receiver 36.

As shown in FIGS. 17A and 17B, when the protrusion 111 is driven to move along with the keycap 10', the protrusion 111 presses against the extension portion 46, and the extension portion 46 deforms to avoid the optical signal, so the second intensity is greater than the first intensity, and the switch module 30 is triggered to generate the triggering signal. Specifically, when the keycap 10' is pressed, the protrusion 111 moves along with the keycap 10' downward in the up-down path 52a to press against the distal end of the extension portion 46, so that the extension portion 46 deforms and retreats from the intensity adjustment space 52b, and the intensity of the optical signal received by the receiver 36 is increased to trigger the switch module 30 to generate the triggering signal.

Figure 18A:
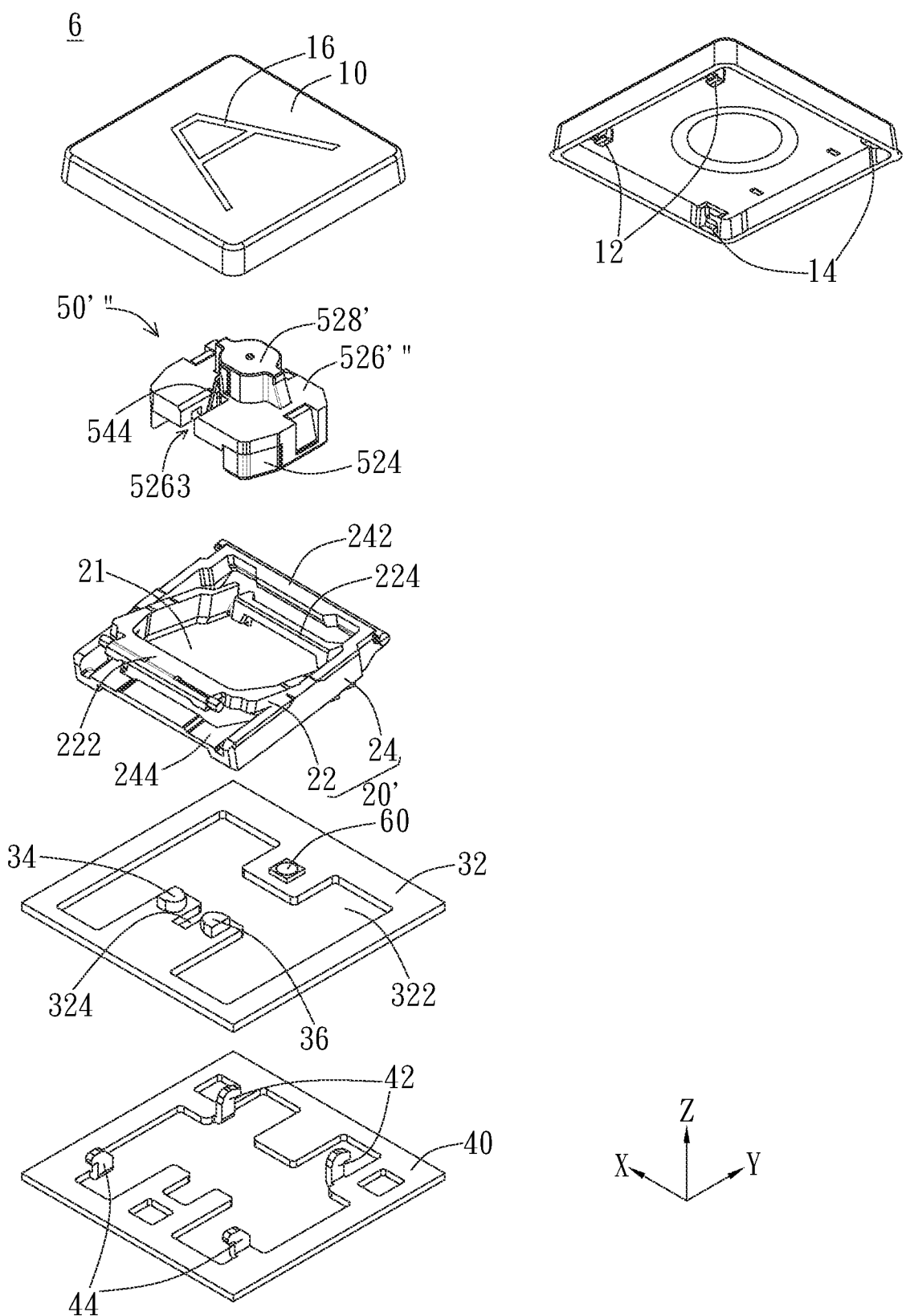
FIG. 18A is an exploded view of a sixth embodiment of the optical keyswitch of the invention.
Figure 18B:
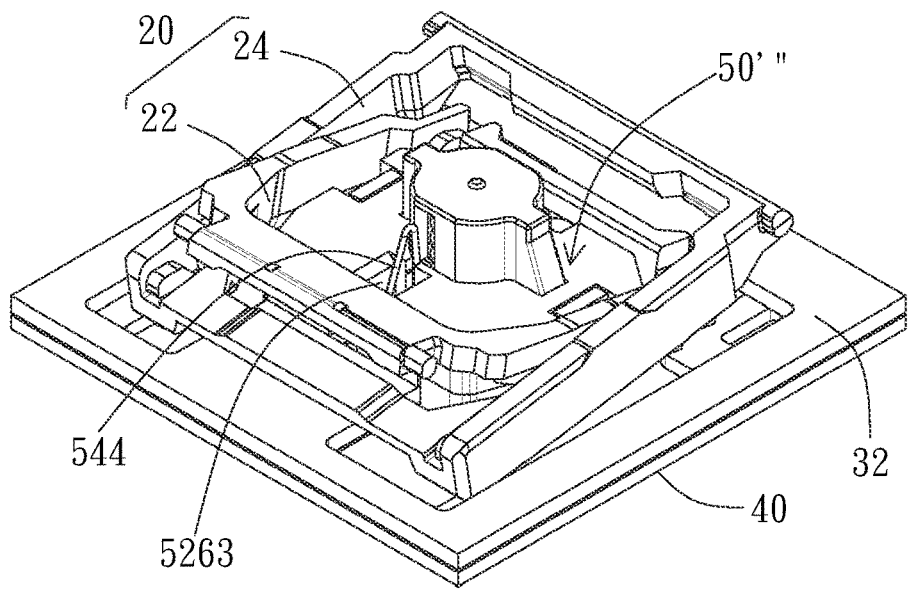
FIG. 18B is a schematic view of the optical keyswitch of FIG. 18A without the keycap.
Figure 18C:
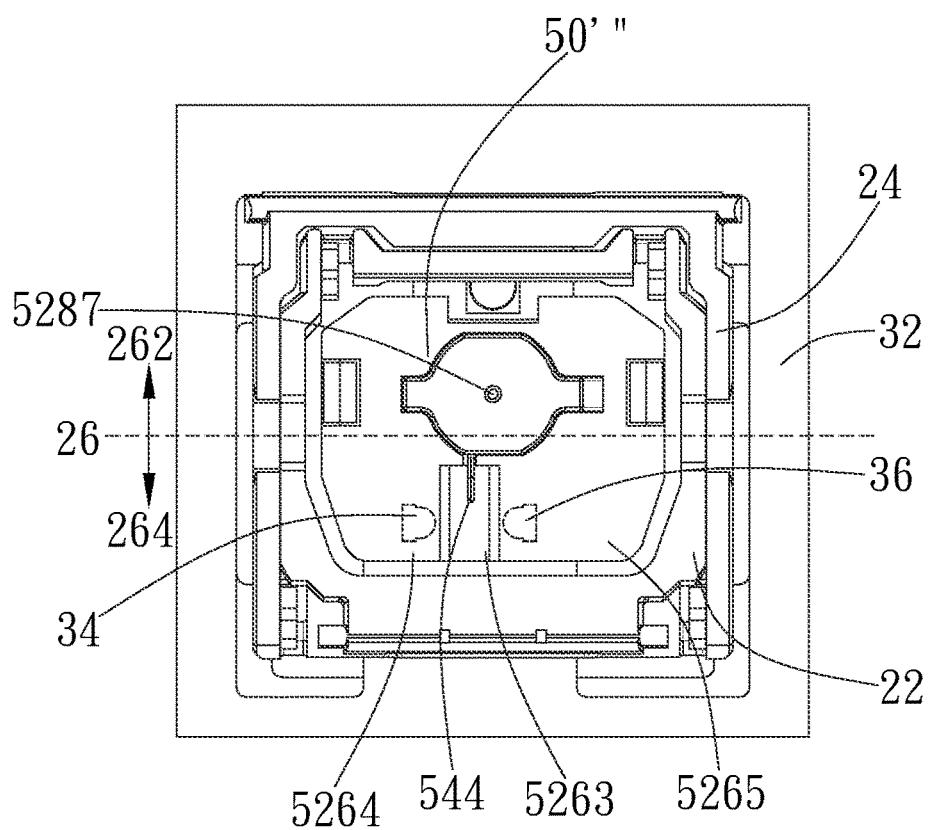
FIG. 18C is a top view of FIG. 18B.
Figure 18D:
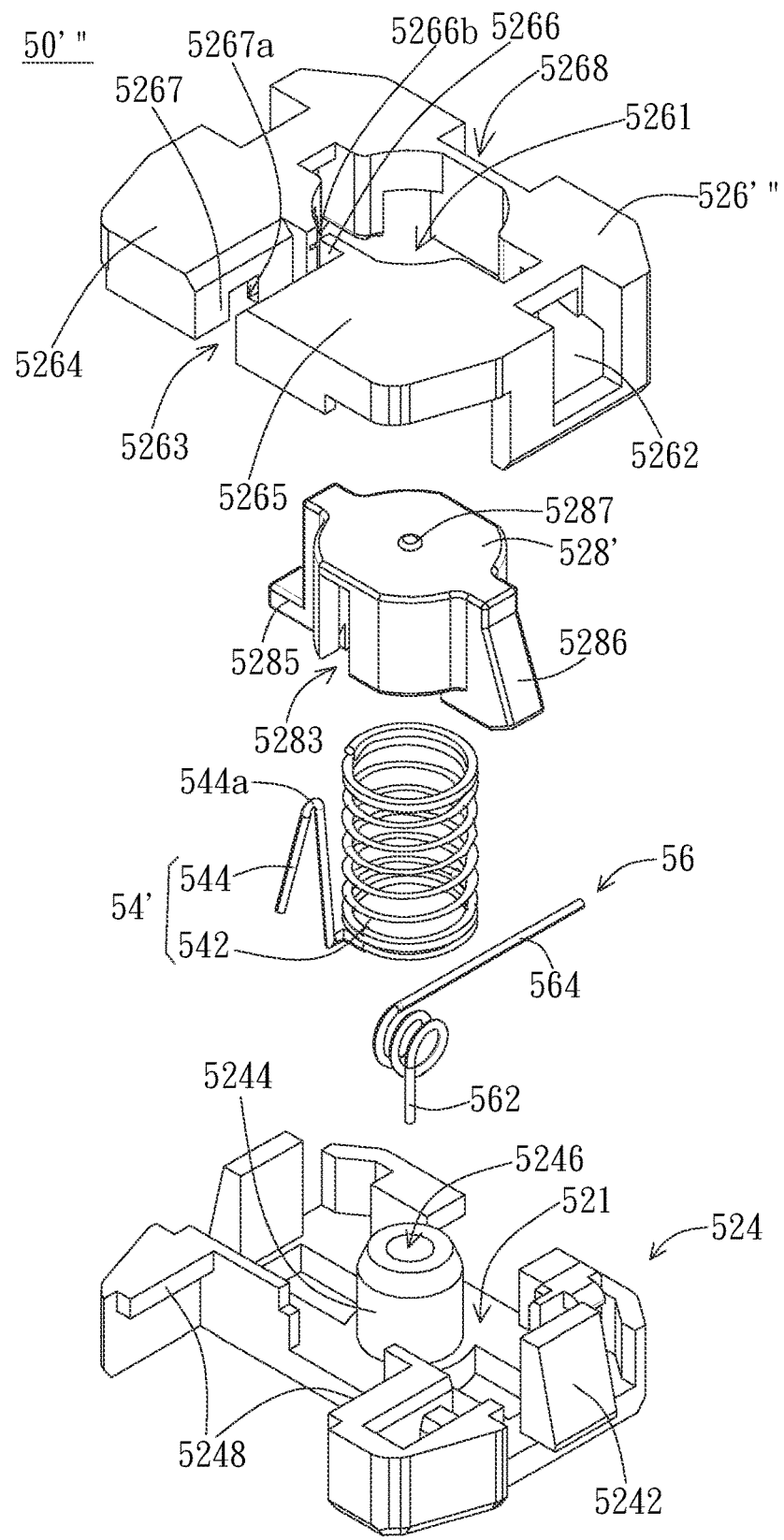
FIG. 18D is an exploded view of the restoring mechanism of FIG. 18A.
Figure 18E:
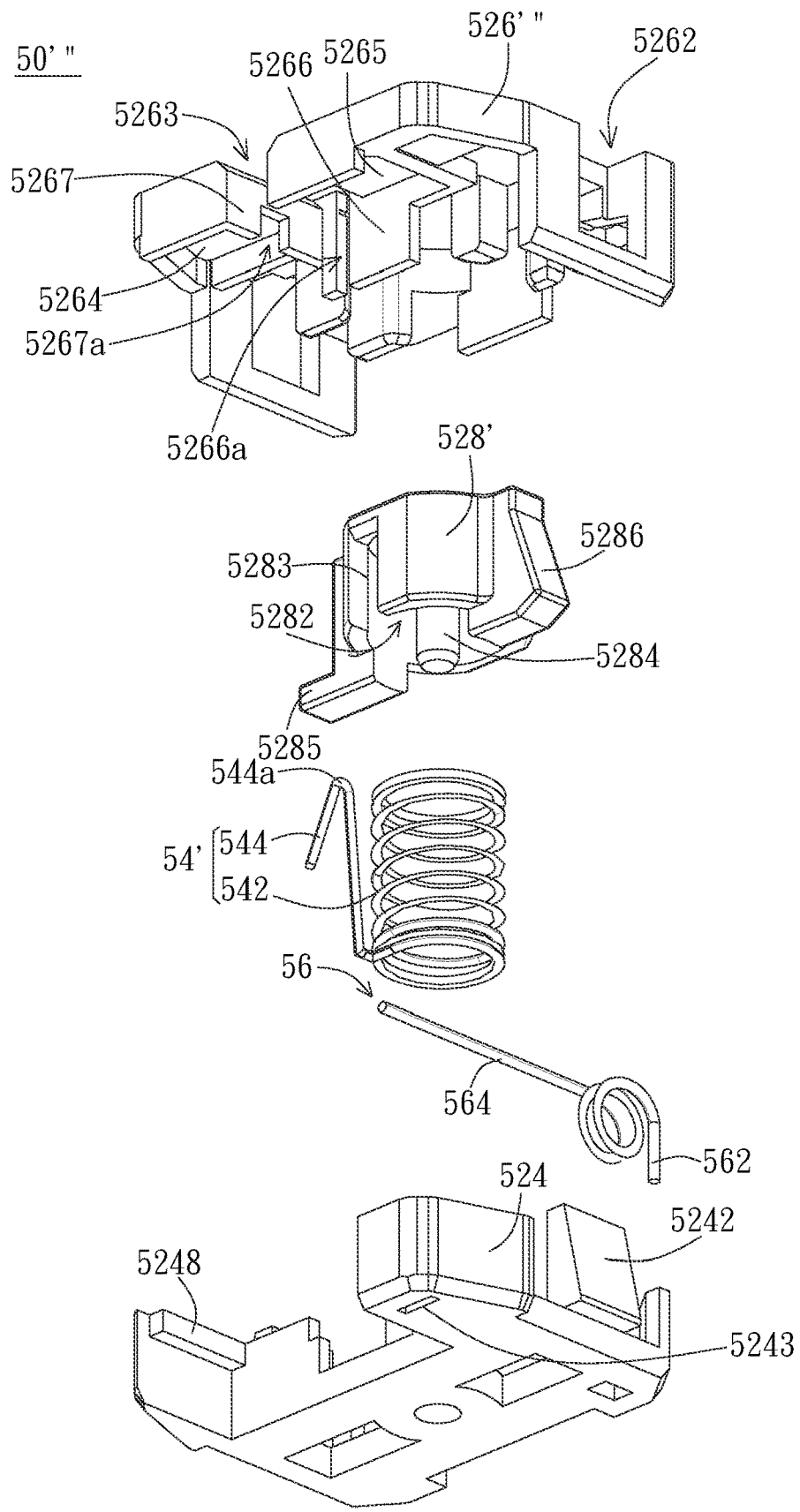
FIG. 18E is an exploded view of the restoring mechanism of FIG. 18A from a different viewing angle.

FIGS. 18A to 18E illustrate schematic views of a sixth embodiment of the invention, wherein FIG. 18A is an exploded view of the sixth embodiment of the optical keyswitch of the invention, FIG. 18B is a schematic view of the optical keyswitch of FIG. 18A without the keycap, FIG. 18C is a top view of FIG. 18B, and FIGS. 18D and 18E are exploded views of the restoring mechanism of FIG. 18A from different angles. As shown in the figures, in the sixth embodiment, the optical keyswitch 6 includes the keycap 10, the support mechanism 20', the switch module 30, and a restoring mechanism 50'''. The support mechanism 20' is disposed below the keycap 10 and configured to support the keycap 10 moving upward and downward. The switch module 30 includes the circuit board 32, the emitter 34, and the receiver 36. The emitter 34 and the receiver 36 are electrically connected to the circuit board 32. The emitter 34 emits an optical signal to the receiver 36. The restoring mechanism 50''' is disposed below the keycap 10 and configured to provide a restoring force to enable the keycap 10 to return to a non-pressed position. The restoring mechanism 50''' includes a resilient member 54'. The resilient member 54' includes a spring portion 542 and an extension portion 544 extending from the spring portion 542 toward the keycap 10. When the keycap 10 is pressed, the keycap 10 presses against the extension portion 544, and the extension portion 544 deforms to at least partially block the optical signal, so the switch module 30 is triggered to generate a triggering signal.

It is noted that the details of the keycap 10, the support mechanism 20', the switch module 30, and the baseplate 40 can refer to the related descriptions of the first to fifth embodiments. Hereinafter, the difference between the restoring mechanism 50''' of the sixth embodiment and the restoring mechanism 50 will be explained. In this embodiment, the spring portion 542 is disposed in the accommodation space 521 of the casing 52'', and the extension portion 544 protrudes outside the accommodation space 521. Specifically, the upper casing body 526''' preferably has a trough 5266b on the sidewall 5266 corresponding to the extension portion 544, so that the extension portion 544 passes through the trough 5266b and is exposed outside the casing 52'''. The extension portion 544 preferably has a bending section 544a, which is configured to be pressed by the keycap 10. Moreover, corresponding to the extension portion 544, the movable part 528' has an opening 5283 on the sidewall. When the movable part 528' moves up and down, the extension portion 544 moves relatively in the opening 5283. In other words, the opening 5283 of the movable part 528', the trough 5266b of the upper casing body 526''', and the open region 5263 are preferably aligned and communicate to each other without obstructing the movement of the movable part 528' and the deformation of the extension portion 544. The details of other components or parts of the restoring mechanism, 50''' can refer to related descriptions of the foregoing embodiments.

Figure 19A:
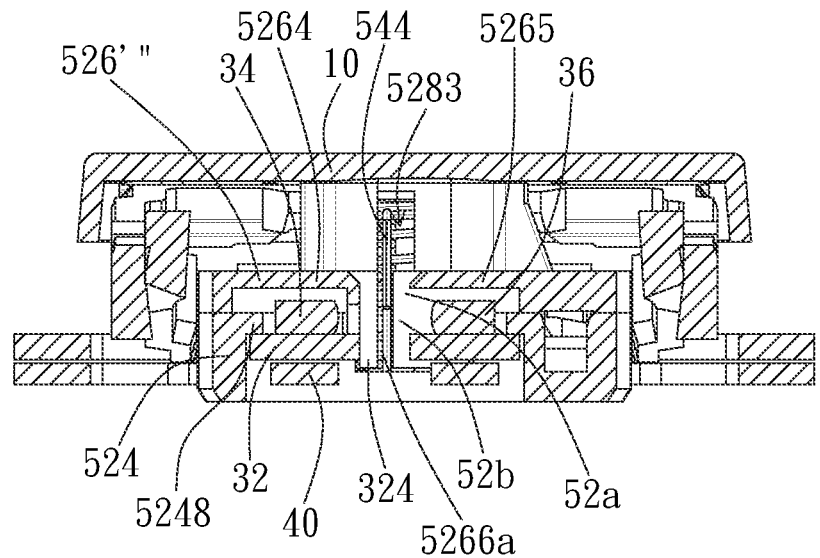
FIGS. 19A and 20A are cross-sectional views of the optical keyswitch of the sixth embodiment of the invention along the X axis at the non-pressed position and the triggering position, respectively.
Figure 19B:
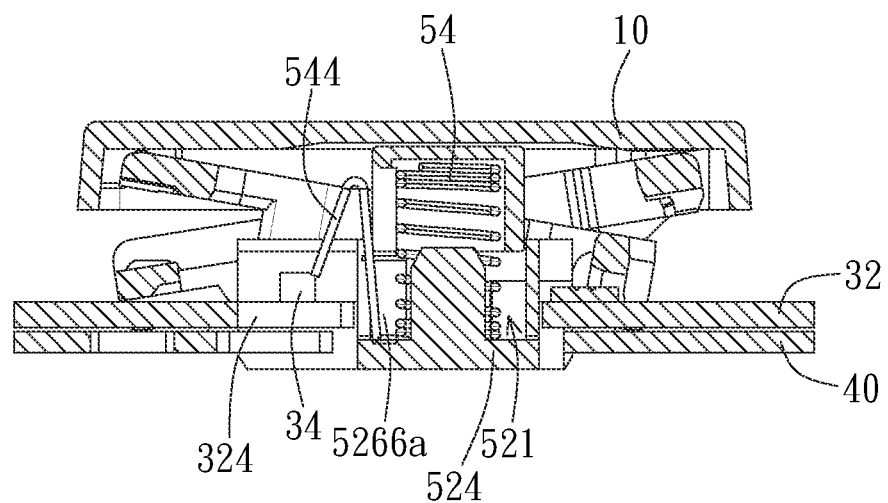
FIGS. 19B and 20B are cross-sectional views of the optical keyswitch of the sixth embodiment of the invention along the Y axis at the non-pressed position and the triggering position, respectively.
Figure 20A:
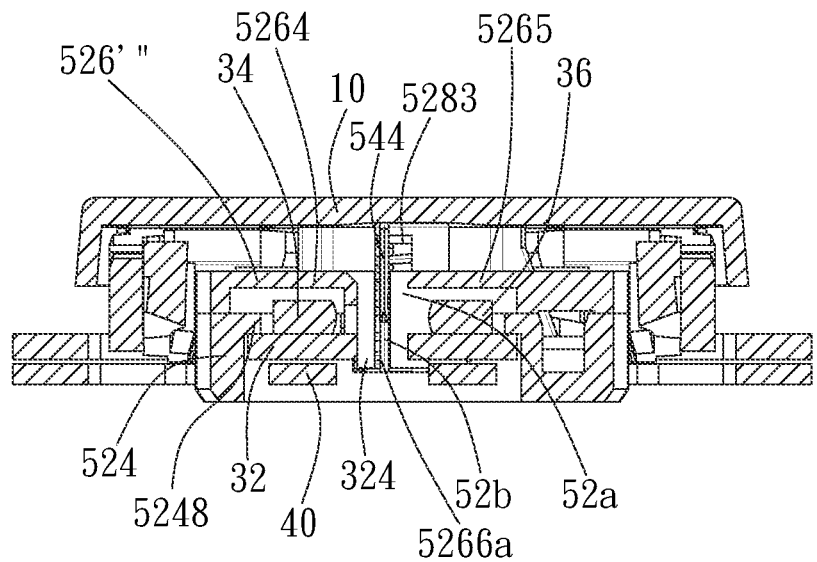
Figure 20B:
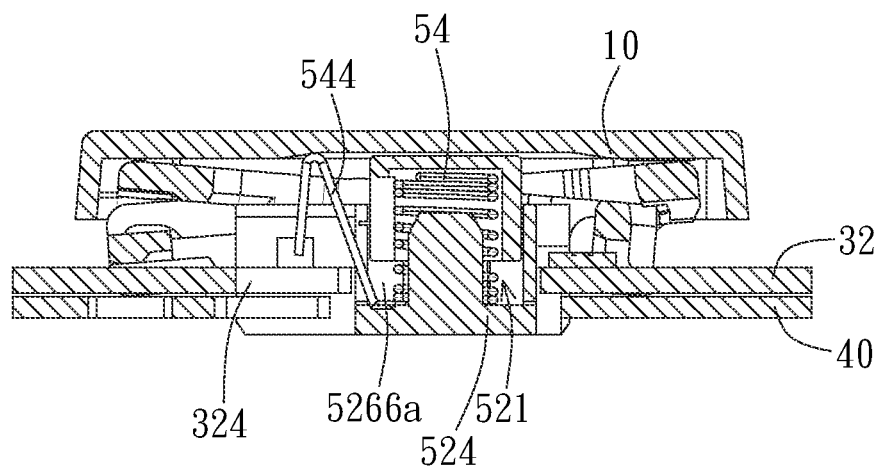

Referring to FIGS. 19A to 20B, the operation of the optical keyswitch 6 of the sixth embodiment will be illustrated. FIGS. 19A and 20A are cross-sectional views of the optical keyswitch of the sixth embodiment along the X axis at the non-pressed position and the triggering position, respectively. FIGS. 19B and 20B are cross-sectional views of the optical keyswitch of the sixth embodiment along the Y axis at the non-pressed position and the triggering position, respectively. As shown in FIGS. 19A and 19B, when the keycap 10 is not pressed, the keycap 10 does not contact or substantially not press the extension portion 544, and the extension portion 544 does not enter the intensity adjustment space 52b. Therefore, the receiver 36 can substantially completely receive the optical signal, i.e. the intensity of the optical signal received by the receiver 36 is substantially not influenced by the extension portion 544.

As shown in FIGS. 20A and 20B, when the keycap 10 is pressed, the keycap 10 moves downward to press against the extension portion 544 (e.g. against the bending section 544a), and the extension portion 544 deforms to enter the intensity adjustment space 52b to at least partially block the optical signal, so that the intensity of the optical signal received by the receiver 36 is reduced, and the switch module 30 is triggered to generate the triggering signal.

Figure 21A:
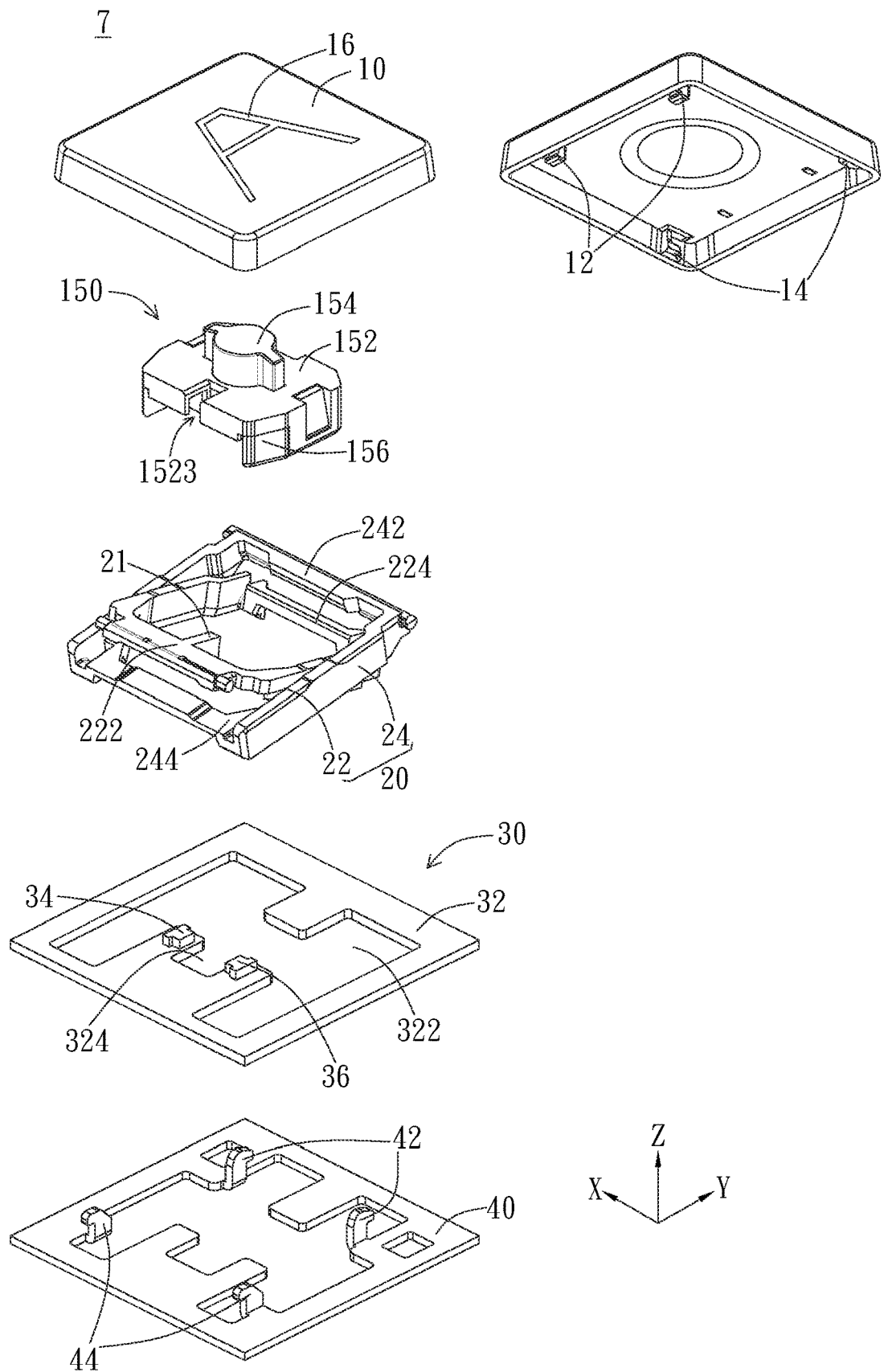
FIG. 21A is an exploded view of a seventh embodiment of the optical keyswitch of the invention.
Figure 21B:
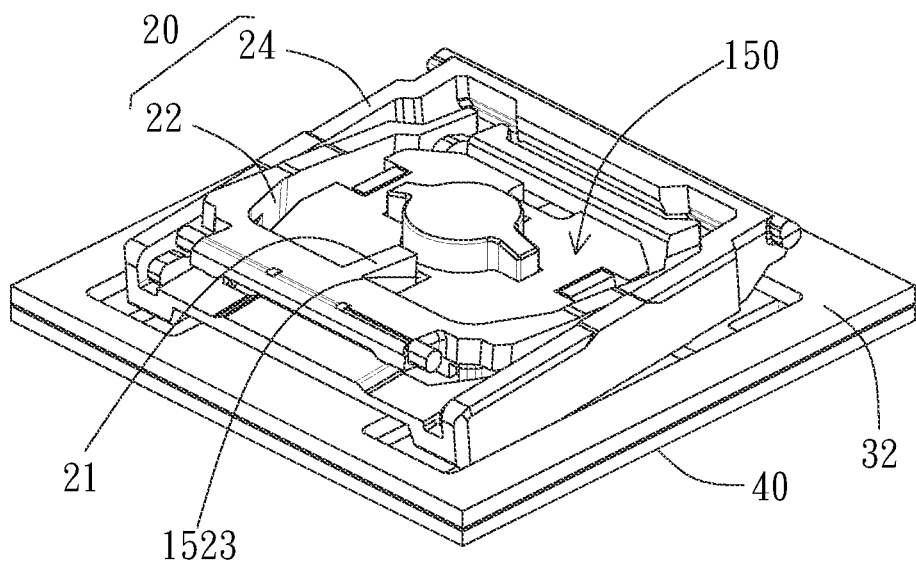
FIG. 21B is a schematic view of the optical keyswitch of FIG. 21A without the keycap.
Figure 21C:
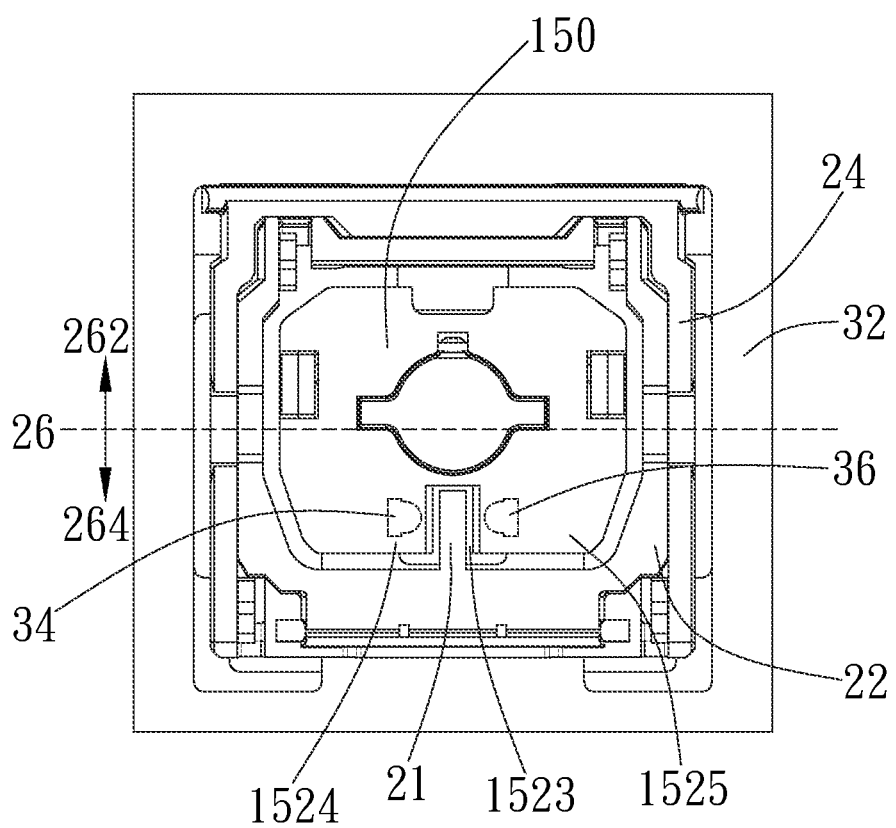
FIG. 21C is a top view of FIG. 21B.
Figure 21D:
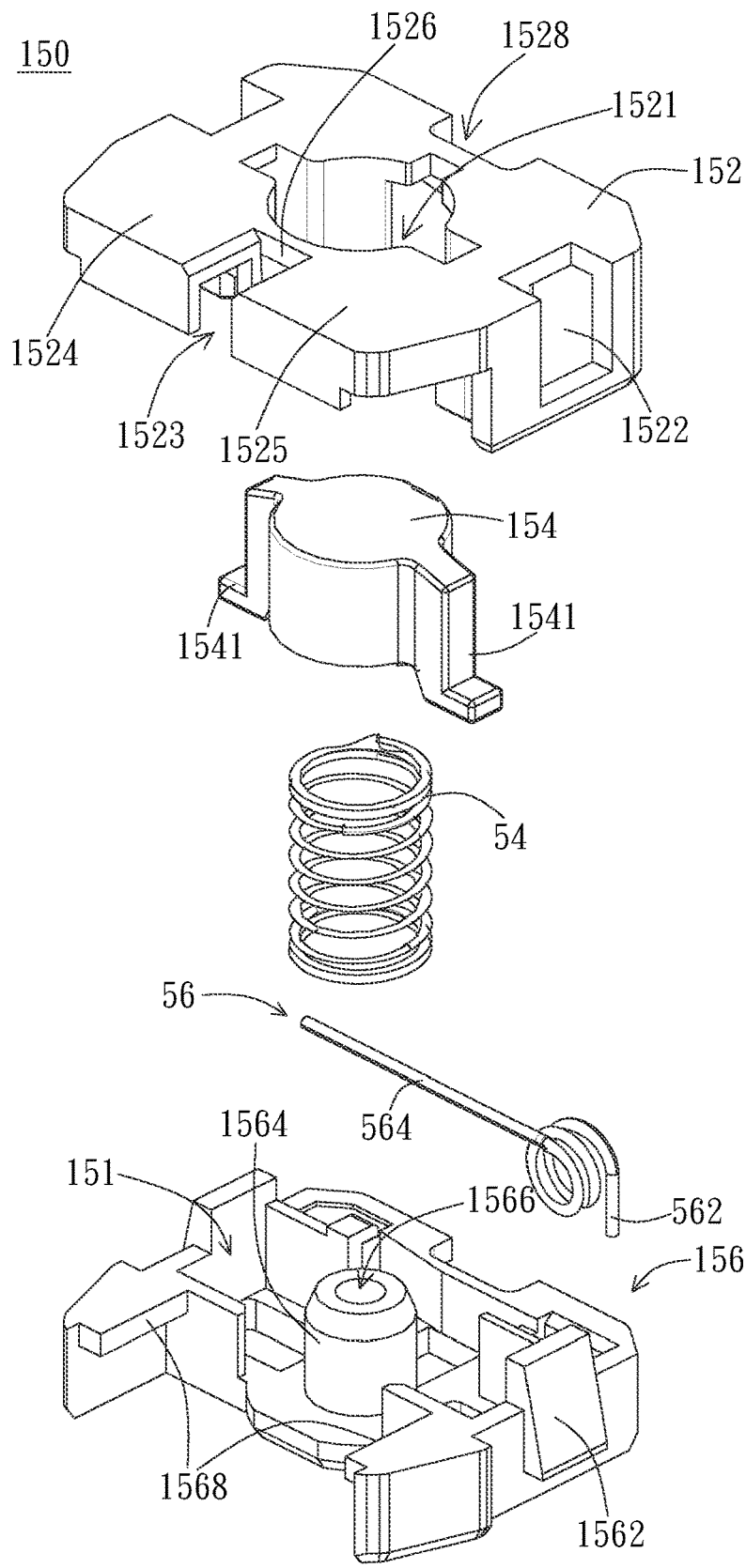
FIGS. 21D and 21E are exploded views of the restoring mechanism of FIG. 21A from different viewing angles.
Figure 21E:
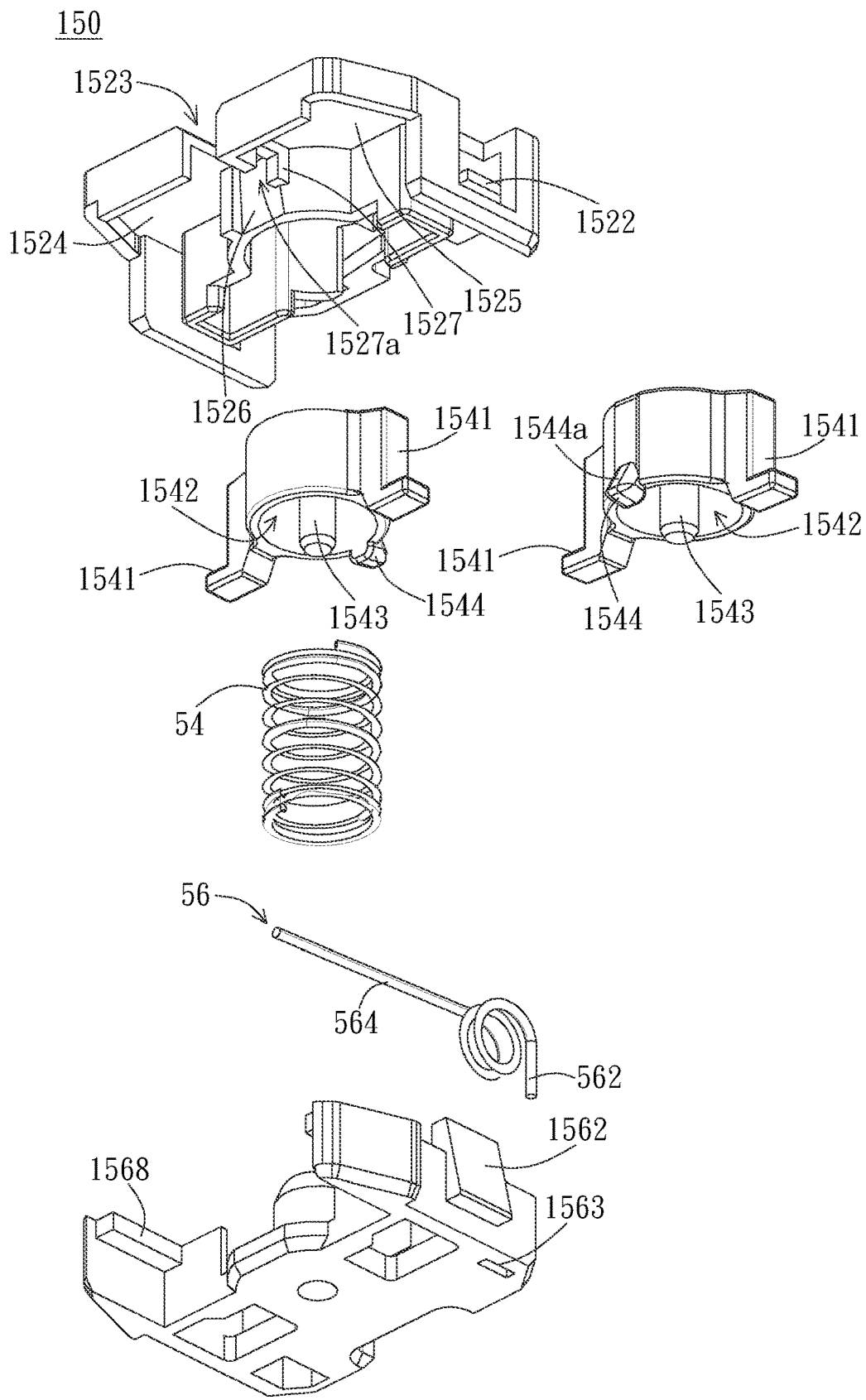

FIGS. 21A to 24B illustrate schematic views of a seventh embodiment of the optical keyswitch module of the invention, wherein FIG. 21A is an exploded view of the seventh embodiment of the optical keyswitch of the invention, FIG. 21B is a schematic view of the optical keyswitch of FIG. 21A without the keycap, FIG. 21C is a top view of FIG. 21B, and FIGS. 21D and 22E are exploded views of the restoring mechanism of FIG. 21A from different viewing angles. As shown in the figures, in the seventh embodiment, the optical keyswitch 7 includes the keycap 10, the support mechanism 20, the switch module 30, the baseplate 40, and the restoring mechanism 150. In this embodiment, the details and connections of the keycap 10, the support mechanism 20, the switch module 30, and the baseplate 40 can refer to the related descriptions of the foregoing embodiments, and will not elaborate again. Hereinafter, the difference of the restoring mechanism 150 will be explained. As shown in the figures, the restoring mechanism 150 includes an upper casing body 152, a movable part 154, a lower casing 156, a resilient member 54, and a tactile resilient member 56. The upper casing body 152 has a through hole 1521, an upper engaging portion 1522, an open region 1523, a left arm portion 1524, a right arm portion 1525, a sidewall 1526, a grating portion 1527, and an opening 1528, which have structures and functions similar to those described in the foregoing embodiments. In this embodiment, the differences in that the grating portion 1527 is disposed neighboring the receiving end of the receiver 36, and by controlling the size and location of the slit 1527a, the interference of external light and the possibility of false triggering can be effectively reduced, but not limited thereto. In other embodiments (not shown), the grating portion 1527 can be disposed on the lower casing 156 by modifying the design of the lower casing 156. The movable part 154 is preferably a barrel-like object having restricting portions 1541 protruding from two opposite sides (e.g. with respect to the X axis) to restrict the upward movement of the movable part 154 relative to the upper casing body 152. The movable part 154 has a positioning space 1542 and a positioning post 1543 on the bottom of the movable part 154, which are configured to position the relative position among the resilient member 54, the movable part 154, and the lower casing 156. The restricting portions 1541, the positioning space 1542, and the positioning post 1543 of the movable part 154 have structures and functions similar to those described in the foregoing embodiments and will not elaborate again. In this embodiment, the movable part 154 further has an acting portion 1544 at a side that is away from the open region 1523 in the Y axis. In an embodiment, the acting portion 1544 is a bump protruding outward from the lower side of the barrel-like object. The acting portion 1544 preferably has an inclined surface 1544a, which is inclined outward from up to down, to facilitate the relative movement of the acting end 564 of the tactile resilient member 56 and the acting portion 1544. Moreover, the movable part 154 has a dome shape at the top of the barrel-like object, instead of disposing the bump described above.

In this embodiment, the tactile resilient member 56 corresponding to the acting portion 1544 is disposed at the side away from the open region 1523. The extending direction of the acting end 564 of the tactile resilient member 56 is preferably parallel to the connection line of the restricting portions 1541 on two sides of the barrel-like object (e.g. parallel to the X axis direction). Therefore, when the keycap 10 is pressed, the acting portion 1544 cooperating with the acting end 564 achieves the clear tactile feedback and the hitting sound effect. Similar to the foregoing embodiments, the lower casing 156 has lower engaging portions 1562, which engage with upper engaging portions 1522 to combine the upper casing body 152 and the lower casing 156 to form a casing with an accommodation space 151. The lower casing 156 has a coupling portion 1564 configured to position the resilient member 54 and a guiding groove 1566 for allowing the positioning post 1543 to extend therein. The lower casing 156 further has a positioning hole 1563 provided to position the positioning end 562 of the tactile resilient member 56. Similarly, the restoring mechanism 150 can be positioned on the circuit board 32 by the wing portions 1568 of the lower casing 156. As such, when the restoring mechanism 150 is damaged and requires replacement, the damaged restoring mechanism 150 can be replaced with a new one by detaching the keycap 10, picking up the damaged one, and placing the new one, so as to effectively promote the serviceability and the repairing speed. It is noted that the lower engaging portion 1562, the positioning hole 1563, the coupling portion 1564, the guiding groove 1564, and the wing portions 1567 have structures and functions similar to those of the lower casing 254 of the restoring mechanism 50, and will not elaborate again.

Figure 22A:
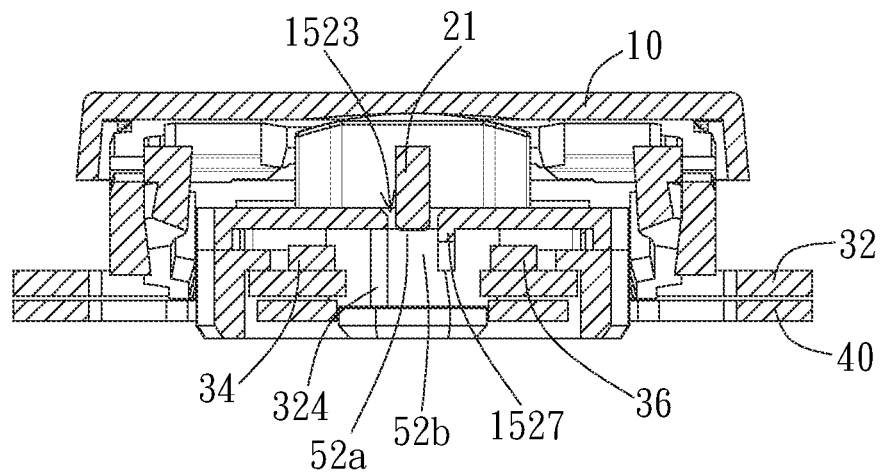
FIGS. 22A, 23A, and 24A are cross-sectional views of the optical keyswitch of the seventh embodiment of the invention along the X axis at the non-pressed position, the triggering position, and the lowest position, respectively.
Figure 22B:
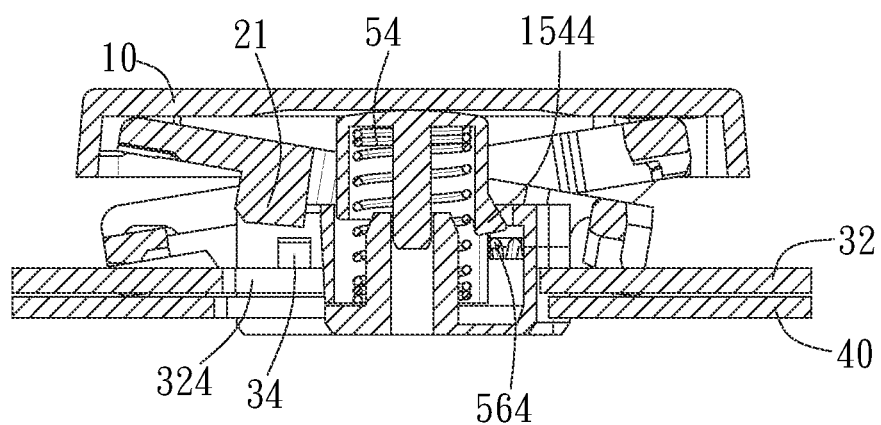
FIGS. 22B, 23B, and 24B are cross-sectional views of the optical keyswitch of the seventh embodiment of the invention along the Y axis at the non-pressed position, the triggering position, and the lowest position, respectively.
Figure 23A:
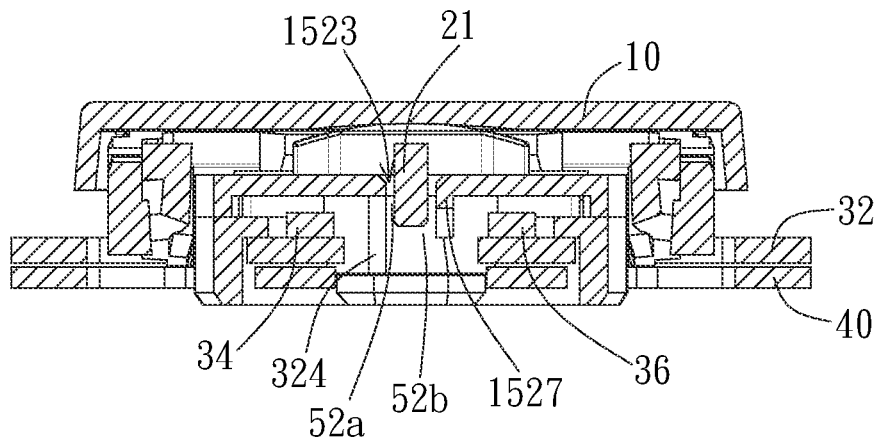
Figure 23B:
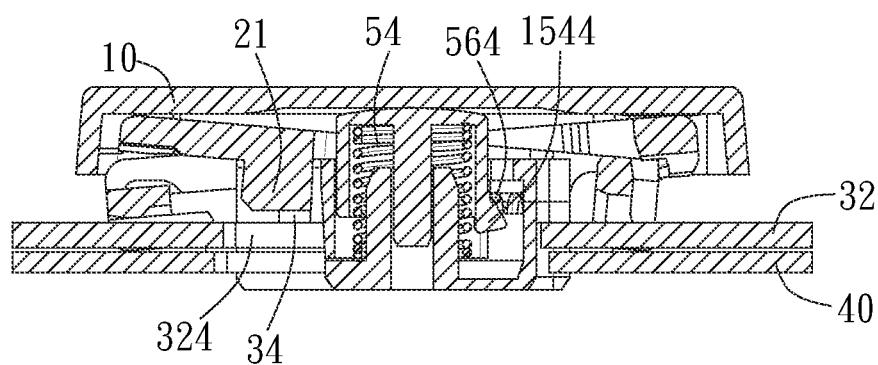
Figure 24A:
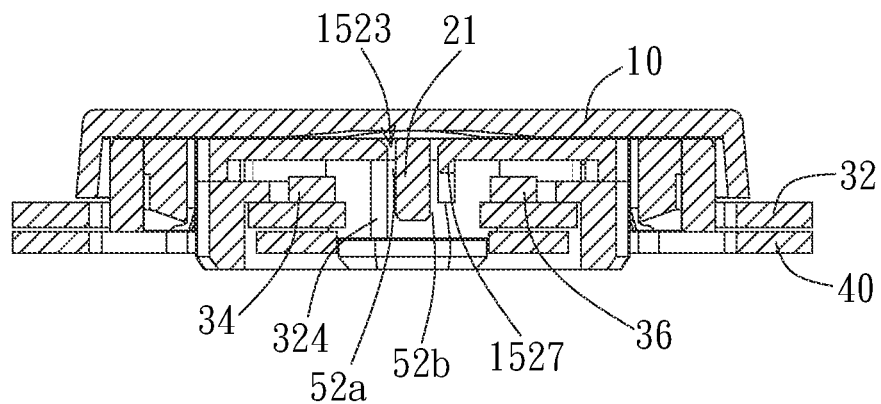
Figure 24B:
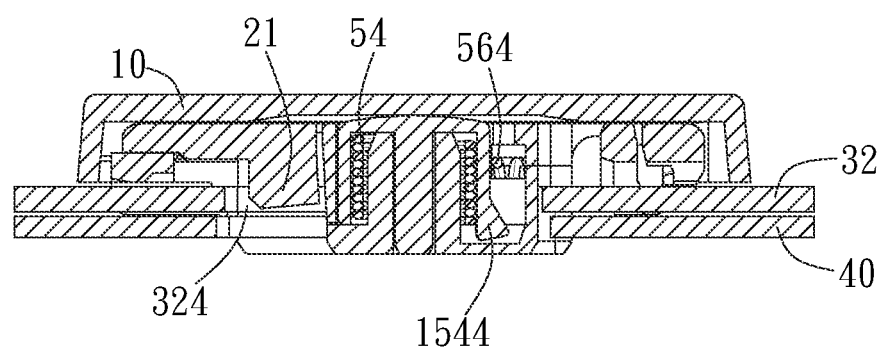

Referring to FIG. 22A to FIG. 24B, the operation of the optical keyswitch 7 of the seventh embodiment will be illustrated. FIGS. 22A, 23A, and 24A are cross-sectional views of the optical keyswitch of the seventh embodiment of the invention along the X axis at the non-pressed position, the triggering position, and the lowest position, respectively. FIGS. 22B, 23B, and 24B are cross-sectional views of the optical keyswitch of the seventh embodiment of the invention along the Y axis at the non-pressed position, the triggering position, and the lowest position, respectively.

As shown in FIGS. 22A and 22B, when the keycap 10 is not pressed, the protrusion 21 is located above the open region 1523 without substantially blocking the optical signal emitted from the emitter 34 along the straight optical path to the receiver 36, so the receiver 36 can receive the optical signal. That is, the protrusion 21 is located in the up-down path 52a without entering the intensity adjustment space 52b and does not influence the traveling (or transmitting) of the optical signal, and the acting end 564 of the tactile resilient member 56 is located under the acting portion 1544.

As shown in FIGS. 23A and 23B, when the keycap 10 is pressed to drive the protrusion 21, the protrusion 21 moves toward the open region 1523 to at least partially block the optical signal, so the intensity of the optical signal received by the receiver 36 is attenuated, and the switch module 30 is triggered to generate the triggering signal. In other words, the protrusion 21 moves downward in the up-down path 52a into intensity adjustment space 52b and at least partially blocks the optical signal, so that the switch module 30 is fast triggered, and the acting end 564 of the tactile resilient member 56 moves across the protrudent point of the acting portion 1544 along the inclined surface 1544a to above the acting portion 1544.

As shown in FIGS. 24A and 24B, the receiving space 324 of the circuit board 32 is aligned and communicates with the open region 1523. After reaching the triggering position, the protrusion 21 driven by the keycap 10 continuously moves downward into the receiving portion 1523 through the open region 1523. That is, the protrusion 21 continuously moves from the intensity adjustment space 52b to the receiving space 324, not only a faster triggering effect can be achieved, but also the stroke distance can be increased to enhance the tactile feedback.

Figure 25A:
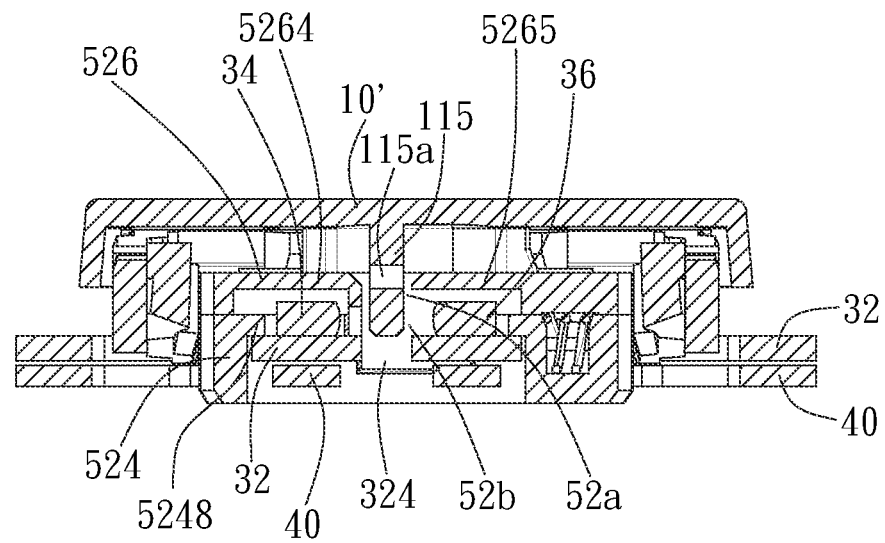
FIGS. 25A and 26A are cross-sectional views of the optical keyswitch of an eighth embodiment of the invention along the X axis at the non-pressed position and the triggering position, respectively.
Figure 25B:
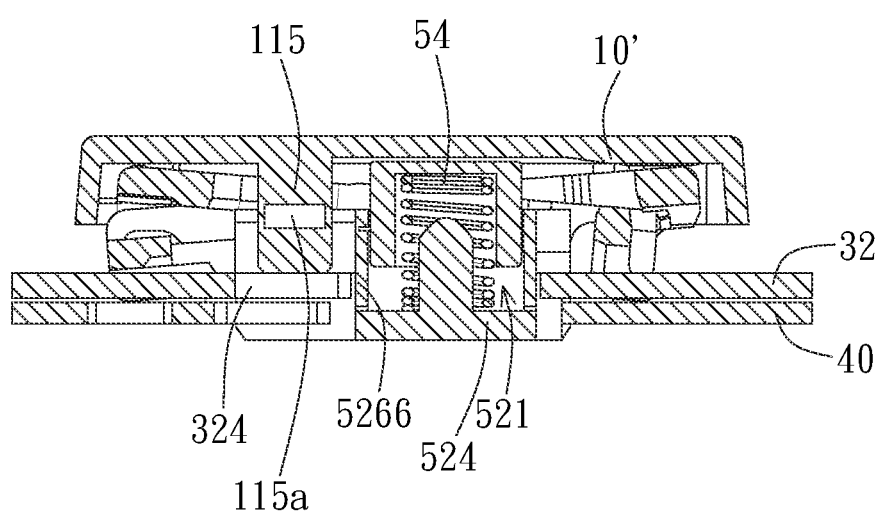
FIGS. 25B and 26B are cross-sectional views of the optical keyswitch of the eighth embodiment of the invention along the Y axis at the non-pressed position and the triggering position, respectively.
Figure 26A:
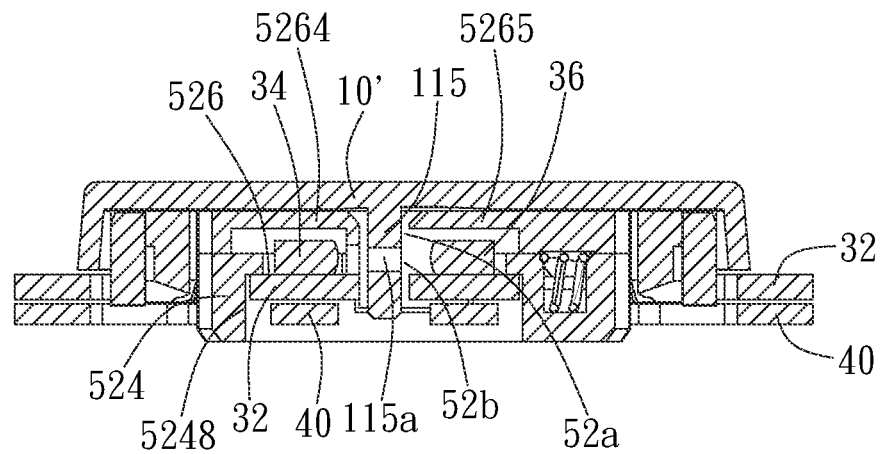
Figure 26B:
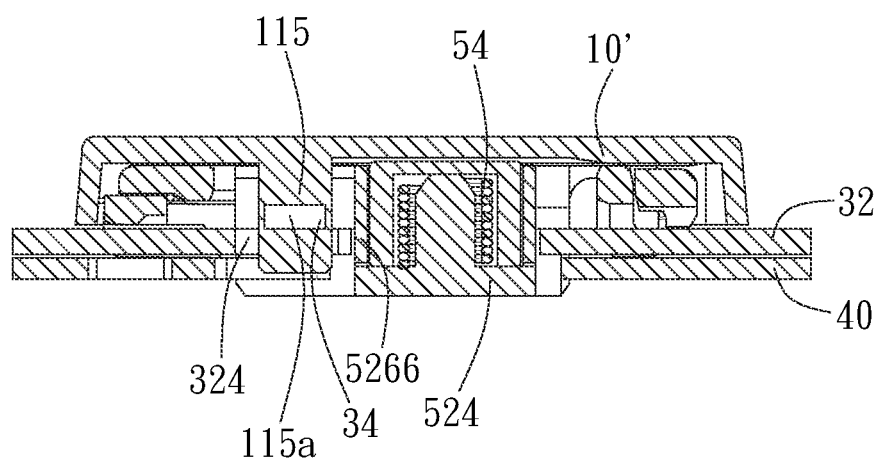

FIGS. 25A to 26B illustrate schematic views of an eighth embodiment of the optical keyswitch. FIGS. 25A and 26A are cross-sectional views of the optical keyswitch along the X axis at the non-pressed position and the triggering position, respectively. FIGS. 25B and 26B are cross-sectional views of the optical keyswitch along the Y axis at the non-pressed position and the triggering position, respectively. In the eighth embodiment, the optical keyswitch includes a structure similar to the optical keyswitch 2 of the second embodiment, but different in the design of the protrusion of the keycap 10'. As shown in FIGS. 25A and 25B, the protrusion 115 extends from the keycap 10' and has an opening 115a, and the protrusion 115 at least partially blocks the optical signal and attenuates the intensity of the optical signal received by the receiver 36. For example, when the keycap 10' is not pressed, the protrusion 115 is at a first position relative to the intensity adjustment space 52b, and the receiver 36 receives the optical signal of a first intensity. In this embodiment, the first position refers that the opening 115a is away from the intensity adjustment space 52b, and the protrusion 115 at least partially blocks the optical signal received by the receiver.

As shown in FIGS. 26A and 26B, when the keycap 10' is pressed, the protrusion 115 moves along with the keycap 10 outside the casing 52 to a second position relative to the intensity adjustment space 52b. The second position is different from the first position, and the protrusion 115 changes the optical signal received by the receiver to have a second intensity different from the first intensity, so that the switch module 30 is triggered to generate a triggering signal. In this embodiment, the second position refers that the opening 115a is located in the intensity adjustment space 52b, and the optical signal is allowed to pass the opening 115a, so that the second intensity is greater than the first intensity to trigger the switch module 30 to generate the triggering signal.

Figure 27:
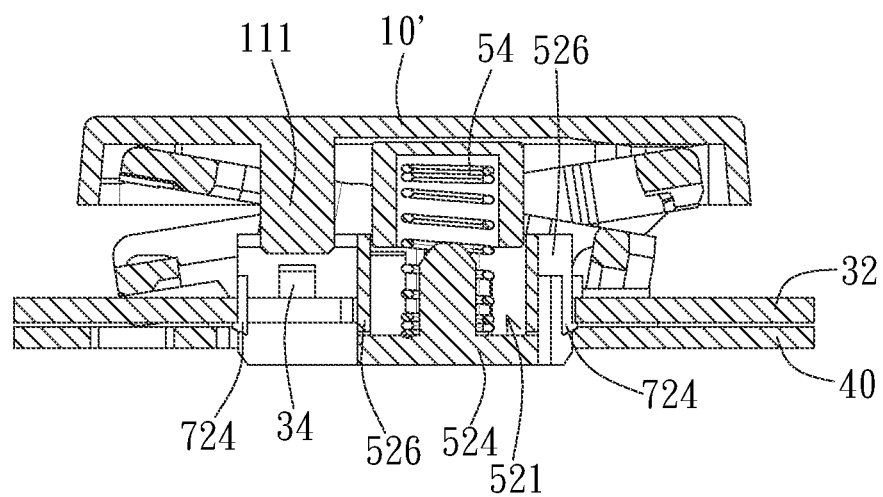
FIG. 27 is cross-sectional views of the optical keyswitch of a ninth embodiment of the invention along the Y axis at the non-pressed position.

FIG. 27 is cross-sectional views of the optical keyswitch of a ninth embodiment of the invention along the Y axis at the non-pressed position. In the ninth embodiment, the difference of the optical keyswitch in that the restoring mechanism 50 further has a hook portion 724, so the restoring mechanism 50 can be positioned on the circuit board 32 by the hook portion 724. Specifically, in an embodiment, the hook portions 724 are preferably disposed at two opposite sides of the upper casing body 526, e.g. at the first side 262 and the second side 264, respectively. When the restoring mechanism 50 requires replacement, by clicking the hook portions toward each other, the restoring mechanism 50 can be detached from the circuit board 32.

Figure 28A:
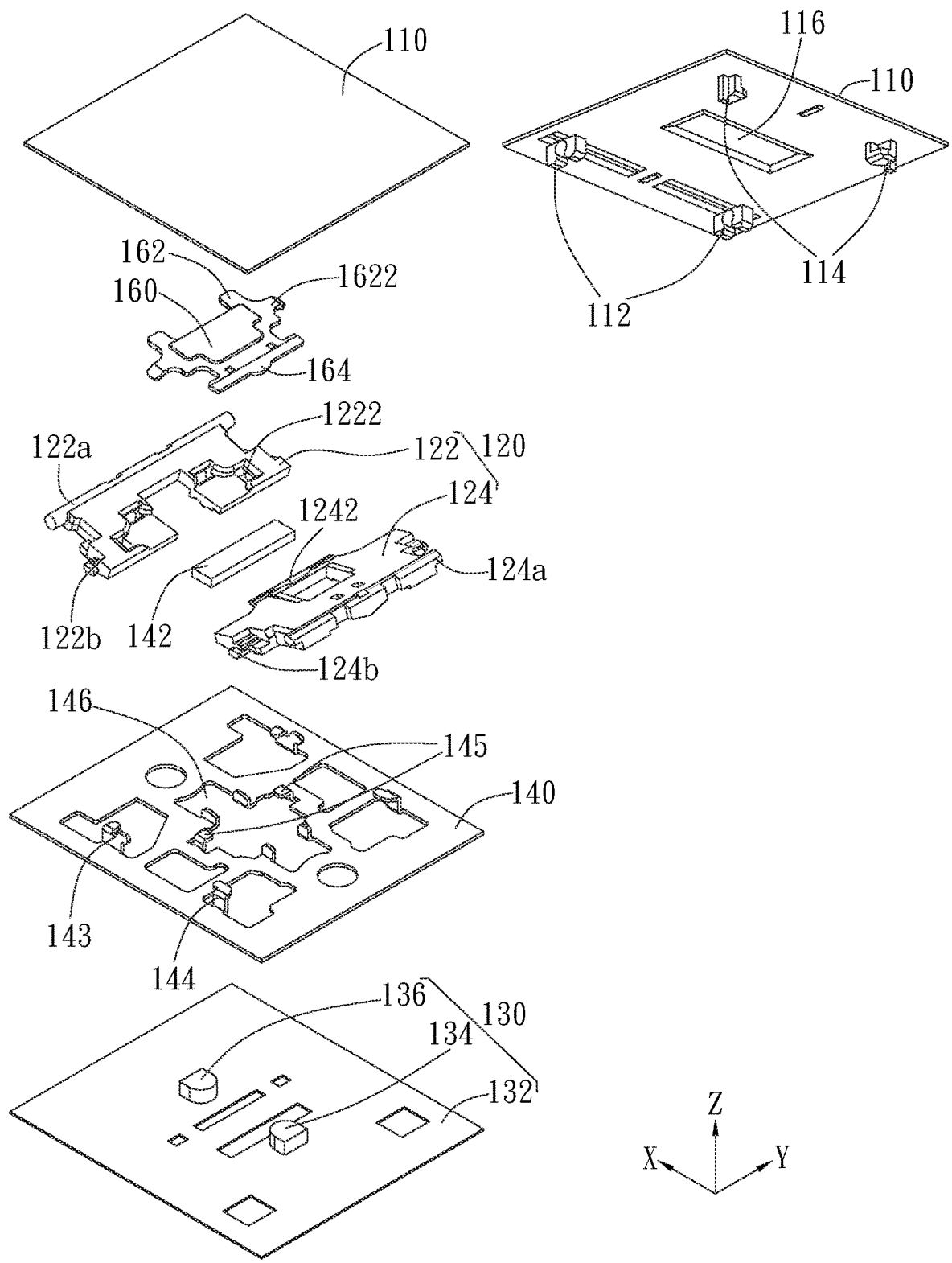
FIG. 28A is an exploded view of a tenth embodiment of the optical keyswitch of the invention.
Figure 28B:
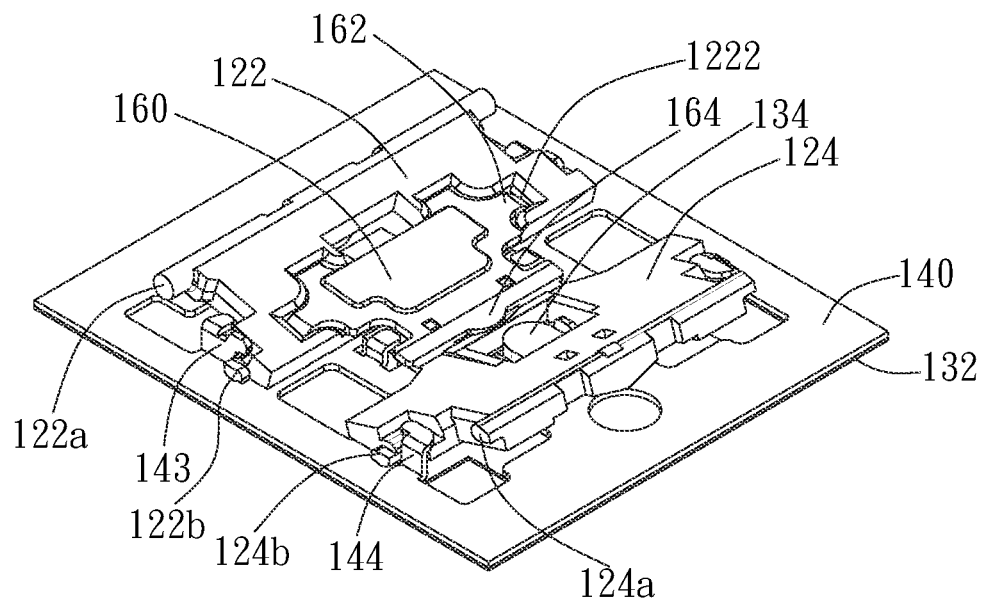
FIG. 28B is a schematic view of the optical keyswitch of FIG. 28A without the keycap.
Figure 28C:
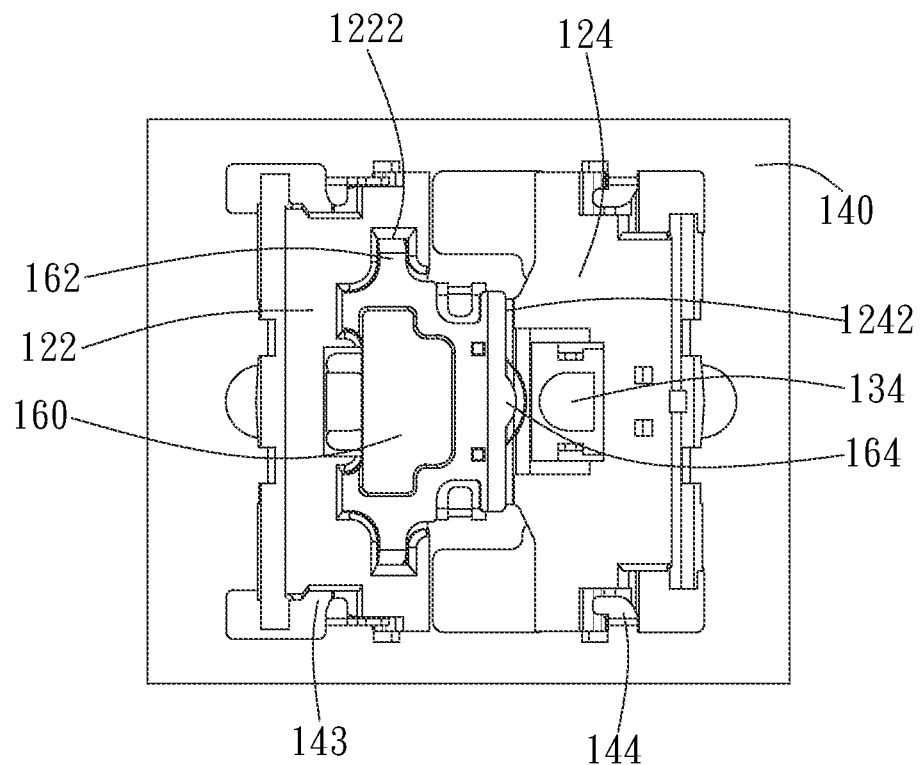
FIG. 28C is a top view of FIG. 28B.

FIGS. 28A to 30 are schematic views of a tenth embodiment of the optical keyswitch. FIG. 28A is an exploded view of the tenth embodiment of the optical keyswitch of the invention. FIG. 28B is a schematic view of the optical keyswitch of FIG. 28A without the keycap. FIG. 28C is a top view of FIG. 28B. As shown in the figures, in the tenth embodiment, the optical keyswitch 100 includes a keycap 110, a support mechanism 120, a switch module 130, a baseplate 140, and a magnetic member 160. The baseplate 140 has a magnetic portion 142. The keycap 110 is disposed above the baseplate 140. The support mechanism 120 is disposed between the keycap 110 and the baseplate 140 to support the keycap 110 moving relative to the baseplate 140. The support mechanism 120 includes a first frame 122 and a second frame 124, which are located on two opposite sides of the keycap 110, respectively. The magnetic member 160 is disposed corresponding to the magnetic portion 142. The magnetic member 160 has a first side 162 and a second side 164. The first side 162 is movably connected to the first frame 122, and the second side 164 corresponds to the second frame 124. The magnetic member 160 and the magnetic portion 142 contact each other to generate an attractive force to support the keycap 110 at a non-pressed position. The switch module 130 includes a circuit board 132, an emitter 134, and a receiver 136. The emitter 134 and the receiver 136 are electrically connected to the circuit board 132 and disposed along a connecting line of the first side 162 and the second side 164 of the magnetic member 160, e.g. along the X axis. The emitter 134 emits an optical signal to the receiver 136. When the keycap 110 is not pressed, the magnetic member 160 blocks the optical signal. When the keycap 110 is pressed, the second frame 124 moves along with the keycap 110 to drive the magnetic member 160 to move away from the magnetic portion 142 to allow the receiver 136 to receive the optical signal, so the switch module 130 is triggered to generate a triggering signal.

Specifically, the keycap 110 has coupling members 112 and 114 and a recessed groove 116 formed at its bottom surface. The baseplate 140 can be a metal plate with connection members 143 and 144 and a positioning portion 145, which is formed by stamping. The magnetic portion 142 can be a magnet and couples with the baseplate 140 by means of the positioning portion 145. The circuit board 132 is disposed under the baseplate 140, and the baseplate 140 has an opening 146, which allows the emitter 134 and the receiver 136 on the circuit board 132 to pass therethrough and protrude from the baseplate 140. The emitter 134 and the receiver 136 are higher than the magnetic portion 142. As such, the emitter 134 and the receiver 136 partially extend above the top surface of the magnetic portion 142, so as to allow at least a portion of the optical signal to be able to travel from the emitter 134 to the receiver 136 along a straight optical path above the top surface of the magnetic portion 142.

Two coupling portions 122a and 122b at two opposite ends of the first frame 122 can movably couple to the coupling member 112 of the keycap 110 and the connection member 143 of the baseplate 140, respectively. Two coupling portions 124a and 124b at two opposite ends of the second frame 124 can movably couple to the coupling member 114 of the keycap 110 and the connection member 144 of the baseplate 140, respectively. As such, the support mechanism 120 can stably support the keycap 110 to move relative to the baseplate 140.

The magnetic member 160 is disposed corresponding to the magnetic portion 142 between the baseplate 140 and the keycap 110, and positioned on the first frame 122. For example, the first frame 122 has a hole 1222, and the magnetic member 160 has a pivot 1622 rotatably engaging with the hole 1222, so the first side 162 of the magnetic member 160 is movably (or rotatably) connected to the first frame 122. The second frame 124 has a supporting portion 1242. The second side 164 of the magnetic member 160 is located above the supporting portion 1242, so that the second frame 124 can drive the magnetic member 160 to rotate when the second frame 124 moves along with the keycap 110.

Figure 29:
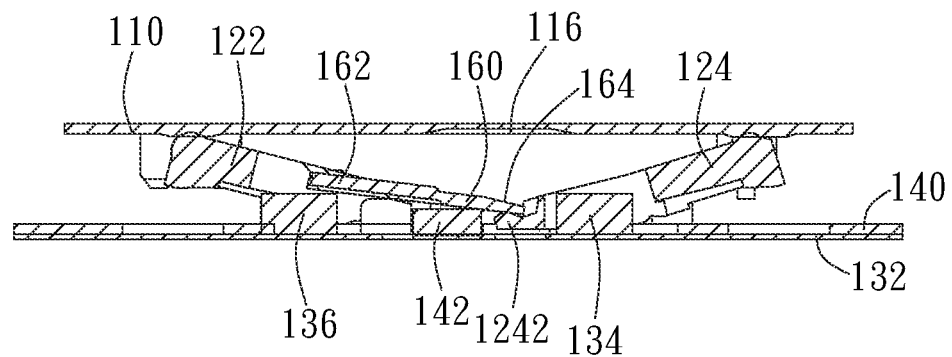
FIGS. 29 and 30 are cross-sectional views of the optical keyswitch of the tenth embodiment of the invention along the X axis at the non-pressed position and the triggering position, respectively.
Figure 30:
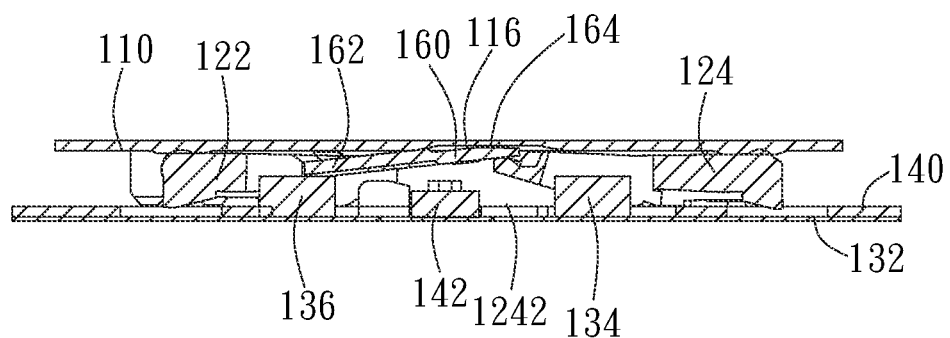

FIGS. 29 and 30 illustrate the operation of the optical keyswitch 100 of the tenth embodiment. FIGS. 29 and 30 are cross-sectional views of the optical keyswitch along the X axis at the non-pressed position and the triggering position, respectively. As shown in FIG. 29. When the keycap 110 is not pressed, the magnetic member 160 and the magnetic portion 142 contact each other to generate an attractive force, so that the second side 164 of the magnetic member 160 contacts the supporting portion 1242 and is at a lower position to block the optical signal. Therefore, the receiver 136 cannot receive the optical signal.

As shown in FIG. 30, when the keycap 110 is pressed to move downward, the second frame 124 rotates to enable the supporting portion 1242 to lift the second side 164 of the magnetic member 160 upward, so the magnetic member 160 moves away from the magnetic portion 142 to be located at a higher position revealing the optical path of the optical signal. Therefore, the receiver 136 is able to receive the optical signal, and the switch module 130 is triggered to generate the triggering signal.

Figure 31A:
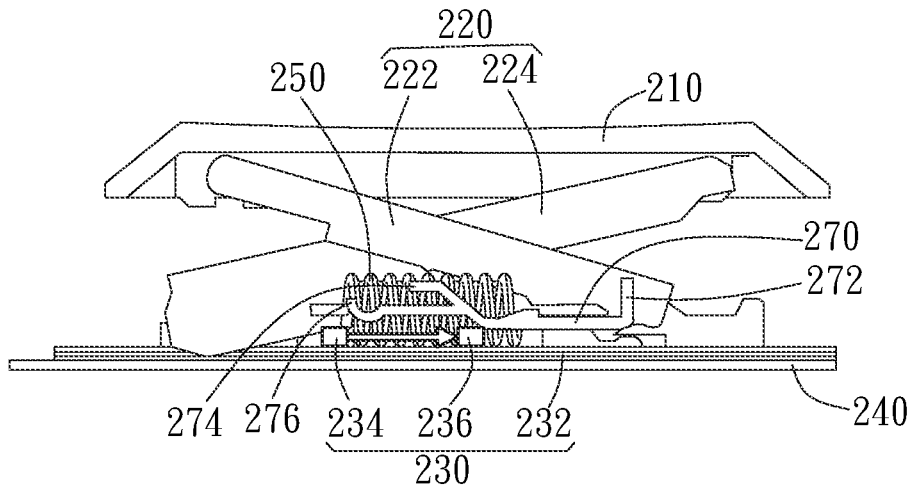
FIGS. 31A and 31B are cross-sectional views of the optical keyswitch of an eleventh embodiment of the invention at the non-pressed position and the triggering position, respectively.
Figure 31B:
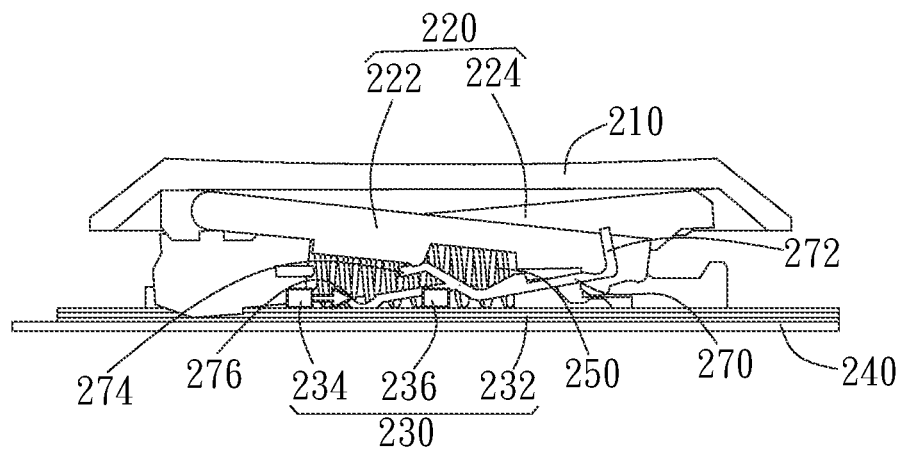

FIGS. 31A and 31B are cross-sectional views of the optical keyswitch of an eleventh embodiment of the invention at the non-pressed position and the triggering position, respectively. As shown in the figures, in the eleventh embodiment, the optical keyswitch includes a keycap 210, a support mechanism 220, a switch module 230, a resilient member 250, a tactile resilient member 270, and a baseplate 240. The support mechanism 220 is disposed below the keycap 210 and configured to support the keycap 210 moving upward and downward. The support mechanism 220 includes a first frame 222 and a second frame 224. The resilient member 250 connects the first frame 222 and the second frame 224. The tactile resilient member 270 has a connecting portion 272, a pressing portion 274, and a hitting portion 276. The connecting portion 272 connects the first frame 222. The pressing portion 274 corresponds to the first frame 222. The hitting portion 276 is connected to the pressing portion 274 and located opposite to the connecting portion 272. The switch module 230 includes a circuit board 232, an emitter 234, and a receiver 236. The emitter 234 and the receiver 236 are electrically connected to the circuit board 232. The emitter 234 emits an optical signal to the receiver 236, and the circuit board 232 is disposed on the baseplate 240.

For example, the first frame 222 and the second frame 224 are pivotally connected, so the support mechanism 220 can be a scissor-like support structure. The resilient member 250 can be implemented as a coil spring, and two ends of the spring are respectively coupled to the baseplate ends of the first frame 222 and the second frame 224 by engaging or hooking. As such, when the first frame 222 moves relative to the second frame 224, the resilient member 250 can elastically deform to provide the restoring force to enable the keycap 210 to return the non-pressed position. The connecting portion 272 of the tactile resilient member 270 is rotatably connected to the first frame 222. In response to the relative movement of the first frame 222 and the second frame 224, the hitting portion 276 rotates.

As shown in FIG. 31A, when the keycap 210 is not pressed, the resilient member 250 enables the baseplate ends of the first frame 222 and the second frame 224 to be close to each other, so the keycap 210 is maintained at the non-pressed position. Moreover, the emitter 234 and the receiver 236 are disposed along a connecting direction of the resilient member 250 connecting the first frame 222 and the second frame 224. The hitting portion 276 of the tactile resilient member 270 is positioned above the optical path of the emitter 234 and the receiver 236.

As shown in FIG. 31B, when the keycap 210 is pressed, the first frame 222 is driven by the keycap 210 to press against the pressing portion 274 of the tactile resilient member 270 and to stretch the resilient member 270, so that the hitting portion 276 rotates to hit the circuit board 232 (or the baseplate 240) and at least partially blocks the optical signal. Therefore, the switch module 230 is triggered to generate the triggering signal.

Figure 32A:
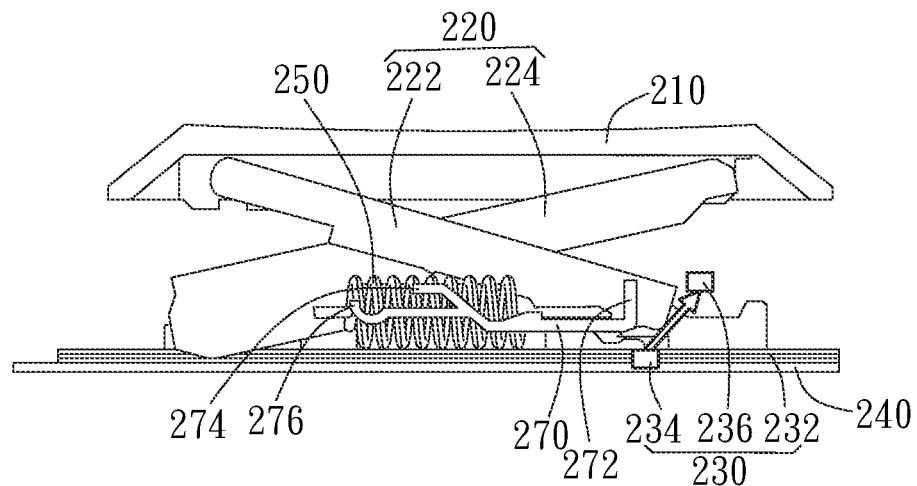
FIGS. 32A and 32B are cross-sectional views of the optical keyswitch of a twelfth embodiment of the invention at the non-pressed position and the triggering position, respectively.
Figure 32B:
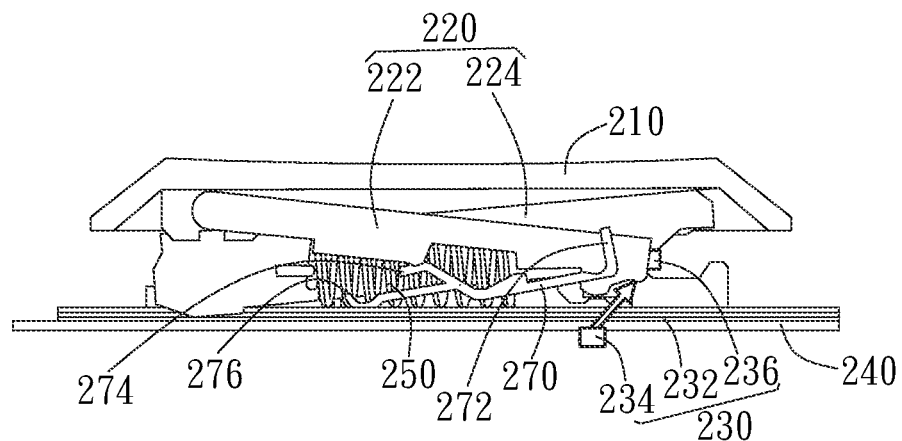

FIGS. 32A and 32B are cross-sectional views of the optical keyswitch of a twelfth embodiment of the invention at the non-pressed position and the triggering position, respectively. In the twelfth embodiment, the optical keyswitch includes the keycap 210, the support mechanism 220, the resilient member 250, and the switch module 230. The details of structure and connection of the keycap 210, the support mechanism 220, and the resilient member 250 can refer to the related descriptions of FIG. 31A. The optical keyswitch of this embodiment is different in that the locations of the emitter 234 and the receiver 236. As shown in FIG. 32A, in this embodiment, the emitter 234 and the receiver 236 are disposed on two opposite sides with respect to the connecting direction of the resilient member 250 connecting the first frame 222 and the second frame 224. As shown in FIG. 32B, when the keycap 210 is pressed, the first frame 222 is driven by the keycap 210 to slide substantially parallel to the circuit board 232 (or the baseplate 240) and at least partially block the optical signal, so the switch module is triggered to generate the triggering signal. In other words, in this embodiment, the emitter 234 and the receiver 222 are disposed at two opposite sides with respect to the moving path of the first frame 222, so the optical path of the optical signal intersects the moving path of the first frame 222. As such, when the first frame 222 is driven by the keycap 210, the first frame 222 moves to the optical path and attenuates the optical signal, and the switch module 230 is triggered to generate the triggering signal.

It is noted that in the first embodiment, the support mechanism 20 is illustrated as the scissor-like support mechanism, but not limited thereto. The support mechanism in the first embodiment can have any suitable configuration. For example, in the tenth embodiment of FIG. 28A, the optical keyswitch 100 with the butterfly type support mechanism 120 is illustrated to utilize the metal member 160 for changing the intensity of the optical signal, but not limited thereto. In other embodiments, by modifying the design of the support mechanism and the switch module, an optical keyswitch with the butterfly type support mechanism may have a protrusion, which is configured to function as the protrusion 21 of the first embodiment of FIG. 1A.

Figure 33A:
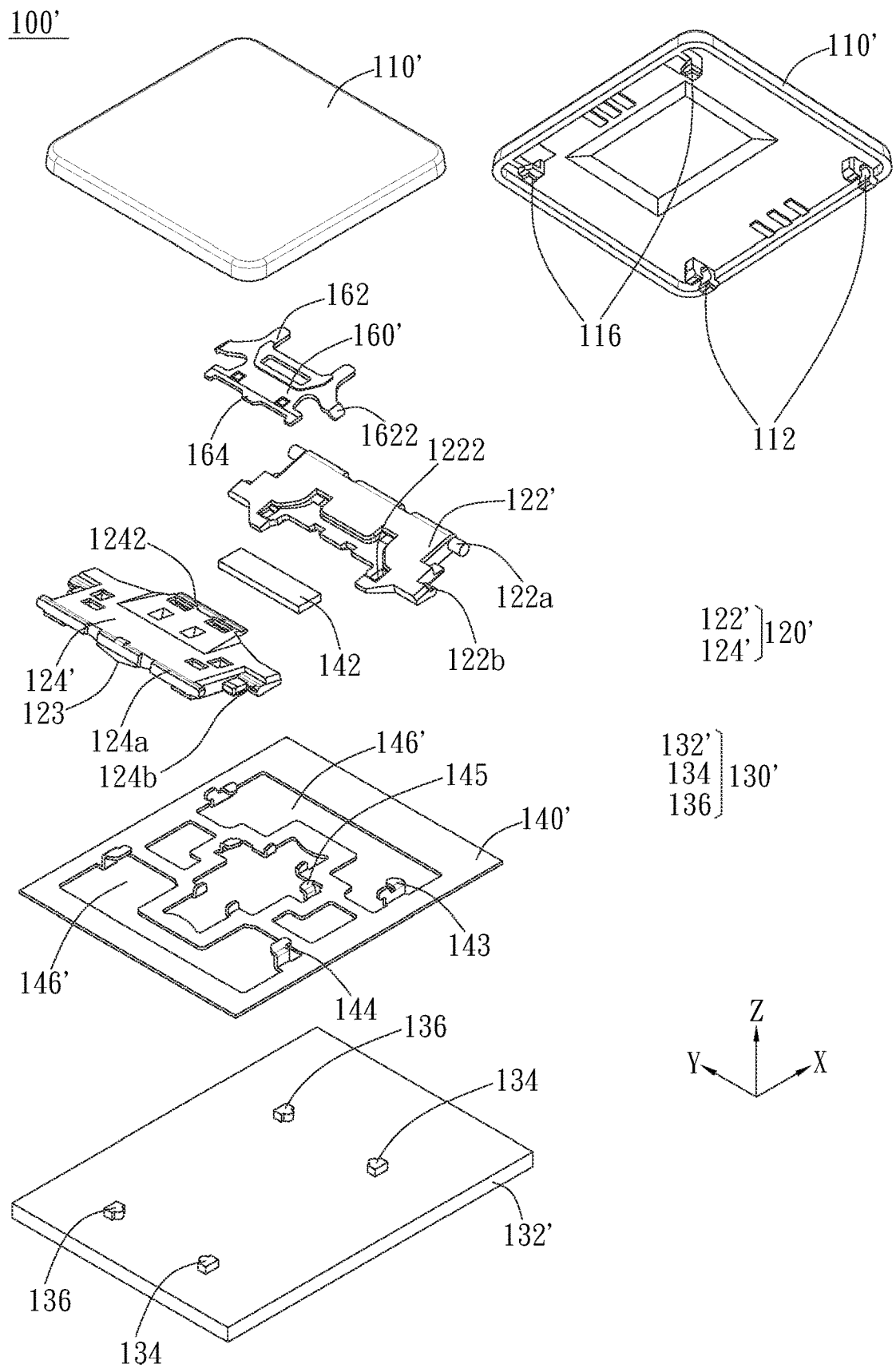
FIG. 33A is an exploded view of a thirteenth embodiment of the optical keyswitch of the invention.
Figure 33B:
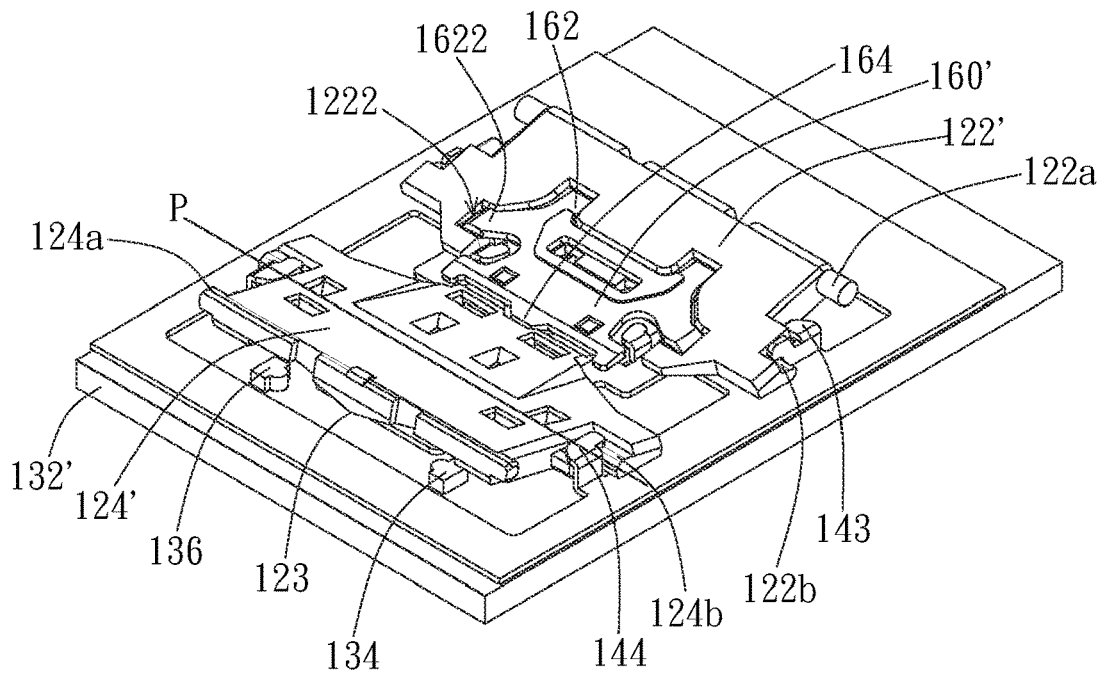
FIG. 33B is a schematic view of the optical keyswitch of FIG. 33A without the keycap.
Figure 33C:
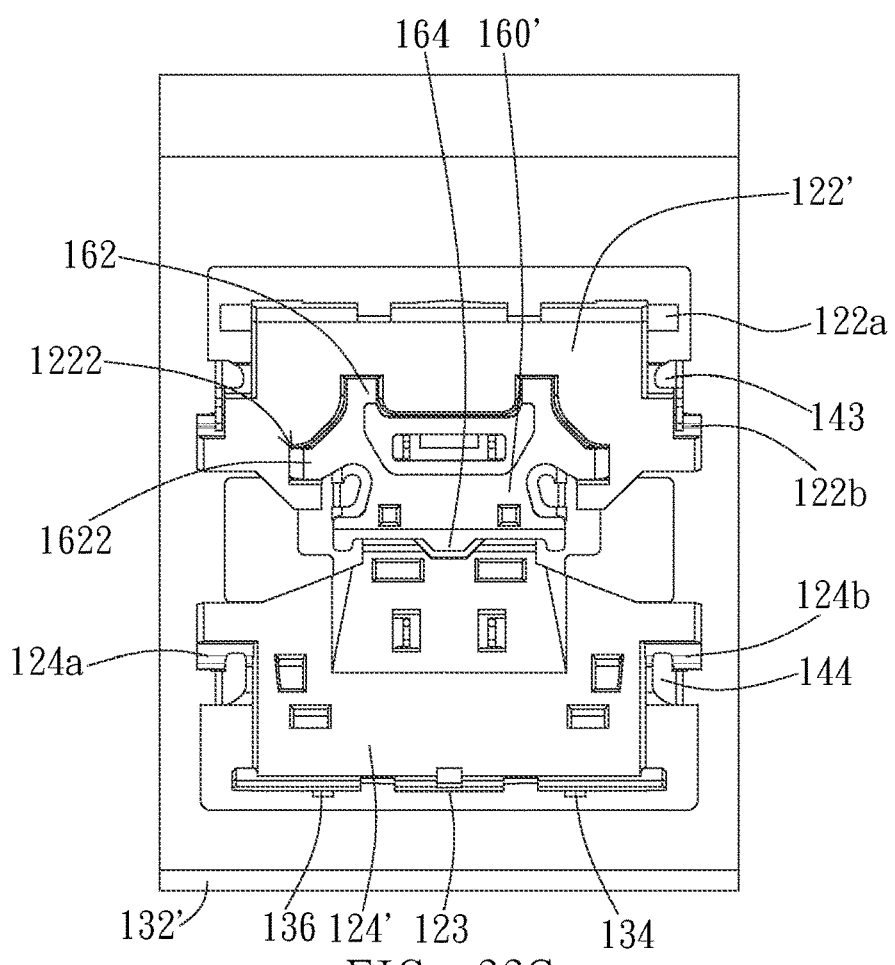
FIG. 33C is a top view of FIG. 33B.

Referring to FIG. 33A to FIG. 35B, which are schematic views of a thirteen embodiment of the invention, FIG. 33A is an exploded view of the optical keyswitch, FIG. 33B is a schematic view of the optical keyswitch of FIG. 33A without the keycap, and FIG. 33C is a top view of FIG. 33B. As shown in the figures, in the thirteen embodiment, the optical keyswitch 100' includes a keycap 110', a support mechanism 120', a switch module 130', a baseplate 140', and a magnetic member 160'. The details of the keycap 110', the support mechanism 120', the switch module 130', the baseplate 140', and the magnetic member 160' can refer to the related descriptions of the tenth embodiment. Hereinafter, the difference between the thirteen embodiment and the foregoing embodiments will be explained.

The support mechanism 120' includes a first frame 122' and a second frame 124', which are located on two opposite sides of the keycap 110'. For example, the first frame 122' and the second frame 124' are disposed on two opposite sides of the keycap 110 along the X axis, and two coupling portions (e.g. 122a and 122b, 124a and 124b) at two opposite ends of each of the first frame 122' and the second frame 124' are respectively connected to the keycap 110' and the baseplate 140' to construct a butterfly type support mechanism and rotate around a pivotal axis P. For example, the pivotal axis P can be a virtual connecting line of the coupling portions 124b on two opposite sides of the second frame 124'. The support mechanism 120' includes a protrusion 123 disposed corresponding to the emitter 134 and the receiver 136 of the switch module 130'. For example, at least one of the first frame 122' and the second frame 124' can have the protrusion 123 at its keycap end, i.e. the end neighboring the keycap 110' and far away from the baseplate 140'. In this embodiment, the first frame 122' and the second frame 124' both have the protrusion 123 at the keycap ends, and the protrusion 123 extends downward toward the baseplate 140'. The switch module 130' have two sets of the emitters 134 and the receivers 136, which are disposed on and electrically connected to the circuit board 132'. One set of the emitter 134 and the receiver 136 are disposed along the keycap end of the first frame 122' corresponding to the protrusion 123 of the first frame 122', and the other set of the emitter 134 and the receiver 136 are disposed along the keycap end of the second frame 124' corresponding to the protrusion 123 of the second frame 124'. In other words, each set of the emitter 134 and the receiver 136 are disposed along the Y axis and preferably below the first frame 122' or the second frame 124', so that the optical path between the emitter 134 and the receiver 136 is substantially a straight path along the Y axis, i.e. a straight connecting line connecting the emitter 134 and the receiver 136 is the optical path of the optical signal. The optical path (i.e. the straight connecting line) avoids intersection with the pivotal axis P. It is noted that the shape and the number of the opening 146' of the baseplate 140' can be modified to allow the two sets of the emitter 134 and the receiver 136 on the circuit board 132' to pass therethrough and protrude from the baseplate 140'.

Figure 34A:
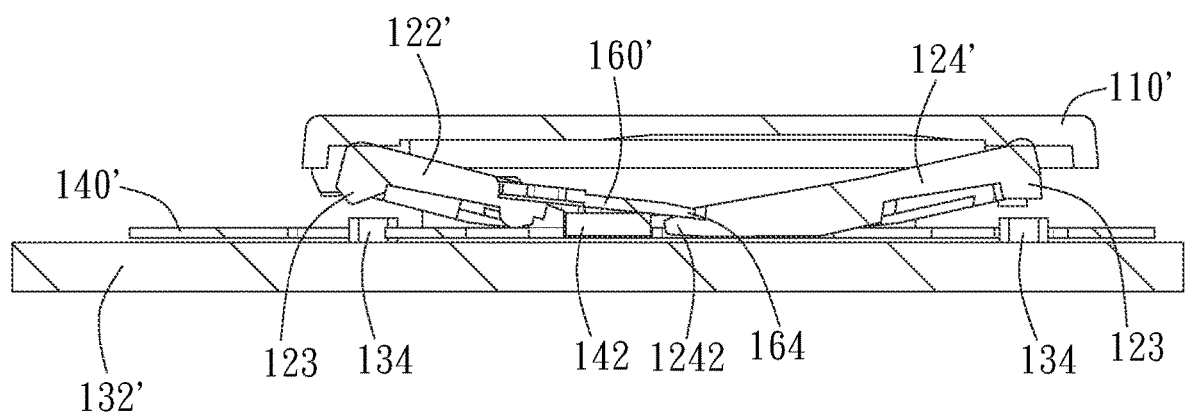
FIGS. 34A and 35A are cross-sectional views of the optical keyswitch of the thirteenth embodiment of the invention along the X axis at the non-pressed position and the triggering position, respectively.
Figure 34B:
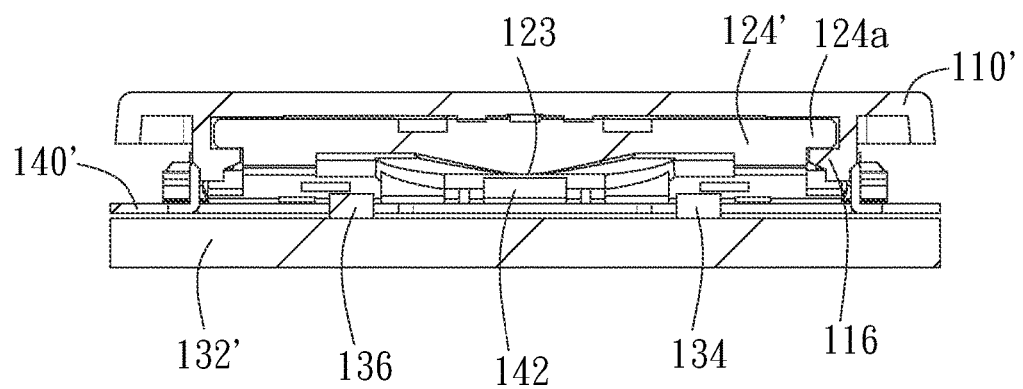
FIGS. 34B and 35B are cross-sectional views of the optical keyswitch of the thirteenth embodiment of the invention along the Y axis at the non-pressed position and the triggering position, respectively.
Figure 35A:
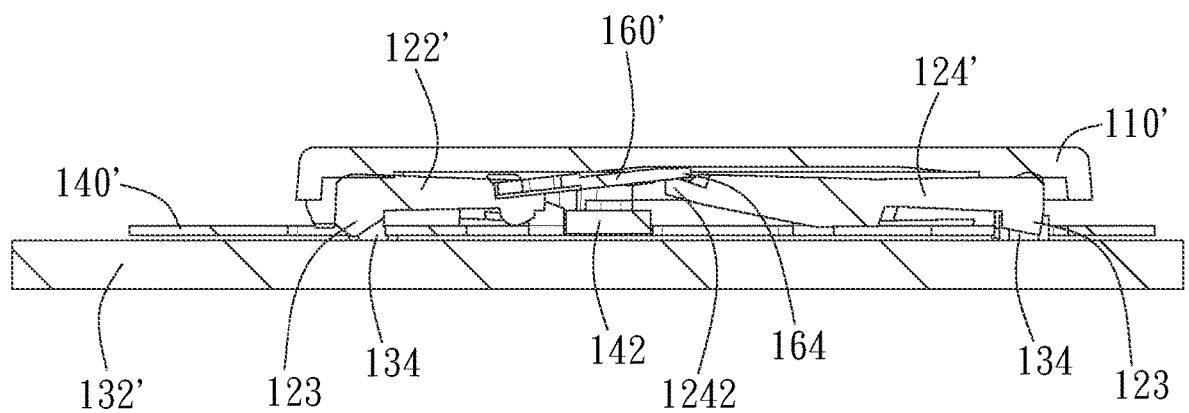
Figure 35B:
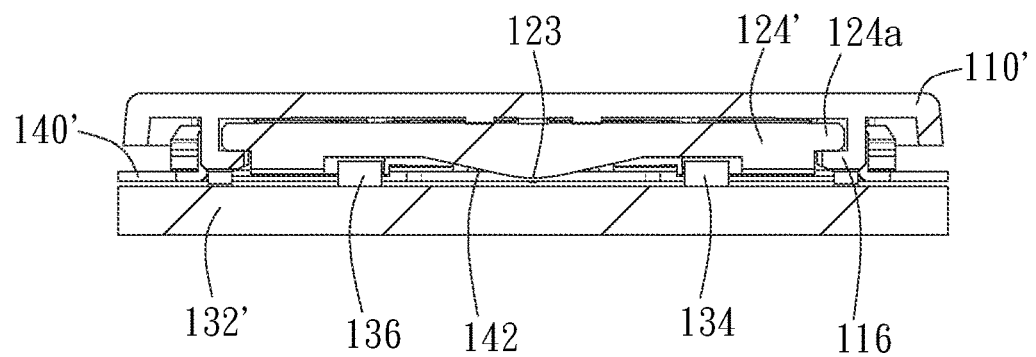

FIGS. 34A to 35B illustrate the operation of the optical keyswitch 100' of the thirteenth embodiment. FIGS. 34A and 35A are cross-sectional views of the optical keyswitch along the X axis at the non-pressed position and the triggering position, respectively. FIGS. 34B and 35B are cross-sectional views of the optical keyswitch along the Y axis at the non-pressed position and the triggering position, respectively. As shown in FIGS. 34A and 34B, when the keycap 110' is not pressed, the magnetic member 160' and the magnetic portion 142 contact each other to generate an attractive force, so that the second side 164 of the magnetic member 160' contacts the supporting portion 1242 and is at a lower position, and the keycap ends of the first frame 122' and the second frame 124' are away from the baseplate 140'. Therefore, the protrusion 123 at the keycap end is preferably located above the optical path of the corresponding emitter 134 and receiver 136 and substantially does not change the intensity of the optical signal. That is, the receiver 136 receives the optical signal of a first intensity, which is relatively stronger.

As shown in FIGS. 35A and 35B, when the keycap 110' is pressed to move downward, the second frame 124' rotates around the pivotal axis P to enable the supporting portion 1242 to lift the second side 164 of the magnetic member 160' upward, so the magnetic member 160' moves away from the magnetic portion 142 to be located at a higher position, and the keycap ends of the first frame 122' and the second frame 124' move downward toward the baseplate 140'. As such, the protrusion 123 at the keycap end driven by the keycap 110' moves downward and enters the optical path of the optical signal to change the optical signal received by the corresponding receiver 136 to have a second intensity, which is different from the first intensity, so that the switch module 130' is triggered to generate a triggering signal. In other words, when the keycap 110' is pressed, the protrusion 123 of the support mechanism 120' moves downward to at least partially block the optical signal, so that the second intensity is smaller than the first intensity, and the switch module 130' is triggered to generate a triggering signal.

It is noted that in the embodiment FIG. 33A, two sets of the emitters 134 and the receivers 136 are illustrated, but not limited thereto. In other embodiments, the optical keyswitch may have only one set of the emitter 134 and the receiver 136, which can be disposed along the keycap end of the first frame 122' or the second frame 124' to correspond to the protrusion 123 thereon. Moreover, by modifying the extending length of the protrusion 123, the triggering distance of the optical keyswitch can be controlled to achieve a faster triggering effect or a slower triggering effect.

Figure 36A:
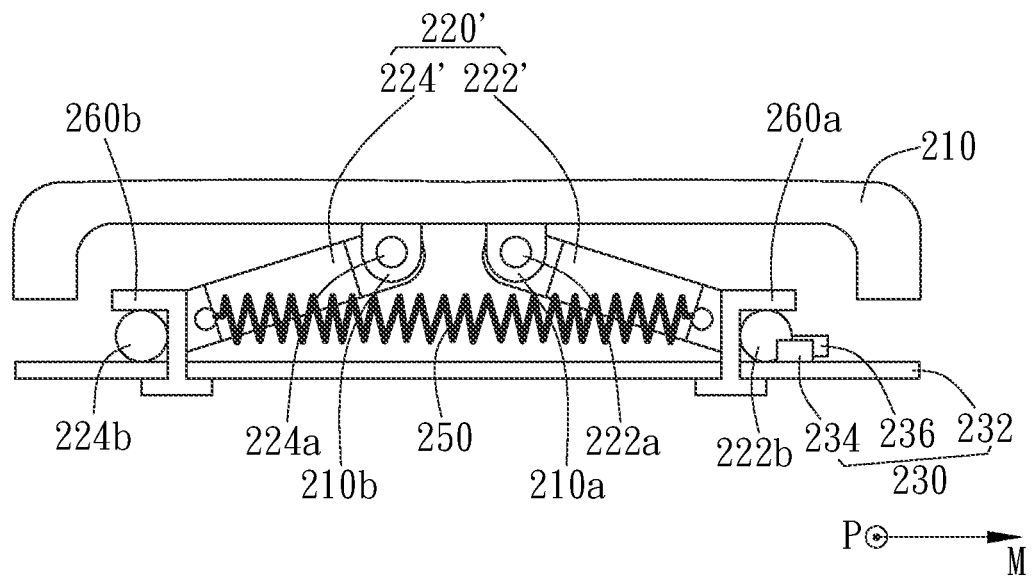
FIGS. 36A and 36B are cross-sectional views of the optical keyswitch of the fourteenth embodiment of the invention at the non-pressed position and the triggering position, respectively.
Figure 36B:
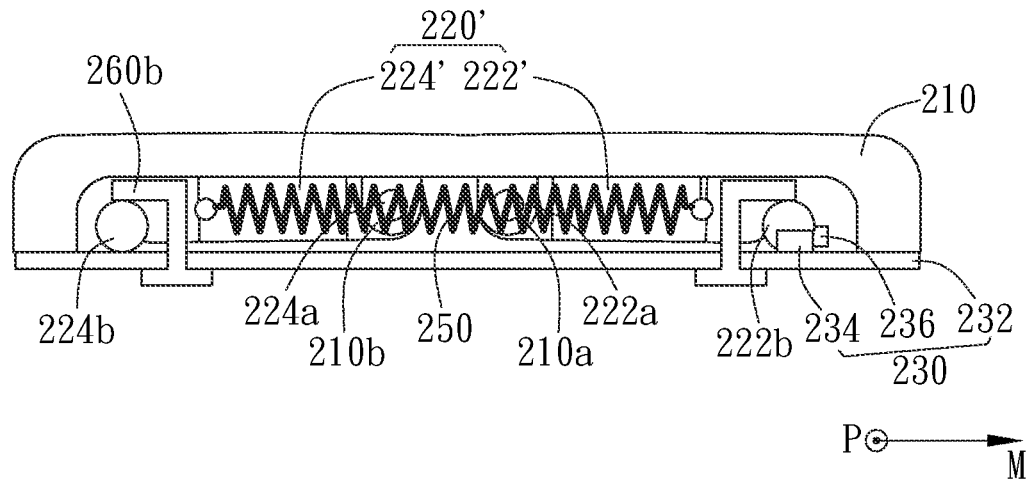

FIGS. 36A and 36B are cross-sectional views of the optical keyswitch of the fourteenth embodiment of the invention at the non-pressed position and the triggering position, respectively. As shown in the figures, in the fourteenth embodiment, the optical keyswitch includes a keycap 210, a support mechanism 220', and a switch module 230. The support mechanism 220' is disposed below the keycap 210 and configured to support the keycap 210 moving upward and downward. The support mechanism 210' includes a first frame 222' and a second frame 224'. The switch module 230 includes a circuit board 232, an emitter 234, and a receiver 236. The emitter 232 and the receiver 234 are electrically connected to the circuit board 232. The emitter 232 emits an optical signal to the receiver 236.

In this embodiment, the first frame 222' and the second frame 224' are respectively disposed on two opposite sides of the keycap 210 to form a reversed-V butterfly type support mechanism. Each of the first frame 222' and the second frame 224' includes two opposite ends, such as upper ends (or keycap ends) 222a, 224a and lower ends (or baseplate ends) 222b, 224b. One of the two opposite ends of each of the first frame 222' and the second frame 224' is rotatably connected to the keycap 210, and the other of the two opposite ends of each of the first frame 222' and the second frame 224' is movably coupled to the circuit board 232. If necessary, the upper ends (or keycap ends) 222a, 224a of the first frame 222' and the second frame 224' may be movably engaged with each other, such that the first frame 222' and the second frame 224' may drive each other to move together while leveling upward and downward along with the keycap 210. In addition, the circuit board 232 may include a plurality of coupling portions, such as 260a, 260b, which correspond to the lower end 222b of the first frame 222' and the lower end 224b of the second frame 224', respectively. In an embodiment, the coupling portions 206a, 260b can be hook-like portions which are formed on the circuit board 232 by hot-melting or insert-molding.

For example, the first frame 222' is disposed on the right-hand side of the keycap 210 with the upper end 222a rotatably connected to the coupling member 210a of the keycap 210 and the lower end 222b movably coupled to the coupling portion 260a of the circuit board 232. Similarly, the second frame 224' is disposed on the left-hand side of the keycap 210 with the upper end 224a rotatably connected to the coupling member 210b of the keycap 210 and the lower end 224b movably coupled to the coupling portion 260b of the circuit board 232. In this embodiment, the distance between the upper end 222a of the first frame 222' and the upper end 224a of the second frame 224' is preferably smaller than the distance between the lower end 222b of the first frame 222' and the lower end 224b of the second frame 224'.

The optical keyswitch may further includes a resilient member 250. The resilient member 250 connects lower ends (or baseplate ends) 222b, 224b of the first frame 222' and the second frame 224'. The resilient member 250 can be implemented as a coil spring, and two ends of the spring are respectively coupled to the lower end 222b of the first frame 222' and the lower end 224b of the second frame 224 by engaging or hooking. As such, when the first frame 222' moves relative to the second frame 224', the resilient member 250 can elastically deform to provide the restoring force to enable the keycap 210 to return the non-pressed position.

In this embodiment, the emitter 234 and the receiver 236 are disposed adjacent to the lower end 222b of the first frame 222'. The emitter 234 emits the optical signal along a straight optical path P, and the straight optical path P intersects a moving path M of the first frame 222'. For example, the straight optical path P extends along the lower end 222b of the first frame 222', and the moving path M of the first frame 222' is substantially parallel to the connecting direction of the first frame 222' and the second frame 224', i.e., the extension direction of the coil spring (resilient member 250). In other words, the emitter 234 and the receiver 236 are disposed on two opposite sides (e.g. front side, rear side) with respect to the connecting direction of the resilient member 250 connecting the first frame 222' and the second frame 224'. As such, the optical path P between the emitter 234 and the receiver 236 crosses the moving path M of the first frame 222'.

As shown in FIG. 36A, when the keycap 210 is not pressed, the resilient member 250 enables the lower ends 222b, 224b of the first frame 222' and the second frame 224' to be close to each other, so the keycap 210 is maintained at the non-pressed position. In such a configuration, the emitter 234 emits the optical signal along the straight optical path P to the receiver 236, and the receiver 236 receives the optical signal of a first intensity.

As shown in FIG. 36B, when the keycap 210 is pressed, the first frame 222' is driven by the keycap 210 to slide substantially parallel to the circuit board 232 and at least partially block the optical signal, so the switch module 230 is triggered to generate a triggering signal. Specifically, when the keycap 210 is pressed, the lower end 222b (namely the sliding end 222b) of the first frame 222' correspondingly slides substantially on the circuit board 232 along the moving path M to the righthand side, i.e., away from the second frame 224', so that a portion of the first frame 222' is interposed into the straight optical path P between the emitter 234 and the receiver 236. As such, the first frame 222' attenuates (e.g. partially blocks or completely blocks) the optical signal, and the receiver 236 receives the optical signal of a second intensity, which is smaller than the first intensity. Therefore, based on the change in intensity of the optical signal received by the receiver 236, the switch module 230 is triggered to generate the triggering signal.

In the embodiment of FIG. 36A, the coupling portions 260a, 260b are disposed on the circuit board 232, so a baseplate (such as 140 or 240) can be optionally omitted to reduce the thickness of the optical switch, but not limited thereto. In another embodiment (not shown), the optical switch may further include a baseplate to enhance the structural strength of the optical switch, and the coupling portions 260a, 260b can be disposed on the baseplate, instead of the circuit board 232. When the baseplate is provided, the circuit board 232 can be disposed above or under the baseplate as appropriate, so that the emitter 234 and the receiver 236 protrude above the baseplate, and the first frame 222' can move into the optical path P between the emitter 234 and the receiver 236 when the first frame 222' slides substantially parallel to the circuit board 232 or the baseplate 210 to trigger the switch module 230.

In other embodiment, the first frame 222' and the second frame 224' in FIGS. 36A and 36B may be turned upside down to form a positive-V butterfly type support mechanism. Namely, the ends 222a, 224a of the first frame 222' and the second frame 224' will now pivot with baseplate 240 and become new baseplate ends, while the ends 222b, 224b now moveably engage with the keycap 210 and become new keycap ends. When the keycap 210 is pressed, the new keycap end 222b (namely the sliding end) of the first frame 222' is driven by the keycap 210 to slide outwards and move downward in the meantime. When the keycap 210 reaches the lowest pressed position, the first frame 222' has slided substantially parallel to the circuit board 232 to move into the optical path P with its new keycap end 222b (namely the sliding end) and trigger the switch module 230, similarly to FIG. 36B or FIGS. 31B/32B. Therefore, the first frame 222' may be arranged to slide to interfere the optical path P with its sliding end to trigger the switch module 230, no matter if the support mechanism 220/220' is scissors-type (FIGS. 31A/31B/32A/32B) or butterfly-types (FIGS. 36A/36B or FIGS. 37-51), and no matter if it is the keycap end or baseplate end of the first frame that move into block the optical path P.

Figure 37:
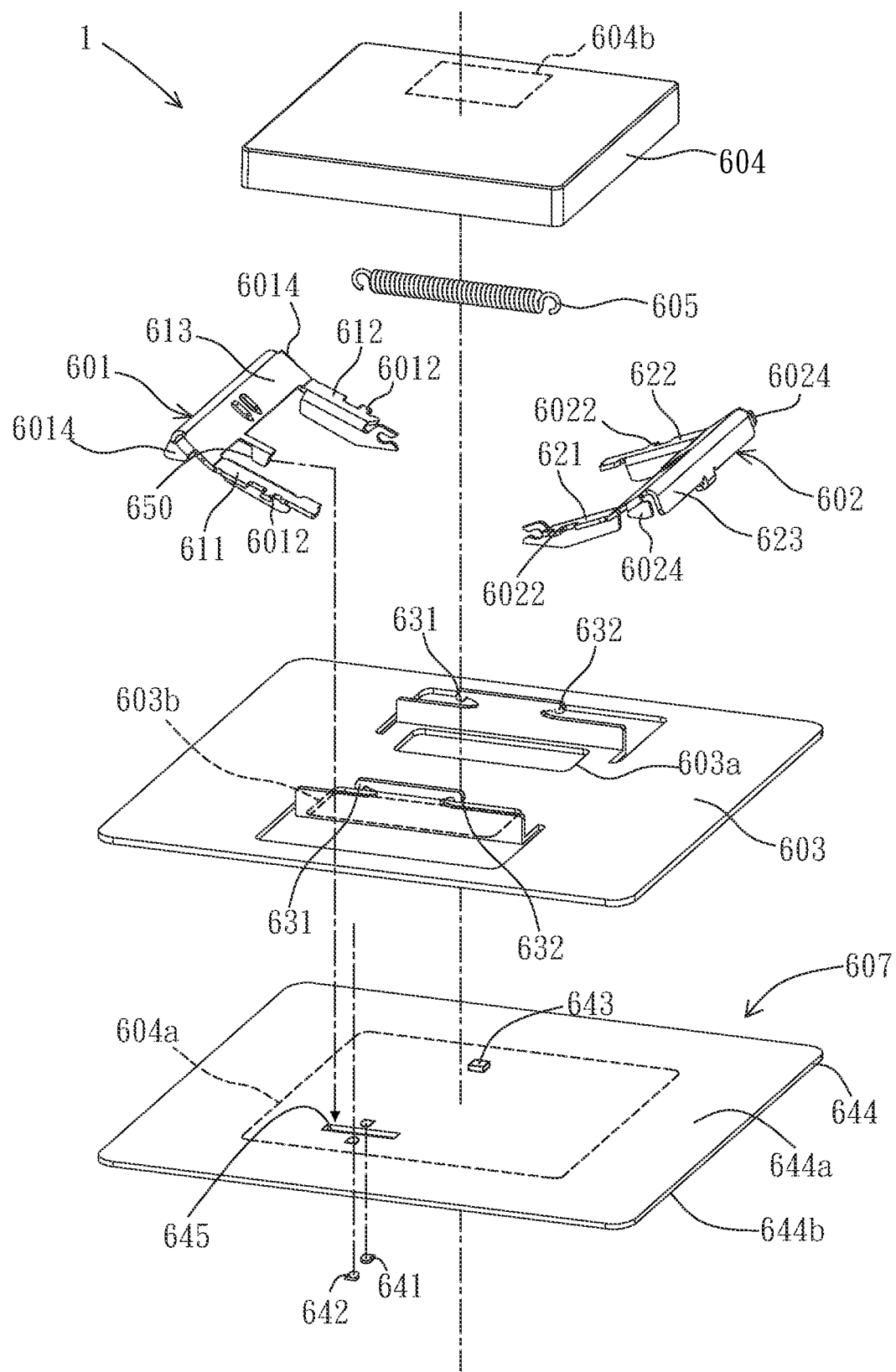
FIG. 37 is an exploded view according to a fifteenth embodiment of the optical keyswitch of the invention.
Figure 38:
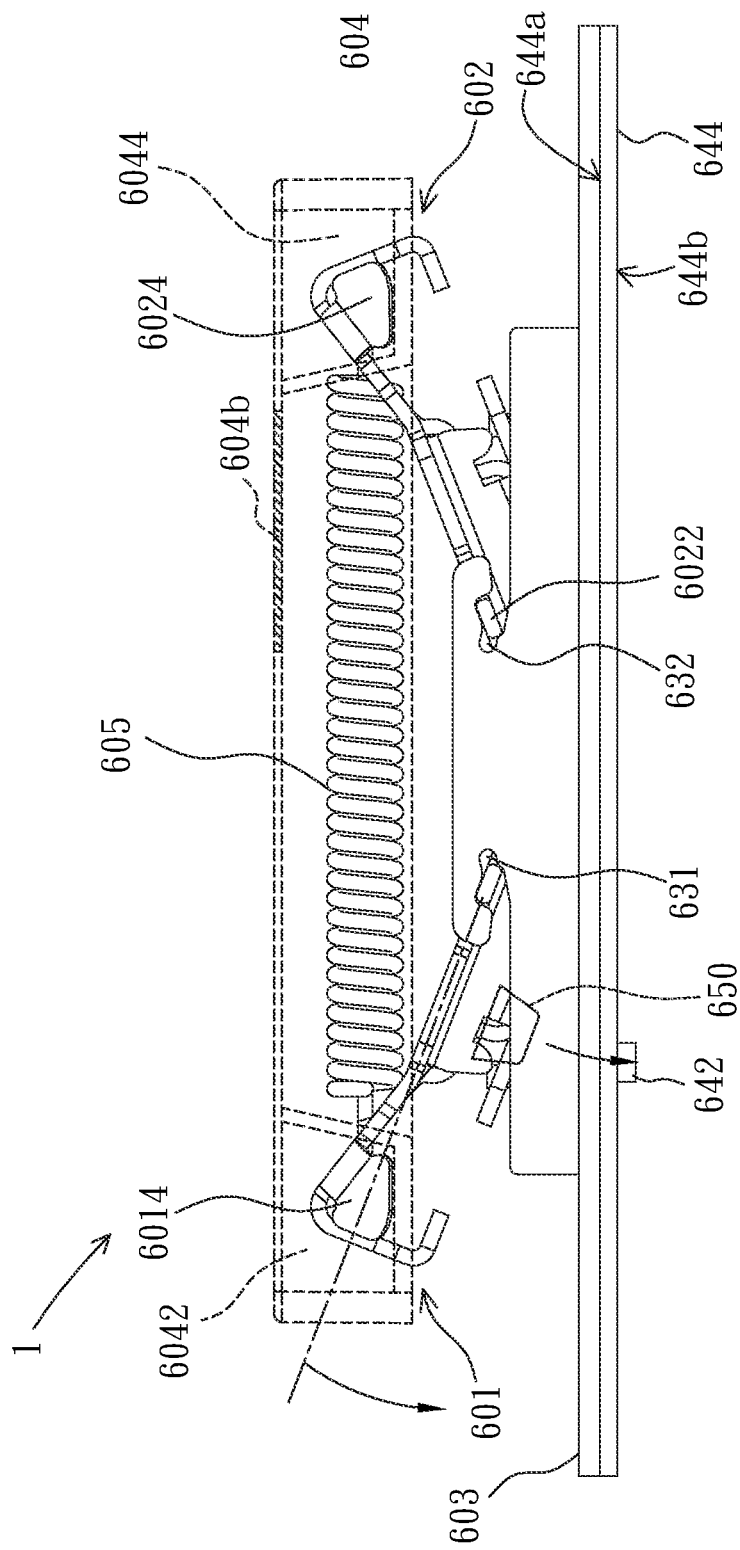
FIG. 38 is a side view if the optical keyswitch of the fifteenth embodiment in FIG. 37.
Figure 39:
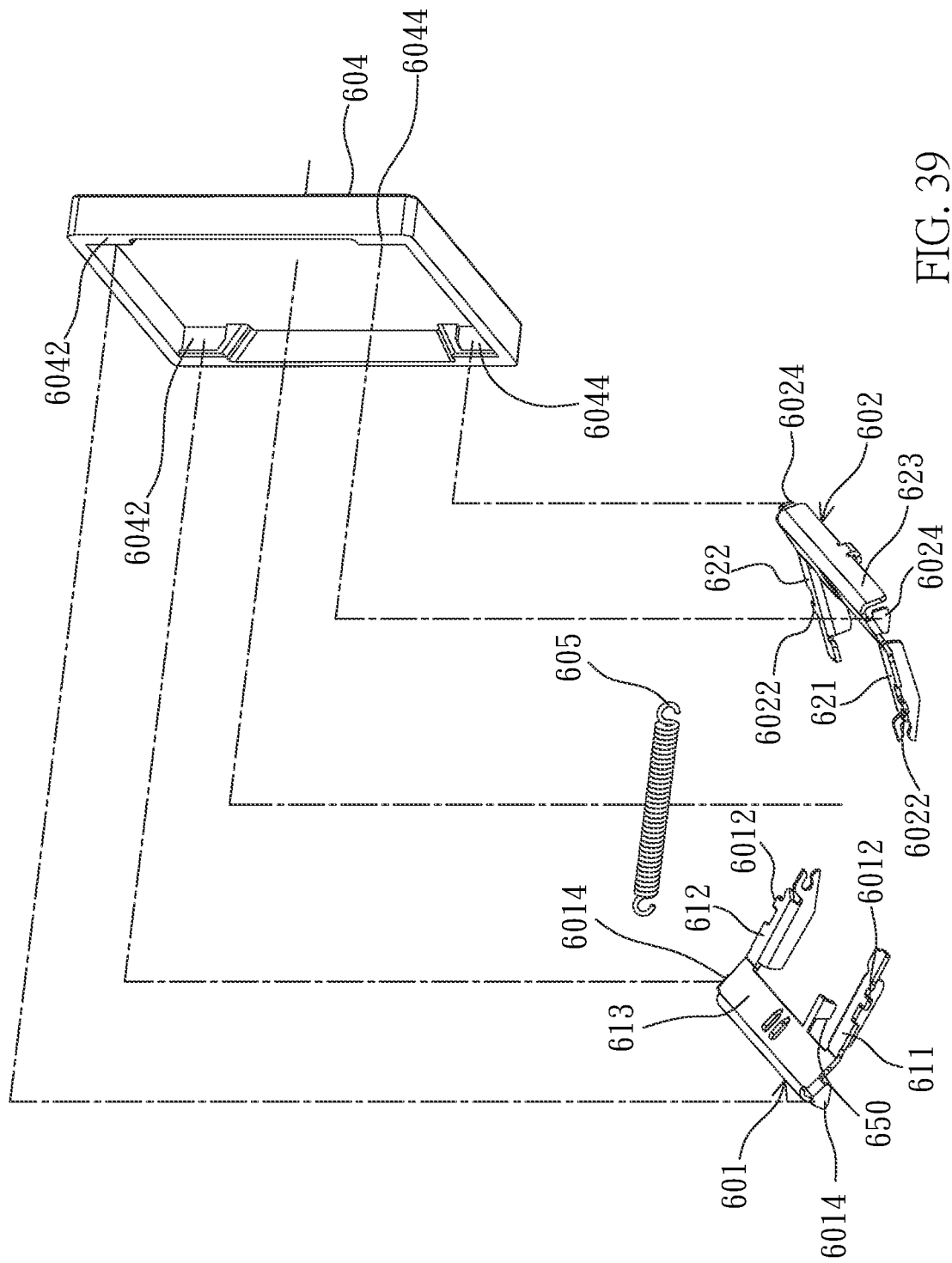
FIG. 39 is an exploded view of the keycap, the support mechanism, and the resilient member of the fifteenth embodiment in FIG. 37.

Referring to FIG. 37, FIG. 38 and FIG. 39, an optical keyswitch 1 according to a fifteenth embodiment of the invention includes a switch module 607, a keycap 604, a support mechanism, a resilient member 605 and a backlight source 643.

As shown in FIG. 37, FIG. 38 and FIG. 39, the switch module 607 includes a circuit board 604, an emitter 641 and a receiver 642. The emitter 641 and the receiver 642 are electrically connected to the circuit board 644 to form an optical switch. In different embodiments of the invention, the switch module 607 at least includes the circuit board 604 and the optical switch electrically connected to the circuit board 644; However the optical switch of the invention is not limited to the emitter 641 and the receiver 642, the integrated optical transceiver can also realize the optical switch function through the refracted or reflected the optical path. The circuit board 644 has a first surface 644a and a second surface 644b, and the emitter 641 and the receiver 642 are electrically connected to the circuit board 644. The emitter 641 correspondingly emits an optical signal to the receiver 642, and the receiver 642 receives the optical signal to obtain an intensity. When the keycap 604 is no pressed, the receiver 642 receives the optical signal of a first intensity; when the keycap 604 is pressed, the keycap drives the support mechanism to move, the keycap 604 or the support mechanism blocks the optical signal, the intensity of the optical signal received by the receiver 640 reduces to a second intensity. Pressing the keycap 604 changes the intensity of the optical signal received by the receiver 652, so as to trigger the switch module 607 to generate a triggering signal correspondingly.

As shown in FIG. 37, FIG. 38 and FIG. 39, the keycap 604 is supported by the support mechanism to be disposed above the first surface 644a of the circuit board 644, and keycap includes a light transmission area 604b. The light transmission area 604b may be a hollow area of the keycap 604, and the hollow area may or may not be filled with light-permeable material. Alternatively, the keycap 604 is made of a light-permeable material and coated with an opaque paint, and the light transmission area 604b is not covered by the opaque paint. Although the light transmission area 604b shown in the drawings is a block-shaped area, the light transmission area 604b may be a light-permeable area presenting a character shape to present the character corresponding to the keycap 604. A keycap projection area 604a of the keycap 604 is projected on the circuit board 604a (covering the first surface 644a and the second surface 644b). The support mechanism is disposed below the keycap 604 to support the keycap 604 moving upward and downward with respect to the circuit board 604. The support mechanism includes a first frame 601 and a second frame 602. If a whole baseplate 603 is not provided, connection members 631, 632 may be directly fixed on the circuit board 644, and baseplate ends 6012 and 6022 of the first frame 601 and second frame 602 are movably connected to the connection members 631, 632 on the circuit board 644. And keycap ends 6014 and 6024 of the first frame 601 and second frame 602 are movably connected to the keycap 604.

As shown in FIG. 37, FIG. 38 and FIG. 39, specifically, the keycap 604 may be, for example, a rectangular keycap 604 formed by injection molding. The keycap 604 includes coupling members 6042, 6044 provided on the lower surface of the keycap 604. In an embodiment, the coupling member 6042 can be a coupling structure with a pivotal hole, and the coupling member 14 can be a coupling structure with a groove; alternatively, both the coupling members 6042, 6044 are coupling structures with a groove. Hence, keycap ends 6014, 6024 of the first frame 601 and the second frame 602 are respectively rotatably connected to the coupling members 6042, 6044 of the keycap 604, and at least one keycap end 6014 or 6024 is able to slide within the corresponding coupling member 6042 or 6044. Therefore, the first frame 601 and the second frame 602 are movably connected to the keycap 604.

As shown in FIG. 37 and FIG. 38, the support mechanism further includes a baseplate 603, and the baseplate 603 includes the connection members 631, 632. The baseplate 603 is combined with the first surface 644a of the circuit board 644, and the connection members 631, 632 protrude in a direction away from the circuit board 644. The connectors 631, 632 are preferably hook-like connectors protruding from the surface of the baseplate 603 toward the keycap 604. The baseplate ends 6012 and 6022 of the first frame 601 and second frame 602 are movably connected to the connection members 631, 632 of the baseplate 603, such that the baseplate ends 6012 and 6022 of the first frame 601 and second frame 602 are indirectly connected to the circuit board 644. The present invention does not exclude the omission of the baseplate 603, and the baseplate end 6012 and 6022 are directly pivotally connected to the circuit board 644. In addition, the first frame 601 and the second frame 602 may be cross-arranged and pivotally connected to each other, and are arranged in the form of a scissors structure.

Figure 40:
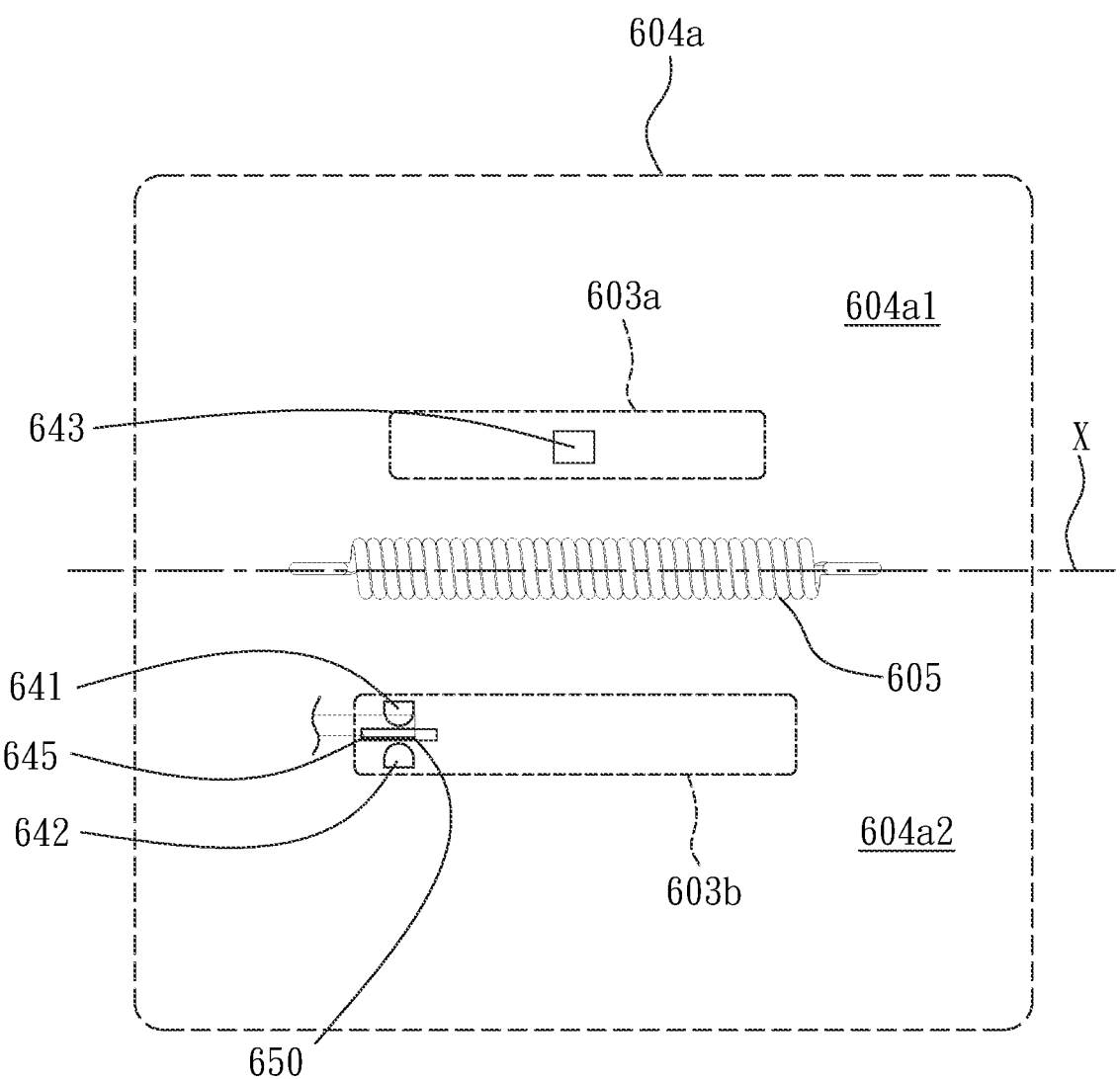
FIG. 40 is a top view of the keycap projection area of the fifteenth embodiment in FIG. 37.

As shown in FIG. 37, FIG. 38 and FIG. 40, the resilient member 605 is transversely connected to the support mechanism along a connecting direction X, and an orthographic projection of the resilient member 605 divides the keycap projection area 604a into a first region 604a1 and a second region 604a2. In at least one embodiment, the resilient member 605 is an extension spring and connects the first frame 601 and the second frame 602 along the connecting direction X. The first frame 601 and the second frame 602 respectively include a frame body 613, 623 and arm portions 611, 612, 621, 622. In each of the first frame 601 and the second frame 602, the arm portions 611, 612 extend from the frame body 613 and are movably connected to the circuit board 644. The frame bodies 613, 623 are perpendicular to the connecting direction X of the resilient member 605, and the resilient member 605 is connected to the two frame bodies 613, 623. The resilient member 605 normally provides a pulling force to the two frame bodies 613 and 623 to make the two frame bodies 613 and 623 approach each other, so as to form a restoring force that pushes the keycap 604 upward.

As shown in FIG. 37 and FIG. 40, the backlight source 643 is electrically connected to the circuit board 644 for projecting illumination light toward the keycap 604. The optical switch and the backlight source 643 are disposed on different surfaces of the first surface 644a and the second surface 644b. Meanwhile, the optical switch and the backlight source 643 are disposed at different regions of the first region 604a1 and the second region 604a2. Specifically, in this embodiment, the backlight source 643 is disposed at the first region 604a1 to illuminate the light transmission area 604b of the keycap 604. The emitter 641 and the receiver 642 are disposed at the second region 604a2, and trigger the switch module 607 with the movement of the keycap 604 or the support mechanism. Since the first region 604a1 and the second region 604a2 are substantially divided by the resilient member 605, the blocking and reflection of the resilient member 605 can reduce the intensity of the illuminating light in the second region 604a2, thereby reducing the interference of the illuminating light on the receiver 642. The aforesaid disposed on different surfaces and different regions also make the illumination light need a long distance to reach the optical switch, or illumination light is repeatedly reflected or blocked by the keycap 604, the resilient member 605, the baseplate 603 and the circuit board 644, which consumes the intensity of the illumination light. The interference of the backlight source 643 on the optical switch is reduced, and the accuracy of the triggering of the optical switch is enhanced.

As shown in FIG. 37 and FIG. 40, one of the first frame 601 and the second frame 602 includes a protrusion 650, and the protrusion 650 extends toward the circuit board 644. The circuit board 644 includes a slit 645, and the emitter 641 and the receiver 642 are respectively disposed at opposite sides of the slit 645. As shown in drawings, the protrusion 650 is disposed on one of the two frame bodies 613, 623, and the protrusion 650 is arranged in parallel to the slit 645, such that the slit 645 allows the protrusion 650 to pass therethrough. In the invention, the protrusion 650 is not always aligned with the slit 645 during the entire movement. When the moving track of the protrusion 650 is not always perpendicular to the slit 645 (for example, an arc track), the protrusion 650 may move to a highest or lowest point for aligning and passing through the slit 645.

Figure 41:
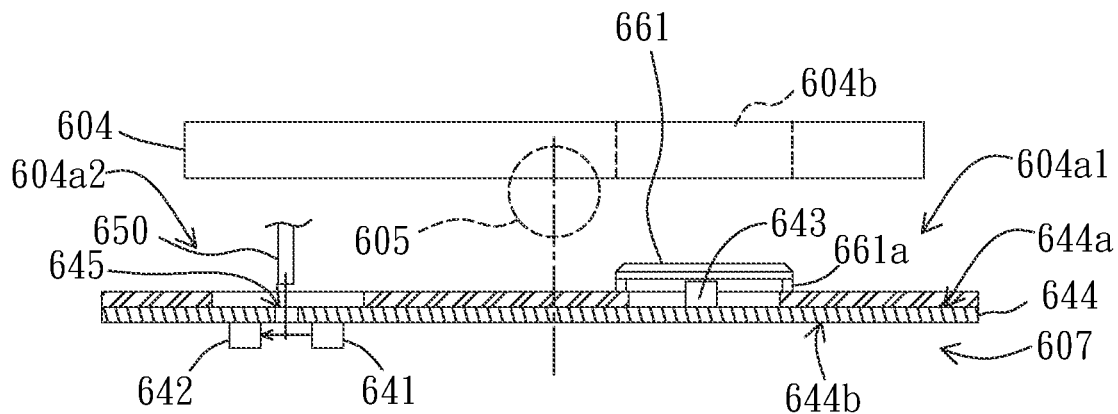
FIG. 41 and FIG. 42 are cross-sectional views of the optical keyswitch of the embodiment in FIG. 37.
Figure 42:
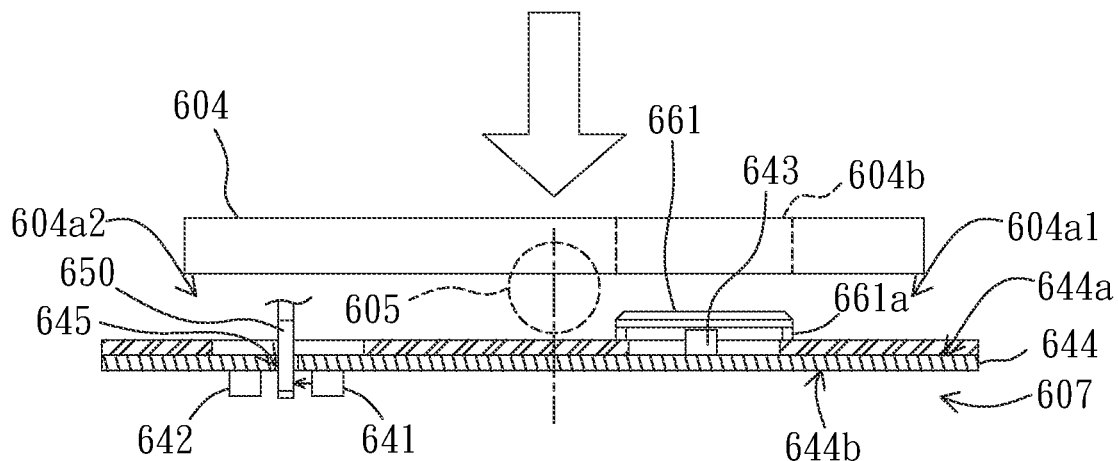

Referring to FIG. 41 and FIG. 42, the first frame 601 and the second frame 602 are omitted in the drawings to simplify the view. When the keycap 604 is pressed. The first frame 601 and the second frame 602 (not shown in the figure) swing, to move the protrusion 650 passing through the slit 645 to block the optical signal and reduce the intensity of optical signal received by the receiver 642, so as to trigger the switch module 607 to generate the triggering signal. Specifically, in this embodiment, the optical signal is emitted along the optical path, the optical path is perpendicular to the connecting direction X of the resilient member 605, and the slit 645 and the protrusion 650 are both parallel to the connecting direction X.

As shown in FIG. 37, FIG. 40, FIG. 41 and FIG. 40, in this embodiment, the backlight source 643 is disposed on the first surface 644a, and the emitter 641 and the receiver 642 (the entire optical switch) are disposed on the second surface 644b, thereby further blocking the illuminating light of the backlight source 643 through the circuit board 644 and reducing the interference of the illuminating light to the light receiver 642. Moreover, the baseplate 603 is combined with the first surface 644a. In order to prevent the baseplate 603 from interfering with the emitter 641, the receiver 642 and the backlight source 643, the baseplate 603 includes a light hole area 603a and a broken hole area 603b. The light hole area 603a and the broken hole area 603a respectively corresponds to the first region 604a1 and the second region 604a2. The light hole area 603a at least partially overlaps the first region 604a1, and the broken hole area 603b at least partially overlaps the second region 604a2. The optical path of the optical switch (the emitter 641 and receiver 642) is at least partially exposed within the broken hole area 603b of the baseplate 604 and the slit 645 of the circuit board 644. As shown in drawings. The light hole area 603a and the broken hole area 603b can be opened into large holes, to have the projection areas on the circuit board 644 be larger than the backlight source 643 and the slit 645, so as to ensure that the backlight source 643 and the slit 645 fall within the light hole area 603a and the hole area 603b respectively. In different embodiments, the light hole area 603a and the broken hole area 603b can also be completely matched or slightly larger than the outline of the backlight source 643 and the slit 645, to have the projection areas on the circuit board 644 be larger than or coincide with the projection areas of the backlight source 643 and the slit 645. The light hole area 603a and the broken hole area 603b can also be merged into a single large hole area, which simultaneously accommodates the backlight source 643 and the slit 645. The backlight source 643 is disposed at the light hole area 603a, and the receiver 641 is disposed at the broken hole area 603b. Therefore, Disposing of the backlight source 643, the emitter 641, and the receiver 642, or the emission and reception of light, will not be interfered by the baseplate 603. Both the baseplate 603 and the circuit board 644 of each embodiment of the present invention can have the effect of shielding the light of the backlight source 643. Generally, the backlight source 643 generates visible light, and the optical switch (the emitter 641 and the receiver 642) adopts infrared light, but the receiving spectrum of the receiver 642 may overlap part of visible light spectrum. Therefore, it is necessary to arrange the backlight source 643 and the entire set of optical switch on different surfaces of the circuit board 644 or different regions of the keycap projection area 604a, to reduce the interference of the backlight source 643 or the ambient light on the optical switch.

Figure 43:
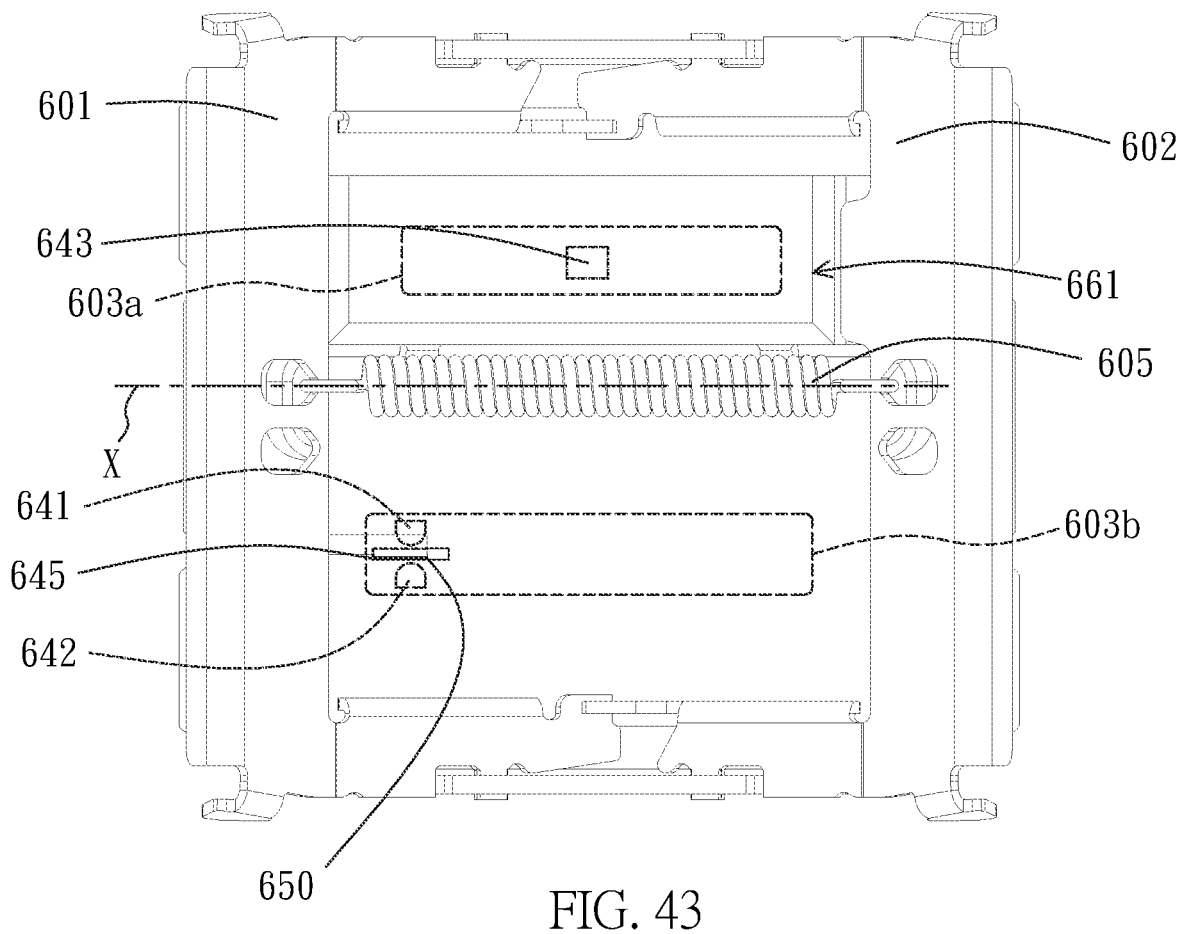
FIG. 43 is a top view of the optical keyswitch of the fifteenth embodiment in FIG. 37, in which the keycap is omitted in the drawing.

Referring to FIG. 41, FIG. 42 and FIG. 43, in order to further reduce the interference of the illumination light on the receiver 642 and further enhance the illumination effect of the backlight source 643 on the keycap 604, the optical keyswitch 1 further includes a diffuser 661. The diffuser 661 is combined with the baseplate 603 and disposed at the first region 604a1. The diffuser 661 covers the backlight source 643 and is located between the backlight source 643 and the keycap 604. The illuminating light emitted by the backlight source 643 can be irradiated to the inner surface of the keycap 604 in a large range through the diffuser 661. Moreover, the sidewall 661a for fixing the diffuser 661 can be made of a light-shielding material to provide a light-shielding effect and reduce light propagation in the horizontal direction, thereby preventing the illumination light from interfering with the optical signal received by the receiver 642.

Figure 44:
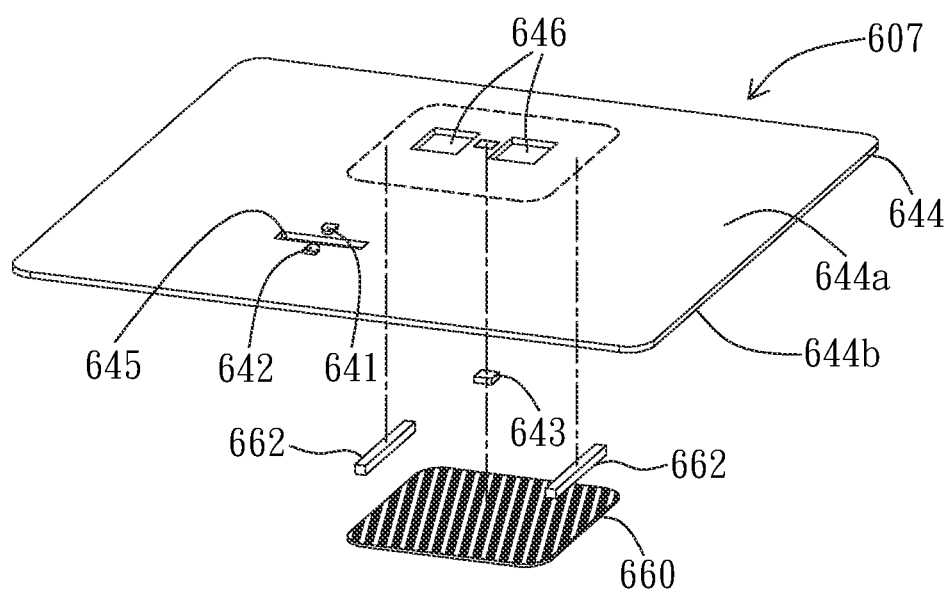
FIG. 44 is an exploded view of part of the components of an optical keyswitch according to a sixteenth embodiment of the invention.
Figure 45:
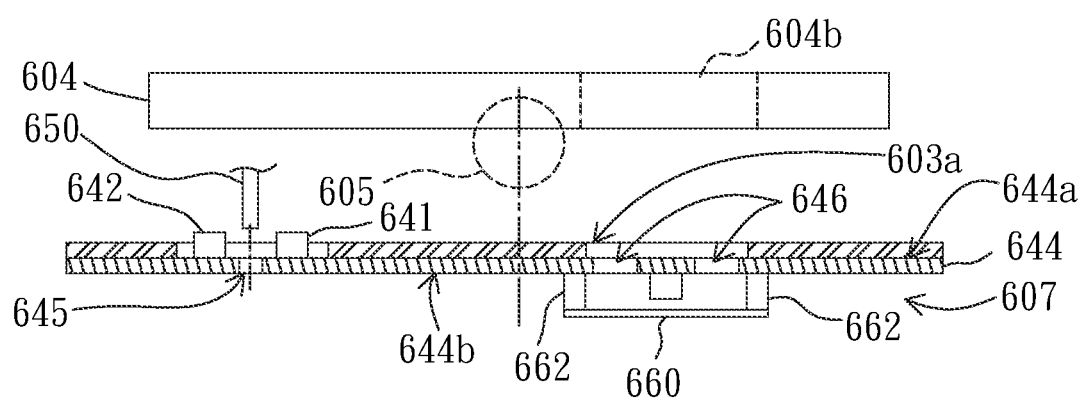
FIG. 45 is a side view of the optical keyswitch of the sixteenth embodiment in FIG. 44.

Referring to FIG. 44 and FIG. 45, a switch module 607 according to a sixteenth embodiment of the invention is adopted to replace the switch module 607 in one or more embodiments of the invention. The switch module 607 includes a circuit board 604, an emitter 641 and a receiver 642.

As shown in FIG. 44 and FIG. 45, the switch module 607 further includes a reflector 660 and spacers 662. The backlight source 643 is disposed on the second surface 644b. The circuit board 644 is provided with openings 646. The openings are located adjacent the backlight source 643, and the openings 646 overlap the light hole area 603a of the baseplate 603. The spacers 662 are disposed on the second surface 644b, and the reflector 660 are combined with the spacers 662, such that a gap exists between the reflector 660 and the second surface 644b, and the backlight source 643 is located between the reflector 660 and the second surface 644b. The reflective surface of the reflector 660 faces the second surface 644b, and the backlight source 643 faces a direction away from the second surface 644b, that is, the illumination light is projected toward the reflector 660 (projected downward). Therefore, the reflector 660 reflects the illuminating light toward the opening 646, so that the illuminating light illuminates the keycap 604 through the opening 646. In this embodiment, the emitter 641 and the receiver 642 are disposed on the first surface 644a, and are respectively located on two sides of the slit 645. The slit 645 is configured to prevent the baseplate 603 from interfering with the protrusion 650, so that the protrusion 650 has a sufficient displacement to block the optical path of the optical signal. Since the emitter 641 and the receiver 642 are disposed on the first surface 644a, the interference of the backlight source 643 on the receiver 642 can be effectively reduced. In addition, the backlight source 643 disposed on the second surface 644b can adjust the illumination intensity of the keycap 604 through the size of the opening 646 to avoid excessive illumination intensity.

Figure 46:
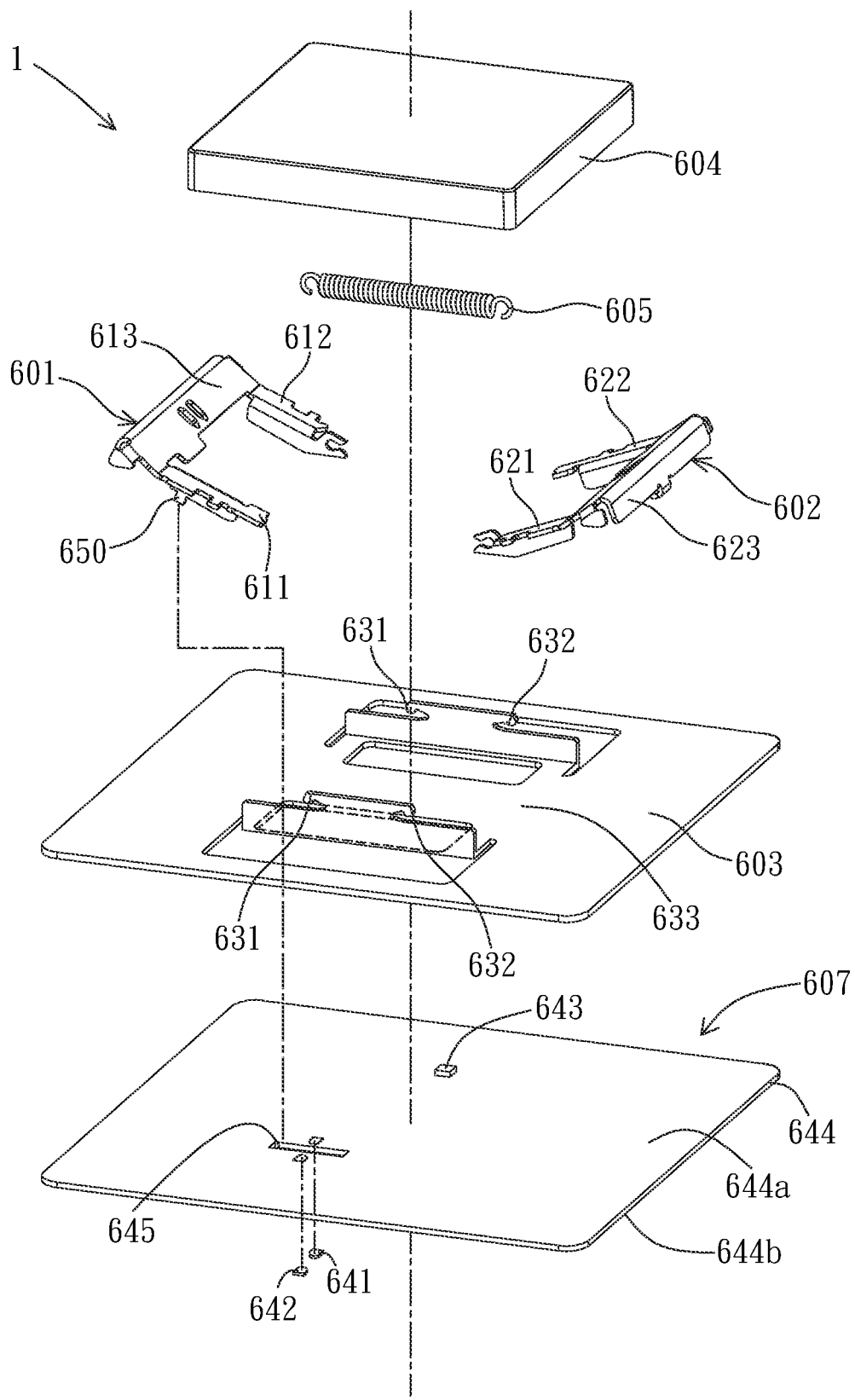
FIG. 46 is an exploded view according to a seventeenth embodiment of the optical keyswitch of the invention.
Figure 47:
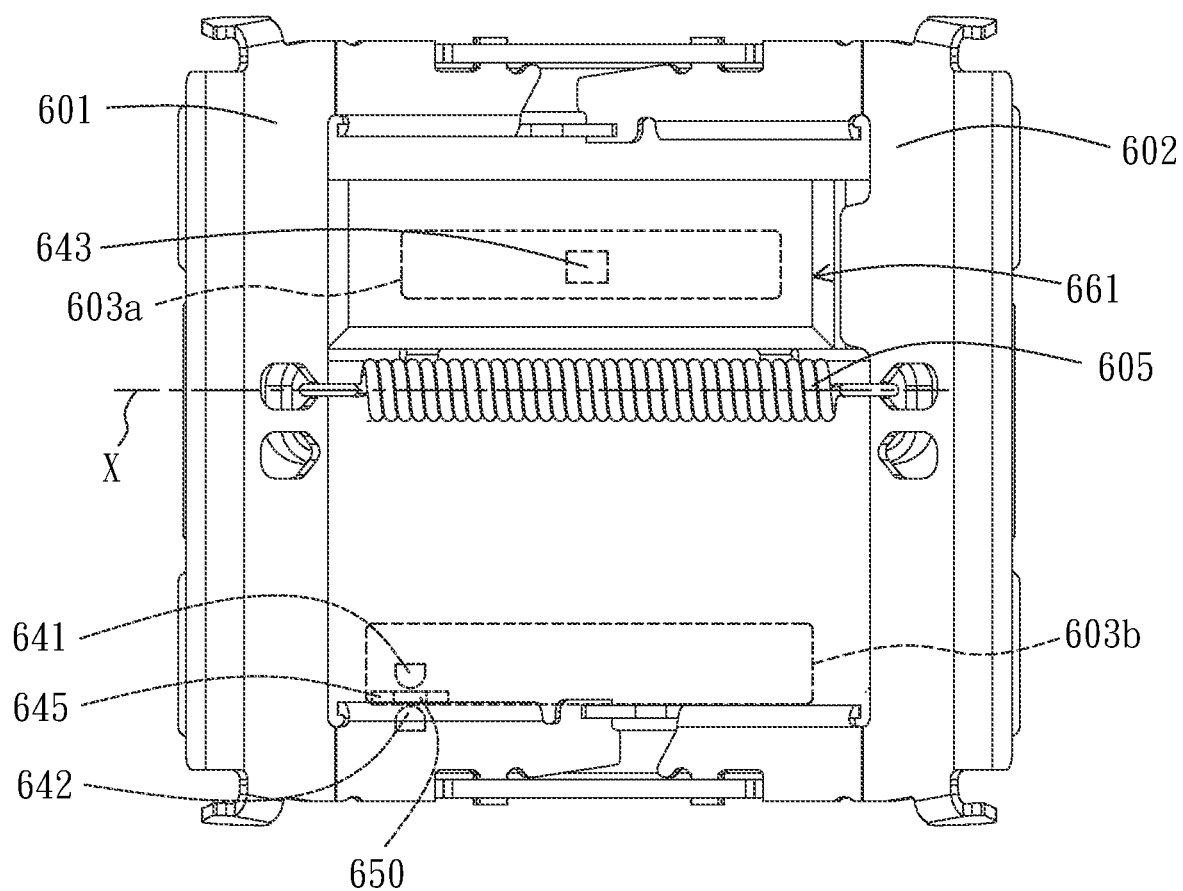
FIG. 47 is a top view of the optical keyswitch of the seventeenth embodiment in FIG. 46, in which the keycap is omitted in the drawing.

Referring to FIG. 46 and FIG. 47, an optical keyswitch 1 according to a seventeenth embodiment of the invention is shown. The optical keyswitch 1 includes a switch module 607, a keycap 604, a support mechanism, a resilient member 605 and a backlight source 643.

In this embodiment, the protrusion 650 is disposed on one of the arm portions 611 of the first frame 601 and second frame 602, and the protrusion 650 extends toward the circuit board 644. As shown in FIG. 46 and FIG. 47, the protrusion 650 and the slit 645 are arranged in parallel to the connecting direction X of the resilient member 605, and the optical path of the optical signal is still arranged in perpendicular to the connecting direction X. When the keycap 604 is pressed, the arm portions 611, 612, 621, 622 swing downward to drive the protrusion 650 to pass through the slit 645 and block between the emitter 641 and the receiver 642, such that the protrusion 650 partially blocks the optical signal to reduce the intensity of optical signal received by the receiver 642, thereby triggering the switch module 607 to generate the triggering signal.

Figure 48:
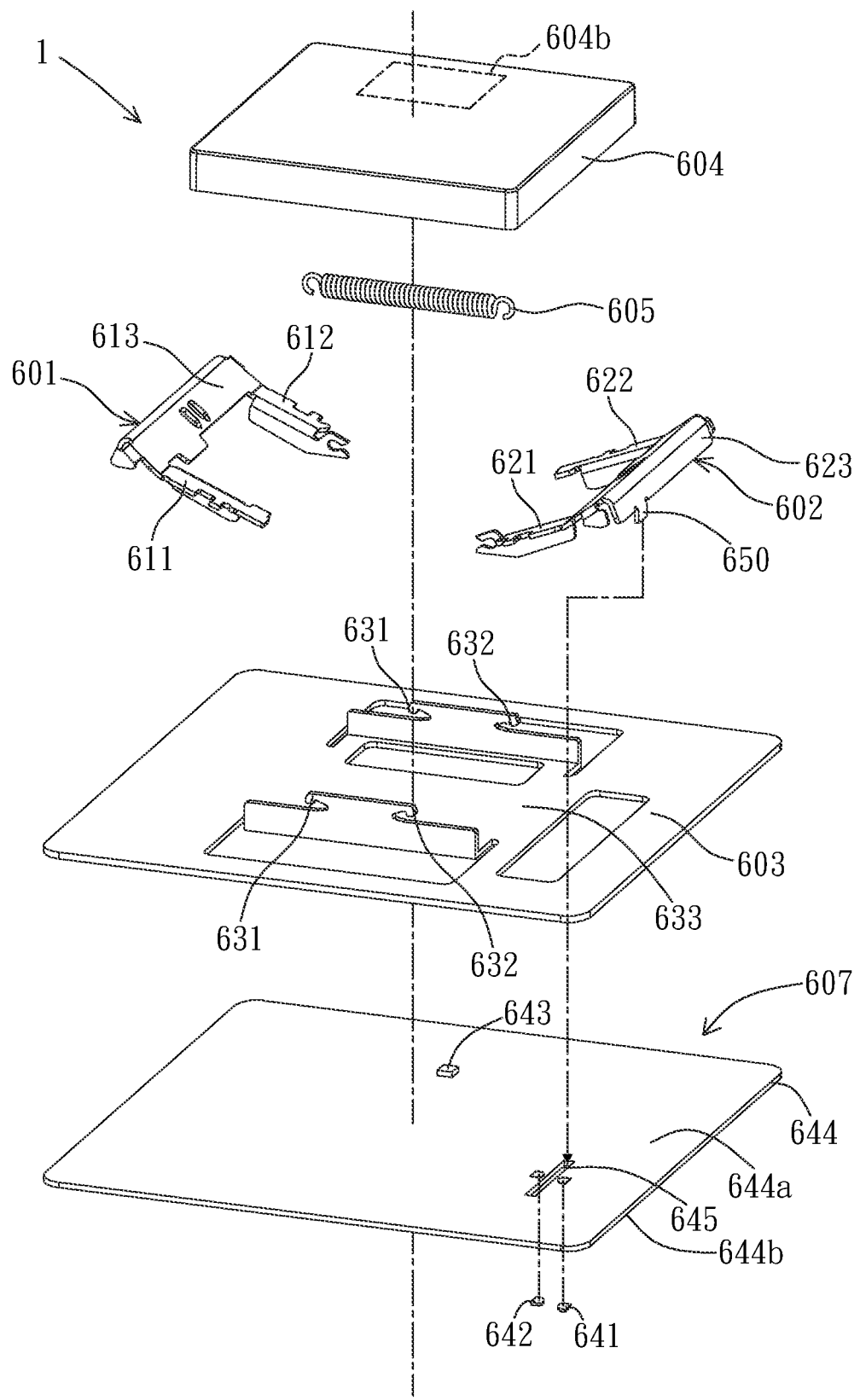
FIG. 48 is an exploded view according to an eighteenth embodiment of the optical keyswitch of the invention.
Figure 49:
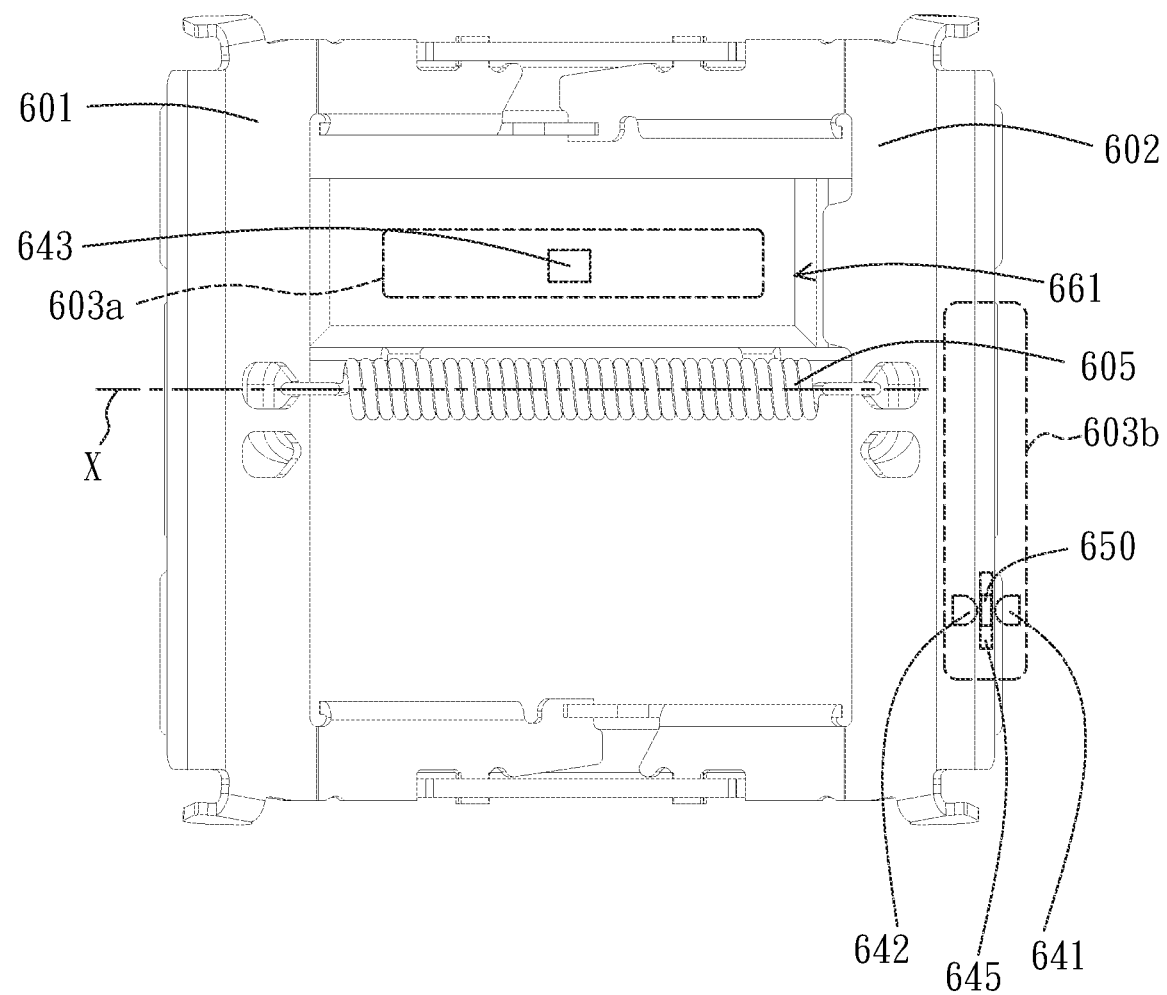
FIG. 49 is a top view of the optical keyswitch of the eighteenth embodiment in FIG. 48, in which the keycap is omitted in the drawing.

Referring to FIG. 48 and FIG. 49, an optical keyswitch 1 according to an eighteenth embodiment of the invention is shown. The optical keyswitch 1 includes a switch module 607, a keycap 604, a support mechanism, a resilient member 605 and a backlight source 643.

In this embodiment, the protrusion 650 is disposed on one of the frame bodies 623 of the first frame 601 and second frame 602, and the protrusion 650 extends toward the circuit board 644. As shown in FIG. 48 and FIG. 49, the protrusion 650 and the slit 645 are arranged in perpendicular to the connecting direction X of the resilient member 605, and the optical path of the optical signal is arranged in parallel to the connecting direction X. When the keycap 604 is pressed, the arm portions 611, 612, 621, 622 swing downward to drive the protrusion 650 to pass through the slit 645 and block between the emitter 641 and the receiver 642, such that the protrusion 650 partially blocks the optical signal to reduce the intensity of optical signal received by the receiver 642, thereby triggering the switch module 607 to generate the triggering signal.

Figure 50:
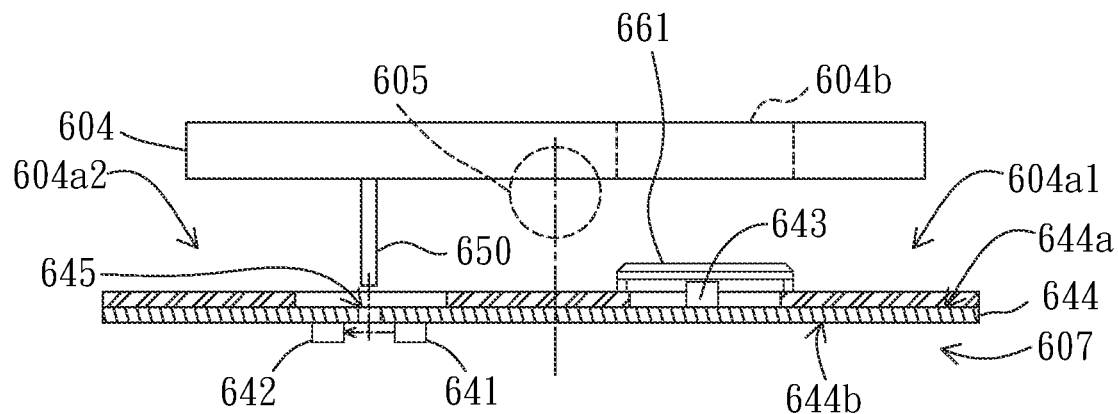
FIG. 50 and FIG. 51 are cross-sectional views of an optical keyswitch according to a nineteenth embodiment of the invention.
Figure 51:
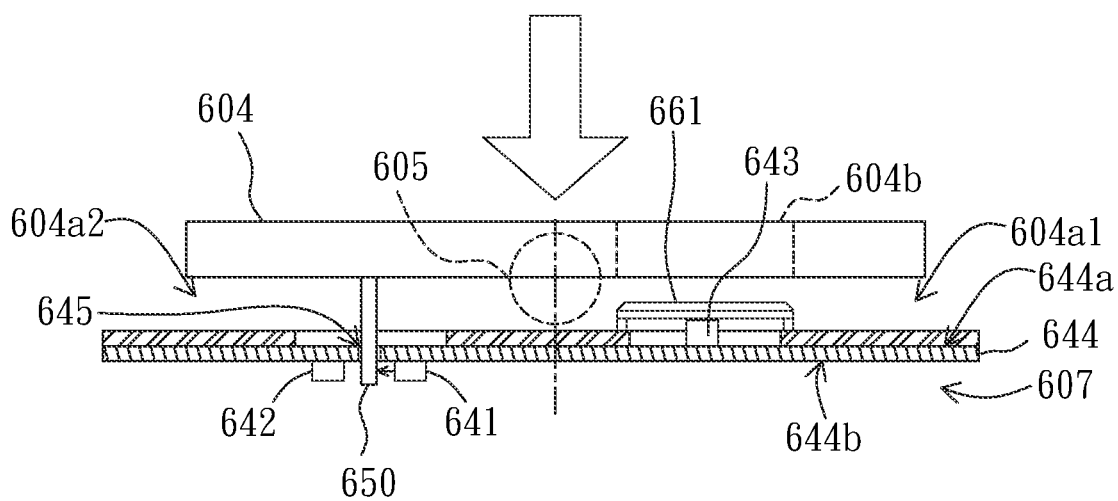

Referring to FIG. 50 and FIG. 51, an optical keyswitch 1 according to a nineteenth embodiment of the invention is shown. The optical keyswitch 1 includes a switch module 607, a keycap 604, a support mechanism (not shown in the drawings), a resilient member 605 and a backlight source 643.

As shown in FIG. 50 and FIG. 51, in this embodiment. The first frame 601 or the second frame 602 (not shown in the figure) of the supporting mechanism is not equipped with a protrusion 650. The protrusion 650 is disposed on a bottom side of the keycap 604 and extends toward the circuit board 644. When the keycap 604 is pressed. The keycap 604 drives the protrusion 650 to move linearly, the protrusion 650 passes through the slit 645 and blocks between the emitter 641 and the receiver 642, such that the protrusion 650 partially blocks the optical signal to reduce the intensity of optical signal received by the receiver 642, thereby triggering the switch module 607 to generate the triggering signal. In this embodiment, the protrusion 650 driven by the keycap 604 moves linearly, so the alignment between the protrusion 650 and the slit 645 is relatively easy to solve. In the drawings, the protrusion 650 is arranged in parallel to the connecting direction X of the resilient member 605, and the optical path of the optical signal is arranged in perpendicular to the connecting direction X. However, it is not excluded that the protrusion 650 is perpendicular to the connecting direction X of the resilient member 605, and the optical path of the optical signal is in perpendicular to the connecting direction X.

Compared to the prior art, the optical keyswitch 1 of the invention utilizes the emitter 641 and the receiver 642 as the switch unit. The receiving state of the optical signal is changed with the pressing stroke through any suitable component in the optical keyswitch 1 to achieve rapid and accurate pressing signal conversion, and it can be applied to various key structures to be suitable for portable electronic devices. Furthermore, the backlight source 643 and the optical switch (the emitter 641 and the receiver 642) of the invention are arranged on different surfaces of the circuit board 644, and are also located on different sides of the resilient member 605. The circuit board 644 and the resilient member 605 block the illuminating light emitted by the backlight source 643, which effectively prevents the illuminating light from interfering with the receiver 642.

Although the preferred embodiments of the present invention have been described herein, the above description is merely illustrative. The preferred embodiments disclosed will not limit the scope of the present invention. Further modification of the invention herein disclosed will occur to those skilled in the respective arts and all such modifications are deemed to be within the scope of the invention as defined by the appended claims.

What is claimed is:

1. An optical keyswitch, comprising:
a keycap;
a support mechanism disposed below the keycap and configured to support the keycap moving upward and downward, the support mechanism comprising a first frame and a second frame, the first frame having a sliding end; and
a switch module comprising a circuit board, an emitter, and a receiver, the emitter and the receiver electrically connected to the circuit board, and the emitter emitting an optical signal to the receiver along an optical path, wherein the optical path extends along the circuit board,
wherein when the keycap is pressed, the first frame is driven by the keycap to move downward, and the sliding end slides with respect to the circuit board and blocks the optical signal, so the switch module is triggered to generate a triggering signal.

2. The optical keyswitch of claim 1, further comprising a resilient member connecting the first frame and the second frame, wherein the emitter and the receiver are disposed on two opposite sides with respect to a connecting direction of the resilient member connecting the first frame and the second frame.

3. The optical keyswitch of claim 1, wherein the optical path is a straight optical path between the emitter and the receiver, and the straight optical path intersects a moving path of the first frame, so that when the sliding end slides with respect to the circuit board, a portion of the sliding end of the first frame is interposed into the straight optical path.

4. The optical keyswitch of claim 1, wherein when the keycap is not pressed and maintained at a non-pressed position, the resilient member enables baseplate ends of the first frame and the second frame to be close to each other.

5. The optical keyswitch of claim 4, wherein the baseplate end of the first frame serves as the sliding end.

6. The optical keyswitch of claim 1, wherein when the keycap is not pressed and maintained at a non-pressed position, the resilient member enables keycap ends of the first frame and the second frame to be close to each other.

7. An optical keyswitch, comprising:
a keycap;
a switch module disposed under the keycap, the switch module comprising a circuit board, an emitter, and a receiver, the emitter and the receiver electrically connected to the circuit board, and the emitter emitting an optical signal to the receiver; and
a support mechanism disposed below the keycap and configured to lift the keycap upward and downward, the support mechanism comprising a first frame and a second frame, the first frame having a sliding end and at least one side arm, the at least one side arm connecting with the sliding end;
wherein the emitter emits the optical signal along a straight optical path, the straight optical path is disposed between the emitter and the receiver along the circuit board and configured in perpendicular to a moving path of the side arm, the first frame is driven by the keycap when pressed to slide along the moving path, and at least a portion of the sliding end intersects with or disintersects from the straight optical path, so the switch module is triggered to generate a triggering signal.

8. The optical keyswitch of claim 7, further comprising a resilient member connecting the first frame and the second frame, wherein the emitter and the receiver are so disposed that the straight optical path is defined in perpendicular to a connecting direction of the resilient member connecting the first frame and the second frame.

9. The optical keyswitch of claim 7, further comprising at least one linear resilient member configured to provide a pulling force pulling the first frame and the second frame toward each other.

10. The optical keyswitch of claim 7, further comprising at least one linear resilient member for pulling the first frame and the second frame to a standing position, wherein the side arm of the first frame is configured in parallel to the resilient member when the keycap is pressed.

11. An optical keyswitch, comprising:
a keycap;

a baseplate disposed under the keycap;

a support mechanism disposed between the keycap and baseplate to support the keycap moving upward and downward, the support mechanism comprising a first frame and a second frame, the first frame having a lower end movably engaging with the baseplate;

at least one linear resilient member configured to provide a pulling force pulling the first frame and the second frame toward each other to lift the keycap; and a switch module comprising a circuit board, an emitter and a receiver, the emitter and the receiver electrically connected to the circuit board, and the emitter emitting an optical signal along a straight optical path to the receiver, wherein the straight optical path is disposed between the emitter and the receiver along the circuit board and configured in parallel to the lower end, the first frame slides with at least a portion of the lower end blocking or unblocking the optical signal when the keycap is pressed, so the switch module is triggered to generate a triggering signal.

12. The optical keyswitch of claim 11, wherein the emitter and the receiver are disposed on two opposite sides with respect to a pulling direction of the pulling force.

* * * * *